US012765036B2

(12) United States Patent
Chen et al.

(10) Patent No.: US 12,765,036 B2
(45) Date of Patent: Oct. 13, 2026

(54) MOLYBDENUM-CONTAINING DEVICE-LEVEL INTERCONNECTS

(71) Applicant: Taiwan Semiconductor Manufacturing Company, Ltd., Hsin-Chu (TW)

(72) Inventors: Hsiao Chu Chen, Nantou County (TW); ChunTing Lee, Hsinchu County (TW); Wei-Hsuan Chen, Taoyuan City (TW); Che Chia Chang, Hsinchu City (TW); Kan-Ju Lin, Kaohsiung City (TW); Yi-Hsien Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 304 days.

(21) Appl. No.: 18/467,072

(22) Filed: Sep. 14, 2023

(65) Prior Publication Data

US 2024/0395894 A1 Nov. 28, 2024

Related U.S. Application Data

(60) Provisional application No. 63/503,763, filed on May 23, 2023.

(51) Int. Cl.
*H10D 64/62* (2025.01)
*H10D 64/01* (2025.01)
(Continued)

(52) U.S. Cl.
CPC ............ *H10D 64/62* (2025.01); *H10D 64/01* (2025.01); *H10P 14/418* (2026.01); *H10W 20/42* (2026.01)

(58) Field of Classification Search
CPC ......... H01L 23/48-485; H01L 23/5226; H01L 23/535; H10D 64/62; H10D 64/01;
(Continued)

(56) References Cited

U.S. PATENT DOCUMENTS

2021/0098368 A1* 4/2021 Yu ..................... H01L 21/76843
2022/0069100 A1* 3/2022 Hwang ................ H10D 62/121
2023/0178476 A1* 6/2023 Kang ................. H10D 30/6729
438/275

FOREIGN PATENT DOCUMENTS

KR 20220030455 A 3/2022
TW 201214628 A 4/2012
(Continued)

*Primary Examiner* — Wasiul Haider
(74) *Attorney, Agent, or Firm* — HAYNES AND BOONE, LLP

(57) ABSTRACT

Middle-of-line (MOL) interconnects and corresponding techniques for forming the MOL interconnects are disclosed herein. An exemplary MOL interconnect structure includes a barrier-free source/drain contact, a barrier-free source/drain via, and a barrier-free gate via disposed in an insulator layer. The barrier-free source/drain is disposed on an epitaxial source/drain, and the barrier-free source/drain contact includes tungsten, molybdenum, or a combination thereof. The barrier-free source/drain via is disposed on the barrier-free source/drain contact and the barrier-free source/drain via includes molybdenum. The barrier-free gate via is disposed on a gate stack disposed adjacent to the epitaxial source/drain, and the barrier-free gate via includes tungsten, molybdenum, or a combination thereof. A width of the barrier-free source/drain via and/or the barrier-free gate via may be less than about 16 nm. The barrier-free source/drain via and/or the barrier-free gate via may be formed at the same time (e.g., by a same bottom-up deposition).

20 Claims, 48 Drawing Sheets

(51) Int. Cl.
*H10P 14/40* (2026.01)
*H10W 20/42* (2026.01)

(58) Field of Classification Search
CPC ... H10D 30/797; H10P 14/418; H10P 14/432; H10W 20/4441; H10W 20/20; H10W 20/435; H10W 20/211; H10W 20/42; H10W 20/0595; H10W 20/40; H10W 20/045; H10W 20/057; H10W 20/083; H10W 20/081; H10W 20/01; H10W 20/427
See application file for complete search history.

(56) References Cited

FOREIGN PATENT DOCUMENTS

| | | |
|---|---|---|
| TW | 201218372 A | 5/2012 |
| TW | 201409696 A | 3/2014 |
| TW | 202230681 A | 8/2022 |

* cited by examiner

MOLYBDENUM-CONTAINING DEVICE-LEVEL INTERCONNECTS

This application is a non-provisional application of and claims benefit of U.S. Provisional Patent Application Ser. No. 63/503,763, filed May 23, 2023, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, resistance-capacitance (RC) delay has arisen as a significant challenge as reduced geometry sizes are implemented to achieve ICs with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. Interconnects of ICs, which facilitate electrical connection to and/or communication with IC components and/or IC features of the ICs. are particularly problematic in their contributions to RC delay. A need thus exists for improvements in interconnects of ICs and/or methods of fabricating interconnects of ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
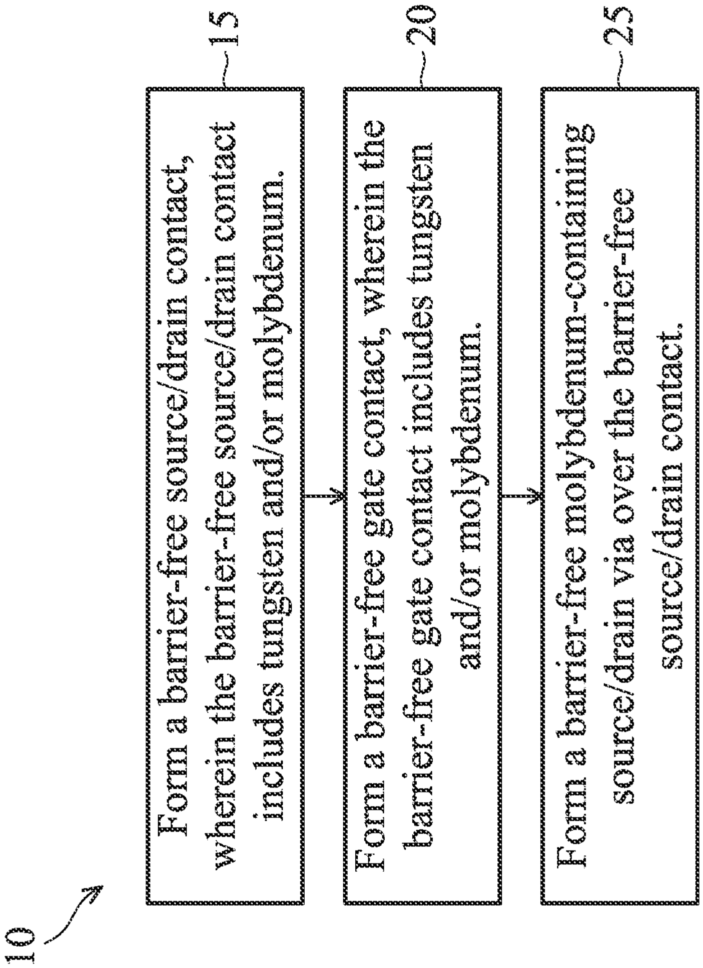
FIG. 1A is a flow chart of a method, in portion or entirety, for fabricating a middle-of-line (MOL) interconnect structure according to various aspects of the present disclosure.

The present disclosure relates generally to integrated circuit (IC) devices and/or semiconductor devices, and more particularly, to middle-of-line interconnects thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper." "horizontal," "vertical," "above," "over," "below," "beneath," "up," "down," "top," "bottom," etc. as well as derivatives thereof (e.g., "horizontally." "downwardly." "upwardly." etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate." and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

IC manufacturing process flow is typically divided into three categories: front-end-of-line (FEOL), middle-of-line (MOL or MEOL), and back-end-of-line (BEOL). FEOL generally encompasses processes related to fabricating IC devices (e.g., transistors, resistors, capacitors, inductors, or a combination thereof) on a substrate. For example, FEOL processes include forming doped wells, isolation features, gates, source/drains, and electrodes. BEOL generally encompasses processes related to fabricating metallization layers that electrically connect IC devices and/or components of the IC devices (e.g., gates and/or source/drains) to one another and/or to external devices, thereby enabling operation of the IC devices. The metallization layers can route signals between the IC devices and/or the components thereof and/or distribute signals (e.g., clock signals, voltage signals, ground signals, other signals, or a combination thereof) to the IC devices and/or the components thereof. Often, each metallization layer (also referred to as a metallization level) includes at least one interconnect structure disposed in an insulator layer, such as an electrically conductive line and an electrically conductive via disposed in a dielectric layer, where the electrically conductive via connects the electrically conductive line to an electrically conductive line of an interconnect in a different metallization layer. The electrically conductive lines (e.g., metal lines) and the electrically conductive vias (e.g., metal vias) of the metallization layers can be referred to as BEOL features and/or global contacts/interconnects.

MOL generally encompasses processes related to fabricating contacts that physically and/or electrically connect FEOL features (e.g., electrically active features thereof) to a first metallization layer formed during BEOL, such as contacts that connect a gate of a transistor and/or source/drains of a transistor to the first metallization layer. Sometimes, MOL involves forming a multilayer MOL interconnect structure, such as a device-level interconnect, in an insulator layer. The device-level interconnect may include a device-level contact (MD) and a via contact (VC) disposed in the insulator layer. The device-level contact connects an electrically active FEOL feature (e.g., a gate and/or a source/drain) to the via/local contact, and the via contact connects the device-level contact to the first metallization layer.

As IC technologies progress towards smaller technology nodes, MOL and BEOL are experiencing significant challenges. For example, reduced critical dimensions at device layers of ICs (e.g., gate lengths, gate pitches, fin pitches, etc.) of advanced IC technology nodes require more compact interconnects, which requires significantly reducing critical dimensions of the interconnects, such as widths, lengths, heights, or a combination thereof of source/drain contacts (MD), source/drain vias (VD), gate vias (VG), vias of BEOL metallization layers, lines of BEOL metallization layers, or a combination thereof. Reduced interconnect critical dimensions have led to increases in interconnect resistance that degrade IC device performance, for example, by increasing resistance-capacitance (RC) delay. For example, higher contact resistances and/or higher capacitances exhibited by MOL interconnect structures can delay and even prevent signals from being routed efficiently to and from IC devices, such as transistors, negating any performance improvements achieved by scaling down ICs and limiting further IC scaling.

As described herein, barrier-free MOL interconnect structures that include molybdenum, tungsten, or a combination thereof are disclosed herein to reduce interconnect resistance at scaled dimensions, such as where device-level contacts and/or via contacts have dimensions less than about 20 nm. For example, MOL interconnect structures described herein include barrier-free source/drain contacts, barrier-free source/drain vias, and barrier-free gate vias. The barrier-free source/drain contacts are tungsten plugs, molybdenum plugs, or a combination thereof. The barrier-free source/drain vias are molybdenum plugs, and the barrier-free gate vias are tungsten plugs or molybdenum plugs. Incorporating molybdenum into barrier-free source/drain vias (and, in some embodiments, barrier-free source/drain contacts and/or barrier-free gate vias) may mitigate resistance increases as MOL interconnects shrink, thereby improving device performance (e.g., by reducing RC delay). Details of the disclosed MOL interconnect structures for mitigating and/or reducing interconnect resistance (e.g., via-to-contact resistance, via-to-gate resistance, and via-to-metal line resistance) at scaled dimensions, along with methods of fabrication thereof, are described in the following description.

FIG. 1A is a flow chart of a method 10, in portion or entirety, for fabricating an MOL interconnect structure according to various aspects of the present disclosure. In some embodiments, the MOL interconnect structure is connected to a transistor, and the MOL interconnect structure facilitates electrical connection to and/or electrical communication with the transistor. The MOL interconnect structure fabricated by method 10 may exhibit lower resistance than conventional MOL interconnect structures, thereby reducing associated RC delay and improving performance and/or reliability of the transistor. At block 15, method 10 includes forming a barrier-free source/drain contact that includes tungsten and/or molybdenum. The barrier-free source/drain contact is disposed in and physically contacts an insulator layer, and the barrier-free source/drain contact is disposed directly on and may physically contact a source/drain region, such as an epitaxial source/drain, of the transistor. At block 20, method 10 includes forming a barrier-free gate contact that includes tungsten and/or molybdenum. The barrier-free gate contact is disposed in and physically contacts the insulator layer, and the barrier-free gate contact is disposed directly on and may physically contact a gate of the transistor. At block 25, method 10 includes forming a barrier-free molybdenum-containing source/drain via over the barrier-free source/drain contact. The barrier-free molybdenum-containing source/drain via is disposed in and physically contacts the insulator layer, and the barrier-free molybdenum-containing source/drain via is disposed directly on and physically contacts the barrier-free source/drain contact. Providing the MOL interconnect structure with a barrier-free source/drain contact (e.g., device contact), a barrier-free molybdenum-containing source/drain via (e.g., local contact), and a barrier-free gate contact (e.g., device/local contact) maximizes a volume of low resistance material at a device contact level, which minimizes resistance of the device contact level. Additional steps may be provided before, during, and after method 10, and some of the steps described may be moved, replaced, or eliminated for additional embodiments of method 10. The discussion that follows illustrates MOL interconnect structures that can be fabricated according to various embodiments of method 10.

Figure 1B:
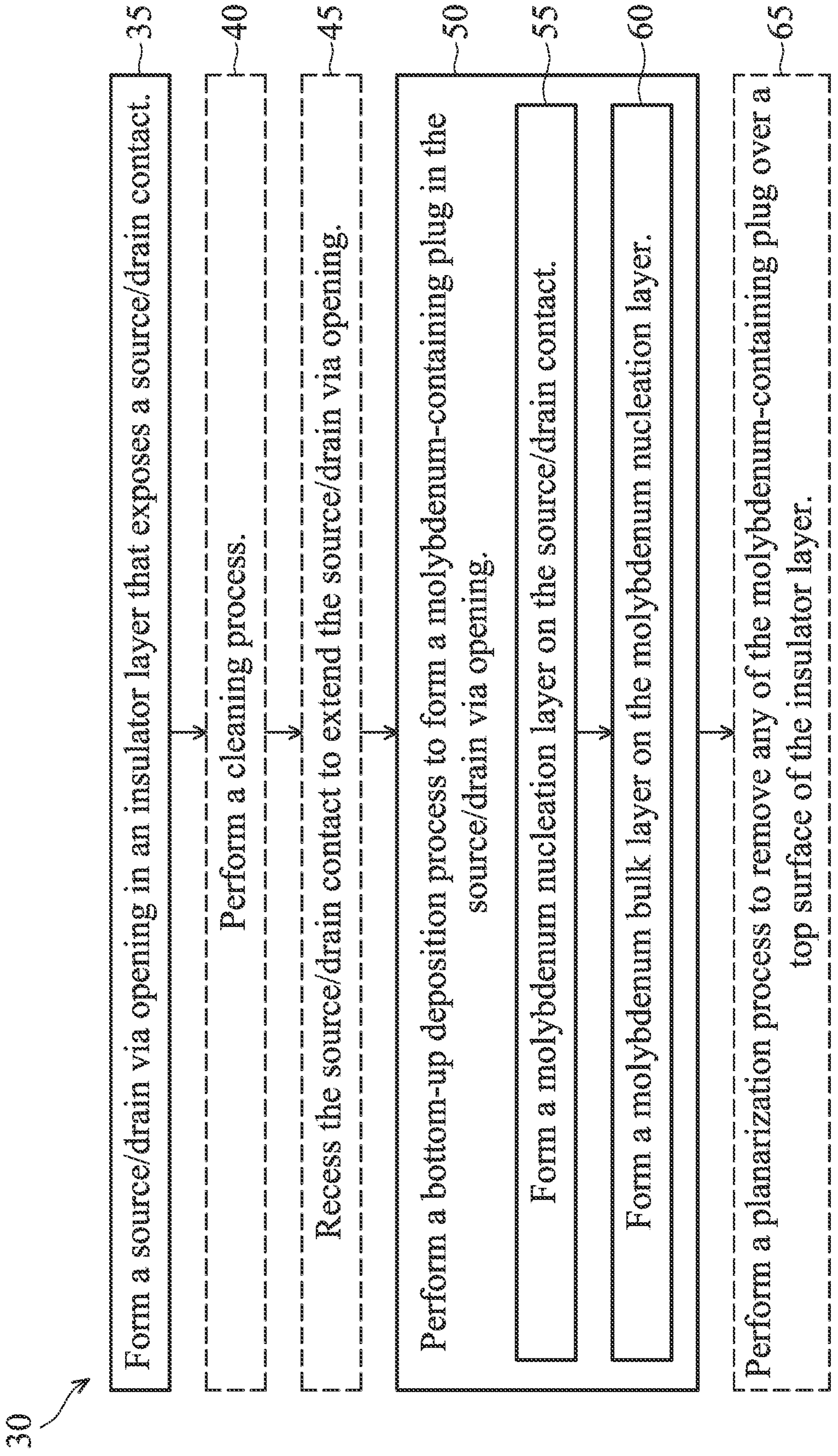
FIG. 1B is a flow chart of a method, in portion or entirety, for forming a barrier-free molybdenum-containing source/drain via, which can be implemented in the method of FIG. 1A, according to various aspects of the present disclosure.

FIG. 1B is a flow chart of a method 30, in portion or entirety, for forming a barrier-free molybdenum-containing source/drain via according to various aspects of the present disclosure. In some embodiments, method 30 is implemented at block 25 of method 30. At block 35, method 30 includes forming a source/drain via opening in an insulator layer that exposes a source/drain contact, such as a barrier-free source/drain contact that includes tungsten and/or molybdenum. At block 40, method 30 may include performing a cleaning process (e.g., a pre-clean). The cleaning process may remove contamination and/or moisture from surfaces forming the source/drain via opening, such as the exposed source/drain contact (i.e., a surface on and/or from which the barrier-free molybdenum-containing source/drain via may be deposited and/or grown). At block 45, method 30 may include recessing the source/drain contact to extend the source/drain contact opening. At block 50, method 30 includes performing a bottom-up deposition process to form a molybdenum-containing plug in the source/drain contact opening. The molybdenum-containing plug physically contacts the source/drain contact and the insulator layer. In some embodiments, the bottom-up deposition process includes forming a molybdenum nucleation layer on the source/drain contact at block 55 and forming a molybdenum layer on the molybdenum nucleation layer at block 60. Different bottom-up deposition process parameters (e.g., deposition precursors, deposition pressures, deposition times, etc.) may be implemented at block 55 and block 60. The bottom-up deposition process may reduce and/or prevent seams from forming in the molybdenum-containing plug, enabling seamless barrier-free source/drain vias having reduced critical dimensions (e.g., less than about 16 nm). The bottom-up deposition process and barrier-free structure also enable barrier-free source/drain vias having more vertical sidewall profiles than conventional source/drain vias (e.g., any difference in width between a top and a bottom of a source/drain via may be less than about 2 nm), which enables increased spacing between the barrier-free source/drain vias and overlying interconnects, such as BEOL lines of an MLI's bottom layer (e.g., M0 level). At block 65, method 30 may include performing a planarization process to remove any of the molybdenum-containing plug disposed over a top surface of the insulator layer. Additional steps may be provided before, during, and after method 30, and some of the steps described may be moved, replaced, or eliminated for additional embodiments of method 30. For example, block 40, block 45, block 65, or a combination thereof may be omitted from method 30. In another example, block 40 may be performed before or after block 45. In yet another example, block 40 and block 45 may be performed simultaneously, such as where the cleaning process is also configured to recess the source/drain contact. The discussion that follows illustrates barrier-free molybdenum-containing source/drain vias that can be fabricated according to various embodiments of method 30.

FIGS. 2A-2M are cross-sectional views of a device 100, in portion or entirety, at various stages of fabricating a middle-of-line (MOL) interconnect of device 100 (such as those associated with method 10 in FIG. 1A and method 30 in FIG. 1B), according to various aspects of the present disclosure. Device 100 may be included in a microprocessor, a memory, other IC device, or a combination thereof. In some embodiments, device 100 is a portion of an IC chip, a system on chip (SoC), or portion thereof, that includes various passive and active electronic devices, such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or a combination thereof. The various transistors may be planar transistors or non-planar transistors, such as fin-like FETs (FinFETs) or gate-all-around (GAA) transistors. FIGS. 2A-2M have been simplified for the sake of clarity to better understand the inventive concepts of the present disclosure. Additional features can be added in device 100, and some of the features described below can be replaced, modified, or eliminated in other embodiments of device 100.

Figure 2A:
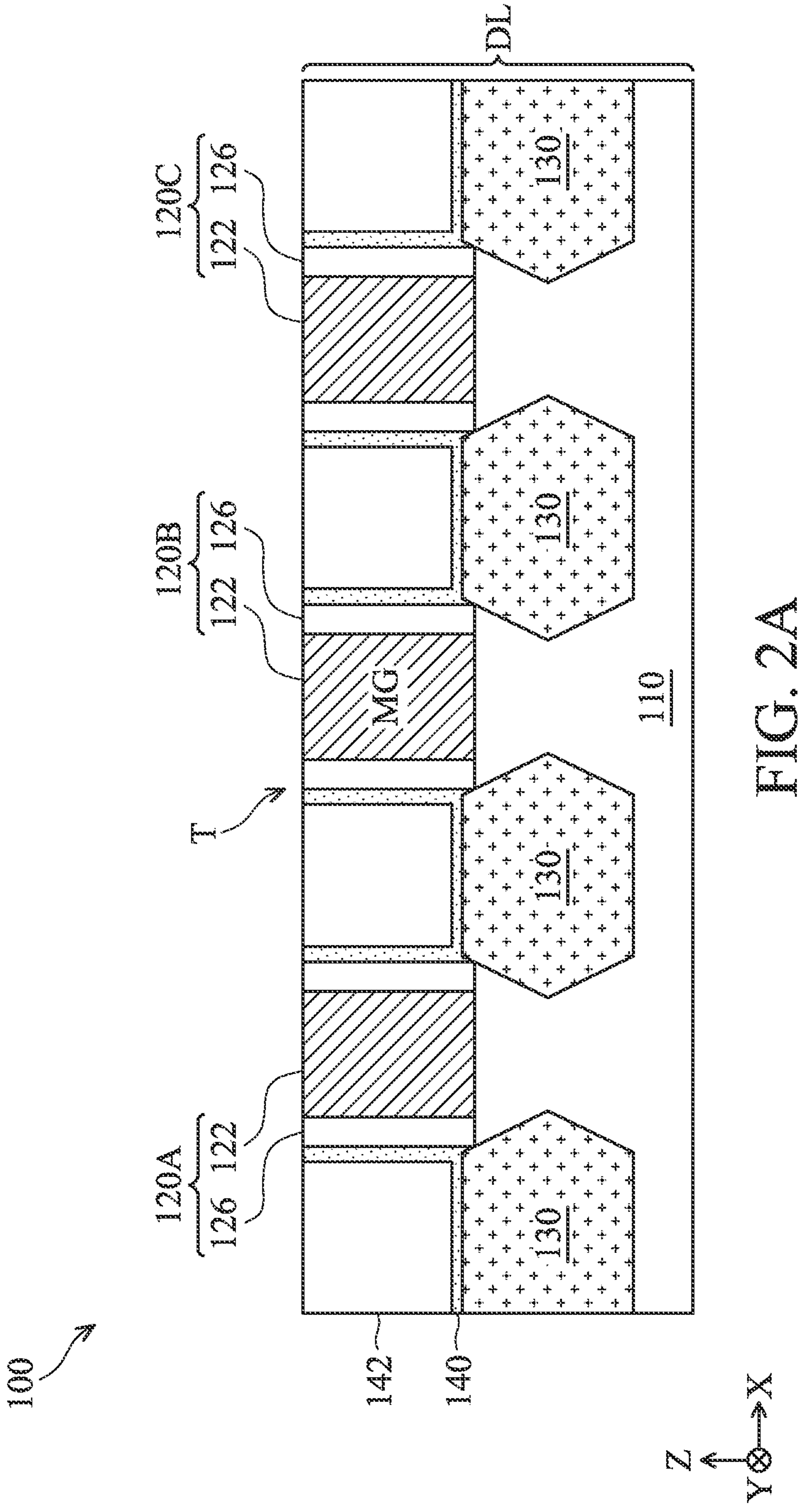
FIGS. 2A-2M are cross-sectional views of an MOL interconnect structure, in portion or entirety, at various stages of fabrication (such as those associated with the method in FIG. 1A and the method in FIG. 1B), according to various aspects of the present disclosure.

Referring to FIG. 2A, device 100 has undergone FEOL processing to fabricate various IC devices, IC features, IC components, or a combination thereof on a substrate (wafer) 110. In the depicted embodiment, substrate 110 includes silicon. Alternatively or additionally, substrate 110 includes another elementary semiconductor, such as germanium; a compound semiconductor, such as silicon carbide, gallium arsenide, gallium phosphide, indium phosphide, indium arsenide, indium antimonide, or a combination thereof; an alloy semiconductor, such as silicon germanium (SiGe), GaAsP, AlInAs, AlGaAs, GaInAs, GaInP, GaInAsP, or a combination thereof; or a combination thereof. Alternatively, substrate 110 is a semiconductor-on-insulator substrate, such as a silicon-on-insulator (SOI) substrate, a silicon germanium-on-insulator substrate, or a germanium-on-insulator substrate. Semiconductor-on-insulator substrates can be fabricated using separation by implantation of oxygen (SIMOX), wafer bonding, other suitable methods, or a combination thereof. Substrate 110 can include doped regions formed by an ion implantation process, a diffusion process, other suitable doping process, or a combination thereof. In some embodiments, substrate 110 includes p-type doped regions (e.g., p-type wells) doped with p-type dopants, such as boron, indium, other p-type dopant, or a combination thereof. In some embodiments, substrate 110 includes n-type doped regions (e.g., n-type wells) doped with n-type dopants, such as phosphorus, arsenic, other n-type dopant, or a combination thereof. In some embodiments, substrate 110 includes doped regions formed with a combination of p-type dopants and n-type dopants. The various doped regions can be formed directly on and/or in substrate 110, for example, providing a p-well structure, an n-well structure, a dual-well structure, a raised structure, or a combination thereof.

In FIG. 2A, the various IC features and/or IC components include a gate structure 120A, a gate structure 120B, and a gate structure 120C disposed over substrate 110. Each of gate structures 120A-120B has a respective metal gate (MG) stack 122 and respective gate spacers 126. The various IC features and/or IC components further include epitaxial source/drains 130, a contact etch stop layer (CESL) 140, and an interlayer dielectric (ILD) layer 142, which are described below. In some embodiments, a transistor T of device 100 includes gate structure 120A disposed between respective epitaxial source/drains 130, where one of epitaxial source/drains 130 may provide a source of transistor T, another one of epitaxial source/drains 130 may provide a drain of transistor T, and a channel is formed in substrate 110 between the source and the drain. Gate structure 120A engages the channel, such that current can flow between the source and the drain (collectively referred to as source/drains and/or source/drain regions) (i.e., between epitaxial source/drains 130) during operation. In some embodiments, device 100 may further have a transistor that includes gate structure 120B disposed between respective epitaxial source/drains 130 and/or a transistor that includes gate structure 120C disposed between respective epitaxial source/drains 130. In FIG. 2A, the various IC components and their respective configurations is merely exemplary. The present disclosure contemplates device 100 having any combination of IC components and/or IC devices and any configuration of such IC components and/or IC devices fabricated by FEOL processing.

Gate stacks 122 are configured to achieve desired functionality according to design requirements of device 100. Gate stacks 122 of gate structures 120A-120C may include the same or different layers, materials, configurations, or a combination thereof. Each gate stack 122 may include a gate dielectric and a gate electrode. The gate dielectric includes a dielectric material. The gate dielectric may have a single layer structure or a multilayer structure. For example, the gate dielectric includes a high-k dielectric layer disposed over an interfacial layer. The interfacial layer includes a dielectric material, such as $SiO^2$, HfSiO, SiON, other silicon-comprising dielectric material, other suitable dielectric material, or a combination thereof. The high-k dielectric layer includes a high-k dielectric material, which generally refers to a dielectric material having a dielectric constant greater than that of silicon dioxide (k~3.9). For example, the high-k dielectric layer includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TIO, $TiO_2$, LaO, LaSiO, $Ta_2O_3$, $Ta_2O_5$, $Y_2O_3$, $SrTiO_3$, BaZrO, $BaTiO_3$(BTO), (Ba, Sr)$TiO_3$(BST), $Si_3N_4$, hafnium dioxide-alumina ($HfO_2$—$Al_2O_3$) alloy, other suitable high-k dielectric material, or a combination thereof.

The gate electrode includes an electrically conductive material, such as polysilicon, Al, Cu, Ti, Ta, W, Mo, Co, Si, TaN, NiSi, CoSi, TiN, WN, WCN, TiAl, TiAlC, TiAlO, TiAlN, TiAlON, TaCN, TaC, TaSiN, other suitable electrically conductive material, or a combination thereof. The gate electrode may have a single layer structure or a multilayer structure. For example, the gate electrode includes a work function layer and a bulk (or fill) layer. The work function layer is an electrically conductive layer that is tuned to have a desired work function, such as an n-type work function or a p-type work function, and the bulk layer is an electrically conductive layer disposed over the work function layer. In some embodiments, the work function layer includes n-type work function materials, such as Ti, Ag, Mn, Zr, TaAl, TaAlC, TiAlN, TaC, TaCN, TaSiN, other suitable n-type work function material, or a combination thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function material, or a combination thereof. The bulk layer may include Al, W, Cu. Ti, Ta, polysilicon, alloys thereof, or a combination thereof. In some embodiments, the gate electrode includes diffusion layers and/or barrier layers, such as a bulk layer disposed over a diffusion/barrier layer. Gate stacks 122 may further include capping layers, diffusion layers, barrier layers, hard mask layers, other suitable layers, or a combination thereof.

In some embodiments, a top surface of gate stacks 122 includes titanium and aluminum (e.g., a TiAl surface, a TiAlO surface, a TiAlON surface, or a TiAlC surface). In some embodiments, a top surface of gate stacks 122 includes titanium and nitrogen (e.g., a TiN surface or a TiAlON surface). In some embodiments, a top surface of gate stacks 122 includes tungsten (e.g., a W surface, a WN surface, or a WCN surface). In some embodiments, a top surface of gate stacks 122 includes tantalum and nitrogen (e.g., a TaN surface). In some embodiments, a top surface of gate stacks 122 include silicon (e.g., an amorphous silicon surface or a silicon surface). In some embodiments, a top surface of gate stacks 122 is formed by the gate electrode (e.g., the work function layer and the bulk layer thereof) and may further be formed by the gate dielectric. In some embodiments, a top surface of gate stacks 122 is formed by a gate cap, such as a tungsten-containing cap, that is disposed over the gate electrode. For example, where the gate dielectric wraps the gate electrode, the gate cap may be disposed on the gate dielectric and the gate electrode and form a top portion of gate stacks 122.

Gate stacks 122 are formed by deposition processes, lithography processes, etching processes, other suitable processes, or a combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plasma enhanced ALD (PEALD), plating, other suitable methods, or a combination thereof. The lithography patterning processes include resist coating (for example, spin-on coating), soft baking, mask aligning, exposure, post-exposure baking, developing the resist, rinsing, drying (for example, hard baking), other suitable processes, or a combination thereof. Alternatively, the lithography exposure process is assisted, implemented, or replaced by other methods, such as maskless lithography, electron-beam writing, or ion-beam writing. The etching processes include dry etching, wet etching, other suitable etching, or a combination thereof. Gate stacks 122 are fabricated according to a gate last process, a gate first process, or a hybrid gate last/gate first process. In gate last processes, gate structures 120A-120C include dummy gate stacks that are subsequently, partially or completely, replaced with gate stacks 122. The dummy gate stacks include, for example, an interfacial layer (including, for example, silicon oxide) and a dummy gate electrode layer (including, for example, polysilicon). In such embodiments, the dummy gate electrode layer is removed, thereby forming gate openings that are subsequently filled with gate stacks 122.

Gate spacers 126 are disposed adjacent to (e.g., along sidewalls of) gate stacks 122, respectively. Gate spacers 126 are formed by any suitable process and include a dielectric material. The dielectric material can include silicon, oxygen, carbon, nitrogen, other suitable material, or a combination thereof (for example, silicon oxide, silicon nitride, silicon oxynitride, or silicon carbide). For example, a dielectric layer including silicon and nitrogen, such as a silicon nitride layer, may be deposited over substrate 110 and subsequently anisotropically etched to form gate spacers 126. In some embodiments, gate spacers 126 include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, main spacers, or a combination thereof are formed adjacent to gate stacks 122. In such embodiments, the various sets of spacers can include materials having different etch rates. For example, a first dielectric layer including silicon and oxygen (e.g., silicon oxide) may be deposited over substrate 110 and subsequently etched to form a first spacer set adjacent to gate stacks 122 (or dummy gate stacks, in some embodiments), and a second dielectric layer including silicon and nitrogen (e.g., silicon nitride) may be deposited over substrate 110 and subsequently etched to form a second spacer set adjacent to the first spacer set. Implantation processes, diffusion processes, annealing processes, or a combination thereof may be performed to form lightly doped source and drain (LDD) features and/or heavily doped source and drain (HDD) features in substrate 110 before and/or after forming gate spacers 126, depending on design requirements of device 100.

Epitaxial source/drains 130 are disposed in source/drain regions of substrate 110. In some embodiments, a semiconductor material is epitaxially grown on and/or from substrate 110 to form epitaxial source/drains 130 over source/drain regions of substrate 110. In some embodiments, an etching process is performed on source/drain regions of substrate 110 to form source/drain recesses, and epitaxial source/drains 130 are deposited in/grown to fill the source/drain recesses. In some embodiments, where substrate 110 represents a portion of a fin structure, epitaxial source/drains 130 may wrap source/drain regions of the fin structure and/or are disposed in source/drain recesses of the fin structure depending on design requirements of device 100. An epitaxy process can implement CVD deposition techniques (for example, vapor-phase epitaxy (VPE), ultra-high vacuum CVD (UHV-CVD), LPCVD, PECVD, or a combination thereof), molecular beam epitaxy, other suitable SEG processes, or a combination thereof. The epitaxy process can use gaseous and/or liquid precursors, which interact with the composition of substrate 110. Epitaxial source/drains 130 are doped with n-type dopants and/or p-type dopants. In some embodiments, epitaxial source/drains 130 are epitaxial layers including silicon and/or carbon, and the silicon-comprising epitaxial layers or the silicon-carbon-comprising epitaxial layers may be doped with phosphorous, other n-type dopant, or a combination thereof. In some embodiments, epitaxial source/drains 130 are epitaxial layers including silicon and germanium, and the silicon-and-germanium-compromising epitaxial layers may be doped with boron, other p-type dopant, or a combination thereof. In some embodiments, epitaxial source/drains 130 include materials and/or dopants that achieve desired tensile stress and/or compressive stress in the channel regions. In some embodiments, epitaxial source/drains 130 are doped during deposition by adding impurities to a source material of the epitaxy process. In some embodiments, epitaxial source/drains 130 are doped by an ion implantation process subsequent to a deposition process. In some embodiments, annealing processes are performed to activate dopants in epitaxial source/drains 130 and/or other source/drain regions of device 100 (for example, HDD regions and/or LDD regions thereof).

Isolation features (not shown) may be formed over and/or in substrate 110 to isolate various regions, such as device regions, of device 100. For example, isolation features define and electrically isolate active device regions and/or passive device regions from each other. Isolation features include silicon oxide, silicon nitride, silicon oxynitride, other suitable isolation material (including, for example, silicon, oxygen, nitrogen, carbon, other suitable isolation constituent, or a combination thereof), or a combination thereof. Isolation features may be configured as shallow trench isolation (STI) structures, deep trench isolation (DTI) structures, local oxidation of silicon (LOCOS) structures, other isolation structures, or a combination thereof. In some embodiments, isolation features are formed by etching trenches in substrate 110 and filling the trench with insulator material (for example, using CVD or a spin-on glass process). A chemical mechanical polishing (CMP) process may be performed to remove excessive insulator material and/or planarize a top surface of isolation features. In some embodiments, isolation features can be formed by depositing an insulator material over substrate 110 after forming fin structures (in some embodiments, such that the insulator material fills gaps (trenches) between the fin structures) and etching back the insulator material. In some embodiments, isolation features include a multilayer structure that fills trenches, such as a bulk dielectric layer disposed over a liner dielectric layer, where the bulk dielectric layer and the liner dielectric layer include materials depending on design requirements (e.g., a bulk dielectric layer may include silicon nitride disposed over a liner dielectric layer that may include thermal oxide). In some embodiments, isolation features include a dielectric layer disposed over a doped liner layer (including, for example, boron silicate glass (BSG) or phosphosilicate glass (PSG)).

CESL 140 is disposed over substrate 110, gate structures 120A-120C (in particular, along sidewalls of gate spacers 126), epitaxial source/drains 130, and isolation features. ILD layer 142 is disposed over CESL 140. ILD layer 142 includes a dielectric material including, for example, silicon oxide, silicon nitride, silicon oxynitride, tetraethyl orthosilicate (TEOS) oxide, PSG, BPSG, low-k dielectric material, other suitable dielectric material, or a combination thereof. Low-k dielectric material generally refers to dielectric materials having a low dielectric constant relative to the dielectric constant of silicon dioxide. For example, low-k dielectric material has a dielectric constant less than about 3.9. In some embodiments, ILD layer 142 includes an extreme low-k dielectric material having a dielectric constant less than about 2.5. Exemplary low-k dielectric materials include fluorosilicate glass (FSG), carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or a combination thereof. In the depicted embodiment, ILD layer 142 includes a low-k dielectric material and is generally referred to as a low-k dielectric layer. CESL 140 includes a material different than ILD layer 142, such as a dielectric material that is different than the dielectric material of ILD layer 142. ILD layer 142 and/or CESL 140 can include a multilayer structure having multiple dielectric materials. In the depicted embodiment, where ILD layer 142 includes silicon and oxygen (for example, SiCOH, $SiO_x$, or other silicon-and-oxygen comprising material), CESL 140 includes silicon and nitrogen and/or carbon (for example, SiN, SiCN, SiCON, SION, SiC, SiCO, or a combination thereof). ILD layer 142 and/or CESL 140 are formed over substrate 110 by a deposition process, such as CVD, PVD, ALD, HDPCVD, MOCVD, RPCVD, PECVD, LPCVD, ALCVD, APCVD, PEALD, other suitable methods, or combinations thereof. In some embodiments, ILD layer 142 is formed by a flowable CVD (FCVD) process that includes, for example, depositing a flowable material over substrate 110 and converting the flowable material to a solid material by a suitable technique, such as thermal annealing and/or treating the flowable material with ultraviolet radiation. Subsequent to the deposition of ILD layer 142 and/or CESL 140, a CMP process and/or other planarization process may be performed that provides ILD layer 142, CESL 140, gate structures 120A-120C, or a combination thereof with substantially planar surfaces.

Figure 2B:
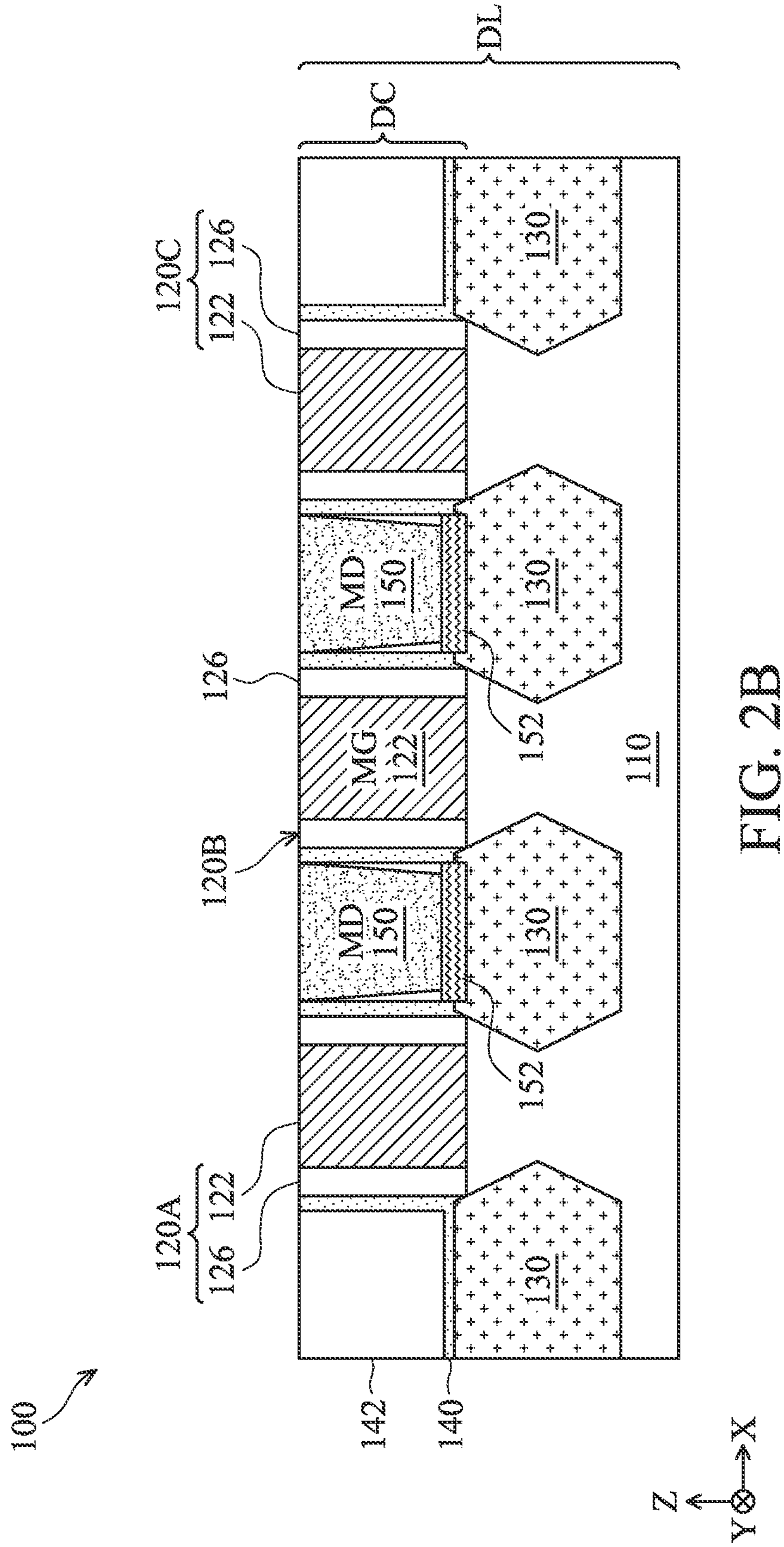

Referring to FIG. 2B, MOL processing includes forming device-level contacts, such as metal-to-device (MD) contacts, which generally refer to contacts to an electrically active region of device 100 (e.g., epitaxial source/drains 130). Device-level contacts electrically and physically connect device-level features to local contacts/interconnects, which are described below. The device-level features (e.g., FEOL features) can collectively be referred to as a device layer (DL), and the device-level contacts can collectively be referred to as a device-level contact layer (DC) disposed over and/or on the device layer. In FIG. 2B, forming device-level contacts includes forming barrier-free source/drain contacts 150 that extend through ILD layer 142 to physically contact respective epitaxial source/drains 130. For example, source/drain contacts 150 include electrically conductive plugs having sidewalls that physically contact surrounding dielectric material, such as ILD layer 142, CESL 140, contact spacers, or a combination thereof. In some embodiments, source/drain contacts 150 extend through CESL 140.

Source/drain contacts 150 include tungsten, molybdenum, alloys thereof, or a combination thereof. Source/drain contacts 150 may also include other electrically conductive material, such as ruthenium, cobalt, copper, aluminum, titanium, tantalum, iridium, palladium, platinum, nickel, tin, gold, silver, other suitable metal, alloys thereof, or a combination thereof. In the depicted embodiment, source/drain contacts 150 are barrier-free/liner-free tungsten plugs having a tungsten concentration that is greater than or equal to about 98 atomic percent (at %), such as about 98 at % to about 99.5 at %. For example, each source/drain contact 150 includes a tungsten plug (a metal bulk layer) that physically, directly contacts surrounding dielectric materials, such as ILD layer 142, CESL 140, gate spacers 126, other dielectric features, or a combination thereof. Source/drain contacts 150 are thus free of sidewall barriers/liners. In some embodiments, the tungsten plug also physically, directly contacts an underlying electrically conductive feature, such as a respective epitaxial source/drain 130 and/or a respective silicide layer 152 (described below). In some embodiments, source/drain contacts 150 include a metal bulk layer (e.g., a tungsten plug) and a bottom metal liner(s), where the metal bottom liner(s) is between the metal bulk layer and a respective silicide layer 152.

In some embodiments, forming source/drain contacts 150 includes patterning ILD layer 140 and/or CESL 142 to form source/drain contact openings extending therethrough that expose epitaxial source/drains 130, depositing at least one electrically conductive material (e.g., a metal bulk material) that fills the source/drain contact openings, and performing a planarization process (e.g., CMP) to remove portions of the at least one electrically conductive material that are disposed over a top of ILD layer 142, CESL 140, gate spacers 126, gate stacks 122 (e.g., hard masks thereof), or a combination thereof. The planarization process may be performed until reaching and exposing ILD layer 142. Remainders of the electrically conductive material form metal plugs. In some embodiments, ILD layer 142, CESL 140, gate spacers 126, gate stacks 122 (e.g., hard masks thereof), or a combination thereof function as a planarization stop layer. In some embodiments, one or more insulation layers may be deposited in the source/drain contact openings and processed to form contact spacers, such as dielectric layers and/or air gaps, along sidewalls of the electrically conductive portions of source/drain contacts 150.

ILD layer 140 and/or CESL 142 may be patterned by a lithography process and an etching process. The lithography process may include forming a patterned mask layer over ILD layer 142. The patterned mask layer has openings therein, each of which overlaps a respective epitaxial source/drain 130. The etching process may include transferring a pattern in the patterned mask layer to the dielectric layer, for example, by removing portions of ILD layer 142 and/or CESL 140 exposed by the openings in the patterned mask layer. The etching process is a dry etch, a wet etch, other suitable etching process, or a combination thereof. The etching process selectively removes the dielectric layer (i.e., dielectric material(s)) with respect to epitaxial source/drains 130 (e.g., semiconductor material(s)). In some embodiments, the etching process removes the patterned mask layer, in portion or entirety, from over the dielectric layer. In some embodiments, after the etching process, the patterned mask layer is removed from over ILD layer 142, for example, by an etching process and/or a resist stripping process.

In some embodiments, a blanket deposition process (e.g., blanket CVD) forms a metal bulk material (e.g., tungsten) over ILD layer 142 to fill the source/drain contact openings. The blanket deposition process may include flowing a metal-containing precursor (e.g., a tungsten-containing precursor, such as $WF_6$ and/or $WCl_5$) and a reactant precursor (e.g., $H_2$ and/or other suitable reactant gas) into a process chamber. A carrier gas may be used to deliver the metal-containing precursor gas and/or the reactant gas to the process chamber, and the carrier gas may be an inert gas, such as an argon-containing gas, a helium-containing gas, a xenon-containing gas, other suitable inert gas, or a combination thereof. In some embodiments, the blanket deposition process is PVD, ALD, other suitable process, or a combination thereof.

In some embodiments, a bottom-up deposition process fills the source/drain contact openings with a metal bulk material (e.g., tungsten) from bottom to top. The bottom-up deposition process, such as selective CVD or selective ALD, may include flowing a metal-containing precursor (e.g., a tungsten-containing precursor, such as $WF_6$ and/or $WCl_5$), a reactant precursor (e.g., $H_2$ and/or other suitable reactant gas), and a carrier gas into a process chamber and tuning deposition parameters to selectively grow the metal bulk material from silicide layers 152, epitaxial source/drains 130, metal seed layers, bottom metal liner(s) formed before the metal bulk material, or a combination thereof while limiting growth of the metal bulk material from dielectric materials (e.g., ILD layer 142, CESL 140, gate spacers 126, or a combination thereof). The deposition parameters include deposition precursors (e.g., metal precursors and/or reactants), deposition precursor flow rates, deposition temperature, deposition time, deposition pressure, source power, radio frequency (RF) bias voltage, RF bias power, other suitable deposition parameters, or a combination thereof. In some embodiments, the bottom-up deposition process includes multiple deposition/etch cycles, each of which may include depositing an electrically conductive material and etching back the electrically conductive material successively.

In some embodiments, before forming source/drain contacts 150 in the source/drain contact openings, silicide layers 152 are formed on epitaxial source/drains 130. Silicide layers 152 may extend through CESL 140. In FIG. 2B, top surfaces of silicide layers 152 are higher than a top surface of CESL 140 relative to a top surface of substrate 110. In some embodiments, the top surfaces of silicide layers 152 are lower and/or substantially planar with the top surface of CESL 140 relative to the top surface of substrate 110. In some embodiments, the top surfaces of silicide layers 152 are disposed lower than the top surface of substrate 110. Silicide layers 152 may be formed by depositing a metal layer over epitaxial source/drains 130 and heating device 100 (for example, subjecting device 100 to an annealing process) to cause constituents of epitaxial source/drains 130 (e.g., silicon and/or germanium) to react with metal constituents of the metal layer. The metal layer includes any metal constituent suitable for promoting silicide formation, such as nickel, platinum, palladium, vanadium, titanium, cobalt, tantalum, ytterbium, zirconium, other suitable metal, or a combination thereof. Silicide layers 152 thus include a metal constituent and a constituent of epitaxial source/drains 130, such as silicon and/or germanium. In some embodiments, silicide layers 152 include nickel silicide, titanium silicide, or cobalt silicide. Any un-reacted metal, such as remaining portions of the metal layer, may be selectively removed relative to silicide layers 152 and/or dielectric materials (e.g., ILD layer 142), for example, by an etching process. In some embodiments, silicide layers 152 may form a portion of epitaxial source/drains 130 and/or source/drain contacts 150.

Referring to FIGS. 2C-2K, MOL processing further includes forming local contacts, such as source/drain vias (VD) and gate vias (VG), which generally refer to contacts to device-level contacts (e.g., source/drain contacts 150) and/or device-level features (e.g., gate stacks 122). Local contacts physically and electrically connect device-level contacts and/or device-level features to BEOL interconnects, such as those of a first, bottom metallization/routing layer of a multilayer interconnect (MLI) (described below). The local contacts can collectively be referred to as a via contact layer (VC), and the local contacts thereof, such as the source/drain vias and the gate vias, can be referred to as via contacts (VC).

Figure 2C:
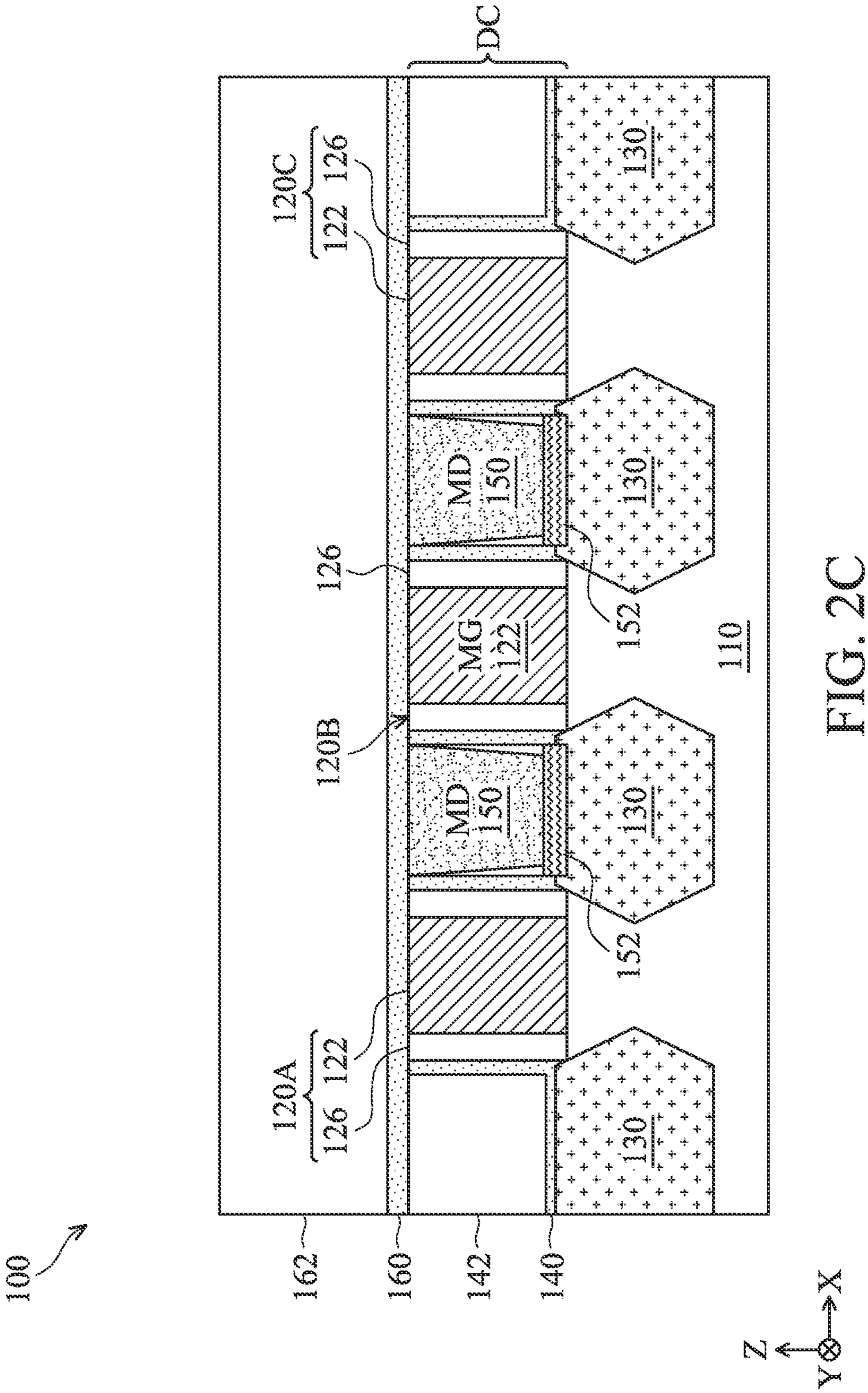

In FIG. 2C, a dielectric layer is formed over the DC layer. For example, a dielectric layer, such as a CESL 160 and an ILD layer 162, is formed over ILD layer 142, CESL 140, and source/drain contacts 150. The dielectric layer is also formed over the DL layer, such as over gate structures 120A-120C thereof. ILD layer 162 includes a dielectric material including, for example, silicon oxide, silicon nitride, silicon oxynitride, TEOS oxide, PSG, BPSG, low-k dielectric material (including extreme low-k dielectric material), other suitable dielectric material, or a combination thereof. The low-k dielectric material may include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other suitable low-k dielectric material, or a combination thereof. In FIG. 2C, ILD layer 162 includes a low-k dielectric material. ILD layer 162 may have a multilayer structure having multiple dielectric materials. ILD layer 162 is formed by CVD, PVD, ALD, HDPCVD, FCVD, MOCVD, RPCVD, PECVD, LPCVD, ALCVD, APCVD, PEALD, other suitable method, or a combination thereof. A CMP process and/or other planarization process may be performed to provide ILD layer 162 with a substantially planar surface.

CESL 160 includes a material different than ILD layer 162. For example, a dielectric material of CESL 160 is different than the dielectric material of ILD layer 162 to achieve etching selectivity during a subsequent etching process, such as that used to form interconnect openings that expose source/drain contacts 150 and/or gate stacks 122. In other words, CESL 160 and its surrounding layers include materials having distinct etching sensitivities to a given etchant, such that an etch rate of CESL 160 to an etchant is less than an etch rate of ILD layer 162. CESL 160 may thus act as an etch stop when etching ILD layer 162. The material of CESL 160 may also promote adhesion between CESL 160 and ILD layer 162. In some embodiments, CESL 160 includes silicon and nitrogen and/or carbon (for example, SiN, SiCN, SiCON, SION, SiC, SiCO, or a combination thereof). In some embodiments, CESL 160 includes a metal oxide layer and/or a metal nitride layer. The metal can include aluminum, hafnium, titanium, copper, manganese, vanadium, other suitable metal, or a combination thereof. CESL 160 may have a multilayer structure having multiple dielectric materials. CESL 160 is formed by CVD, PVD, ALD, HDPCVD, FCVD, MOCVD, RPCVD, PECVD, LPCVD, ALCVD, APCVD, PEALD, other suitable methods, or a combination thereof. A CMP process and/or other planarization process may be performed to provide CESL 160 with a substantially planar surface.

Figure 2D:
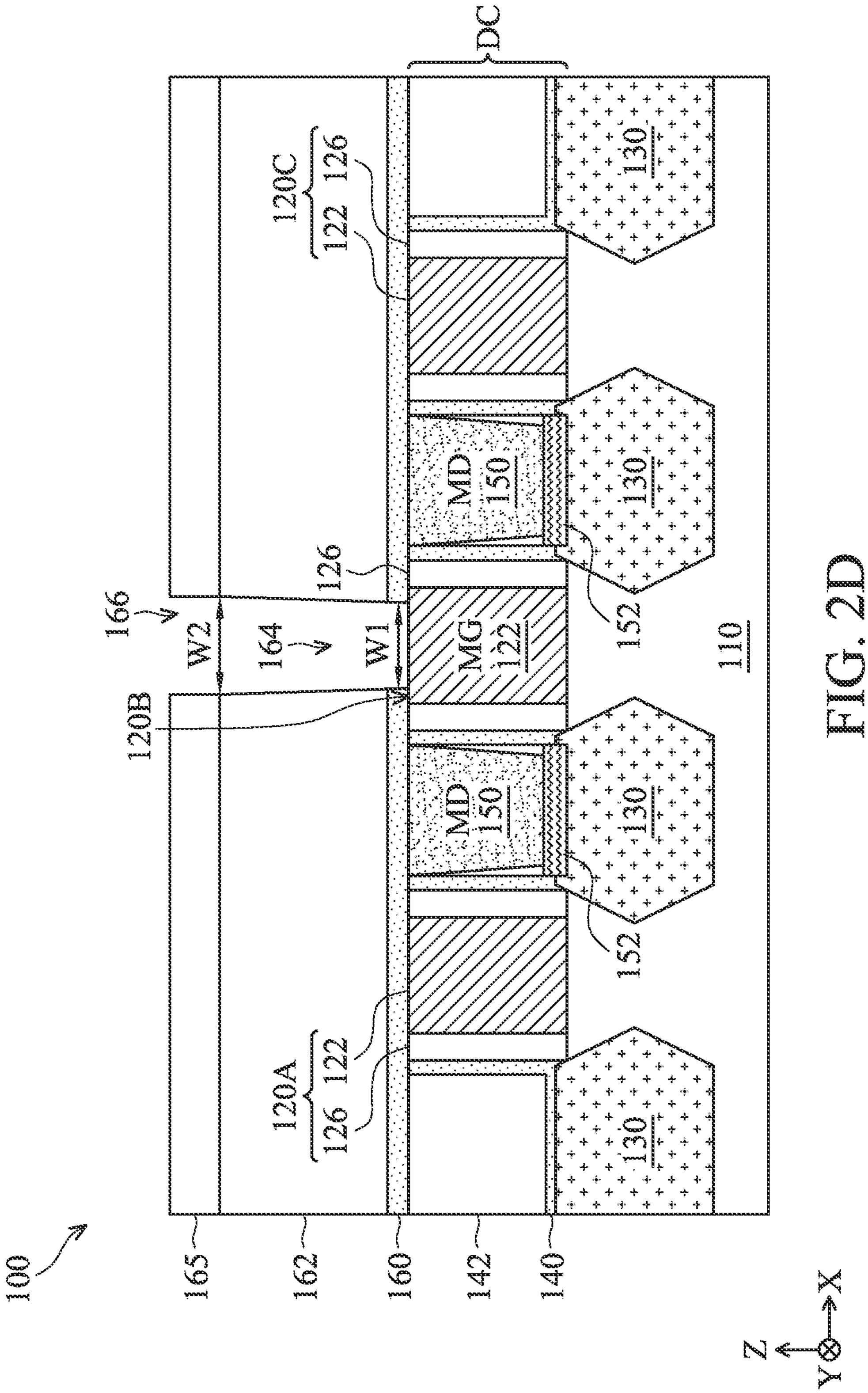

In FIG. 2D, a patterning process is performed to form gate via openings that expose respective gate stacks of gate structures 120A-120C. For example, the patterning process forms a gate via opening 164 that extends through ILD layer 162 and CESL 160 to expose gate stack 122 of gate structure 120B. Gate via opening 164 has sidewalls formed by the dielectric layer (e.g., ILD layer 162 and/or CESL 160) and a bottom formed by gate stack 122. The bottom extends between the sidewalls. In FIG. 2D, gate via opening 164 has a trapezoidal shape. For example, gate via opening 164 has tapered sidewalls, gate via opening 164 has a bottom width (e.g., a width W1 along the x-direction) proximate gate stack 122 and a top width (e.g., a width W2 along the x-direction) proximate a top surface of ILD layer 162, and a width of gate via opening 164 decreases along the z-direction from the top width to the bottom width. Width W1 is thus less than width W2. In some embodiments, width W1 and width W2 are each less than about 16 nm (i.e., width W1, width $W2 \leq 16$ nm). In some embodiments, a difference between width W1 and width W2 is less than about 2 nm (i.e., $|\text{width } W1 - \text{width } W2| \leq 2$ nm) to provide gate via opening 164 with minimally tapered sidewalls, which may be considered substantially vertical sidewalls, in some embodiments. The present disclosure contemplates gate via opening 164 having other shapes, such as a rectangular shape where width W1 equals width W2.

ILD layer 162 and/or CESL 160 may be patterned by a lithography process and an etching process. The lithography process may include forming a patterned mask layer 165 over ILD layer 162. Patterned mask layer 165 has an opening 166 therein that overlaps a respective gate stack 122, such as gate stack 122 of gate structure 120B. The etching process may include transferring a pattern in patterned mask layer 165 to the dielectric layer, for example, by removing portions of ILD layer 162 and/or CESL 160 exposed by opening 166. The etching process is a dry etch, a wet etch, other suitable etching process, or a combination thereof. The etching process selectively removes the dielectric layer (i.e., dielectric material(s)) with respect to gate stack 122 (e.g., metal material(s)). In some embodiments, the etching process removes patterned mask layer 165, in portion or entirety, from over the dielectric layer. In some embodiments, after the etching process, patterned mask layer 165 is removed from over ILD layer 162, for example, by an etching process and/or a resist stripping process.

Figure 2E:
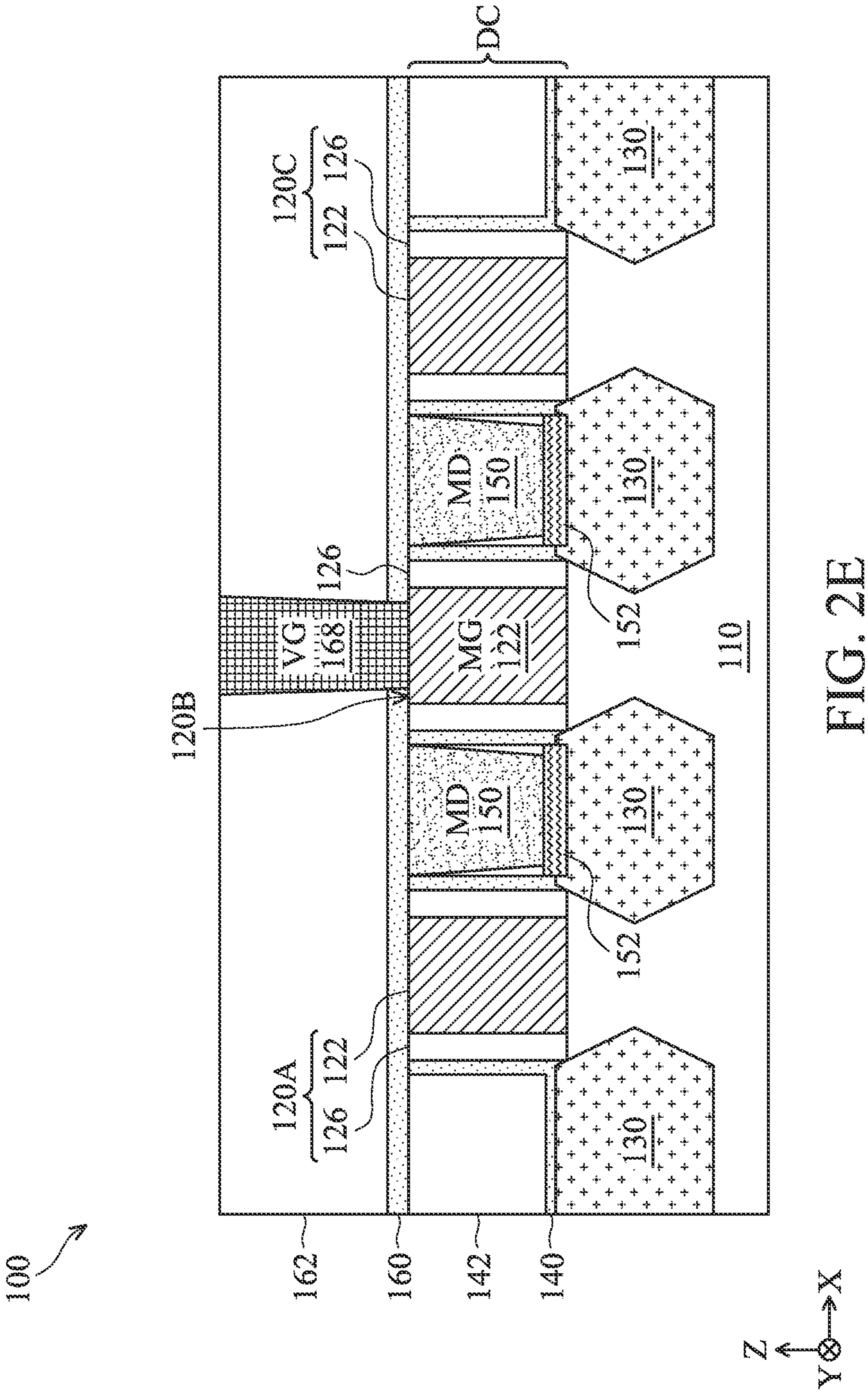

In FIG. 2E, a barrier-free gate via 168 (VG) is formed in gate via opening 164. Barrier-free gate via 168 extends through ILD layer 162 and/or CESL 160 to physically contact gate stack 122 of gate structure 120B. For example, gate via 168 includes an electrically conductive plug having sidewalls that physically contact surrounding dielectric material, such as ILD layer 162. CESL 160, contact spacers, or a combination thereof. Gate via 168 includes tungsten, molybdenum, alloys thereof, or a combination thereof. Gate via 168 may also include other electrically conductive material, such as ruthenium, cobalt, copper, aluminum, titanium, tantalum, iridium, palladium, platinum, nickel, tin, gold, silver, other suitable metal, alloys thereof, or a combination thereof. In the depicted embodiment, gate via 168 is a barrier-free/liner-free tungsten plug having a tungsten concentration that is greater than or equal to about 98 atomic percent (at %), such as about 98 at % to about 99.5 at %. For example, gate via 168 includes a tungsten plug (a metal bulk layer) that physically, directly contacts surrounding dielectric materials, such as ILD layer 162, CESL 160, other dielectric features, or a combination thereof. Gate via 168 is thus free of sidewall barriers/liners. In some embodiments, the tungsten plug also physically, directly contacts underlying gate stack 122. In some embodiments, gate via 168 includes a metal bulk layer (e.g., a tungsten plug) and a bottom metal liner(s), where the metal bottom liner(s) is between the metal bulk layer and gate stack 122. In embodiments, where gate via 168 is a barrier-free/liner-free tungsten plug, such as depicted, gate stack 122 may be free of a gate cap, such as a tungsten cap. For example, gate stack 122 may include a gate dielectric and a gate electrode, and gate via 168 may be deposited on/grown from the gate electrode (e.g., a top surface thereof, which may be formed by a work function layer and/or a bulk layer). In such example, gate via 168 may be deposited on/grown from a surface that includes titanium, tantalum, aluminum, tungsten, nitrogen, carbon, oxygen, silicon, or a combination thereof. In such example, the gate dielectric may wrap the gate electrode.

Forming barrier-free gate via 168 includes depositing at least one electrically conductive material (e.g., a metal bulk material) that fills gate via opening 164 and performing a planarization process (e.g., CMP) to remove portions of the at least one electrically conductive material that are disposed over a top of ILD layer 162. The planarization process may be performed until reaching and exposing ILD layer 162. Remainders of the electrically conductive material form metal plugs, such as a tungsten plug. In some embodiments, ILD layer 162 function as a planarization stop layer. In some embodiments, one or more insulation layers may be deposited in gate via opening 164 and processed to form contact spacers, such as dielectric layers and/or air gaps, along sidewalls of the metal plug of barrier-free gate via 168.

In some embodiments, a blanket deposition process (e.g., blanket CVD) forms a metal bulk material (e.g., tungsten) over ILD layer 162 that fills gate via opening 164. The blanket deposition process may include flowing a metal-containing precursor (e.g., a tungsten-containing precursor, such as $WF_6$ and/or $WCl_5$) and a reactant precursor (e.g., $H_2$ and/or other suitable reactant gas) into a process chamber. A carrier gas may be used to deliver the metal-containing precursor gas and/or the reactant gas to the process chamber, and the carrier gas may be an inert gas, such as an argon-containing gas, a helium-containing gas, a xenon-containing gas, other suitable inert gas, or a combination thereof. In some embodiments, the blanket deposition process is PVD, ALD, other suitable process, or a combination thereof.

In some embodiments, a bottom-up deposition process fills gate via opening 164 with a metal bulk material (e.g., tungsten) from bottom to top. The bottom-up deposition process, such as selective CVD or selective ALD, may include flowing a metal-containing precursor (e.g., a tungsten-containing precursor, such as $WF_6$ and/or $WCl_5$), a reactant precursor (e.g., $H_2$ and/or other suitable reactant gas), and a carrier gas into a process chamber and tuning deposition parameters to selectively grow the metal bulk material from gate stack 122, metal seed layers, bottom metal liner(s) formed before the metal bulk material, or a combination thereof while limiting growth of the metal bulk material from dielectric materials (e.g., ILD layer 162 and/or CESL 160). The deposition parameters include deposition precursors (e.g., metal precursors and/or reactants), deposition precursor flow rates, deposition temperature, deposition time, deposition pressure, source power, RF bias voltage, RF bias power, other suitable deposition parameters, or a combination thereof. In some embodiments, the bottom-up deposition process includes multiple deposition/etch cycles, each of which may include depositing an electrically conductive material and etching back the electrically conductive material successively.

Figure 2F:
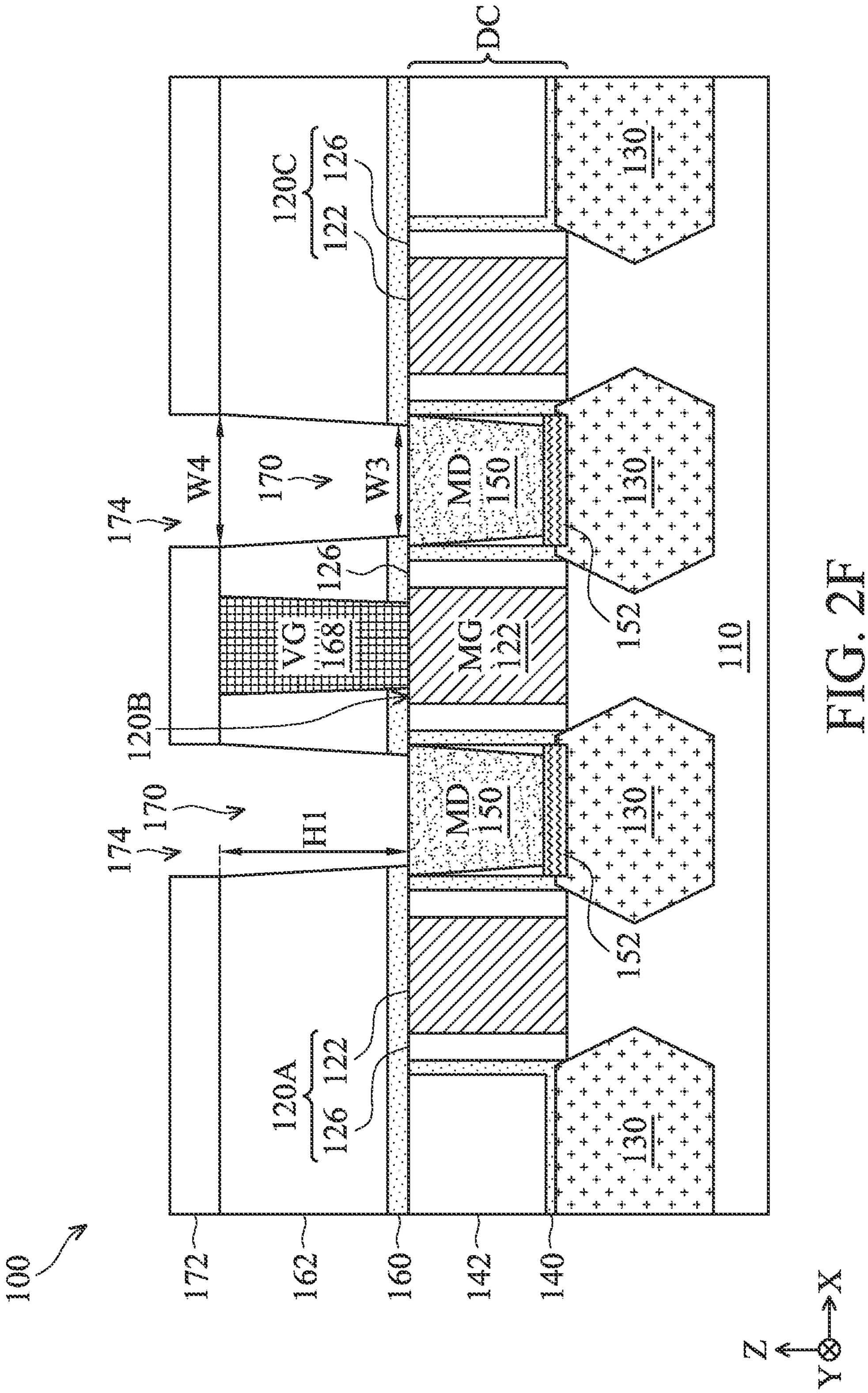

In FIG. 2F, a patterning process is performed to form source/drain via openings 170 that expose respective source/drain contacts 150. Source/drain via openings 170 extend through ILD layer 162 and CESL 160 to expose respective epitaxial source/drains 130 between which gate structure 120B is disposed. Source/drain via openings 170 have respective sidewalls formed by the dielectric layer (e.g., ILD layer 162 and/or CESL 160) and a respective bottom formed by a respective source/drain contact 150. The bottom extends between the sidewalls. In FIG. 2F, source/drain via openings 170 have a height H1 (e.g., along the z-direction). Height H1 is about a sum of a thickness of the dielectric layer (e.g., a sum of a thickness of ILD layer 162 and a thickness of CESL 160). In some embodiments, height H1 is about 10 nm to about 30 nm. Further, source/drain via openings 170 may have a trapezoidal shape. For example, source/drain via openings 170 have tapered sidewalls, source/drain via openings 170 have a bottom width (e.g., a width W3 along the x-direction) proximate source/drain contacts 150, and source/drain via openings 170 have a top width (e.g., a width W4 along the x-direction) proximate a top surface of ILD layer 162. A width of source/drain via openings 170 decreases along the z-direction from the top width to the bottom width. Width W3 is thus less than width W4. In some embodiments, width W3 and width W4 are each less than about 16 nm (i.e., width W3, width W4≤16 nm). In some embodiments, a difference between width W3 and width W4 is less than about 2 nm (i.e., |width W3−width W4|≤2 nm) to provide source/drain via openings 170 with minimally tapered sidewalls, which may be considered substantially vertical sidewalls, in some embodiments. The present disclosure contemplates source/drain via openings 170 having other shapes, such as rectangular shapes where width W3 equals width W4.

ILD layer 162 and/or CESL 160 may be patterned by a lithography process and an etching process. The lithography process may include forming a patterned mask layer 172 over ILD layer 162. Patterned mask layer 172 has openings 174 therein that overlap respective source/drain contacts 150. The etching process may include transferring a pattern in patterned mask layer 172 to the dielectric layer, for example, by removing portions of ILD layer 162 and/or CESL 160 exposed by openings 174. The etching process is a dry etch, a wet etch, other suitable etching process, or a combination thereof. The etching process selectively removes the dielectric layer (i.e., dielectric material(s)) with respect to source/drain contacts 150 (e.g., metal material(s)). In some embodiments, the etching process removes patterned mask layer 172, in portion or entirety, from over the dielectric layer. In some embodiments, after the etching process, patterned mask layer 172 is removed from over ILD layer 162, for example, by an etching process and/or a resist stripping process. In some embodiments, a single lithography and etching process is performed to form source/drain via openings 170. In some embodiments, a first lithography and etching process forms a first one of source/drain via openings 170, and a second lithography and etching process forms a second one of source/drain via openings 170.

Figure 2G:
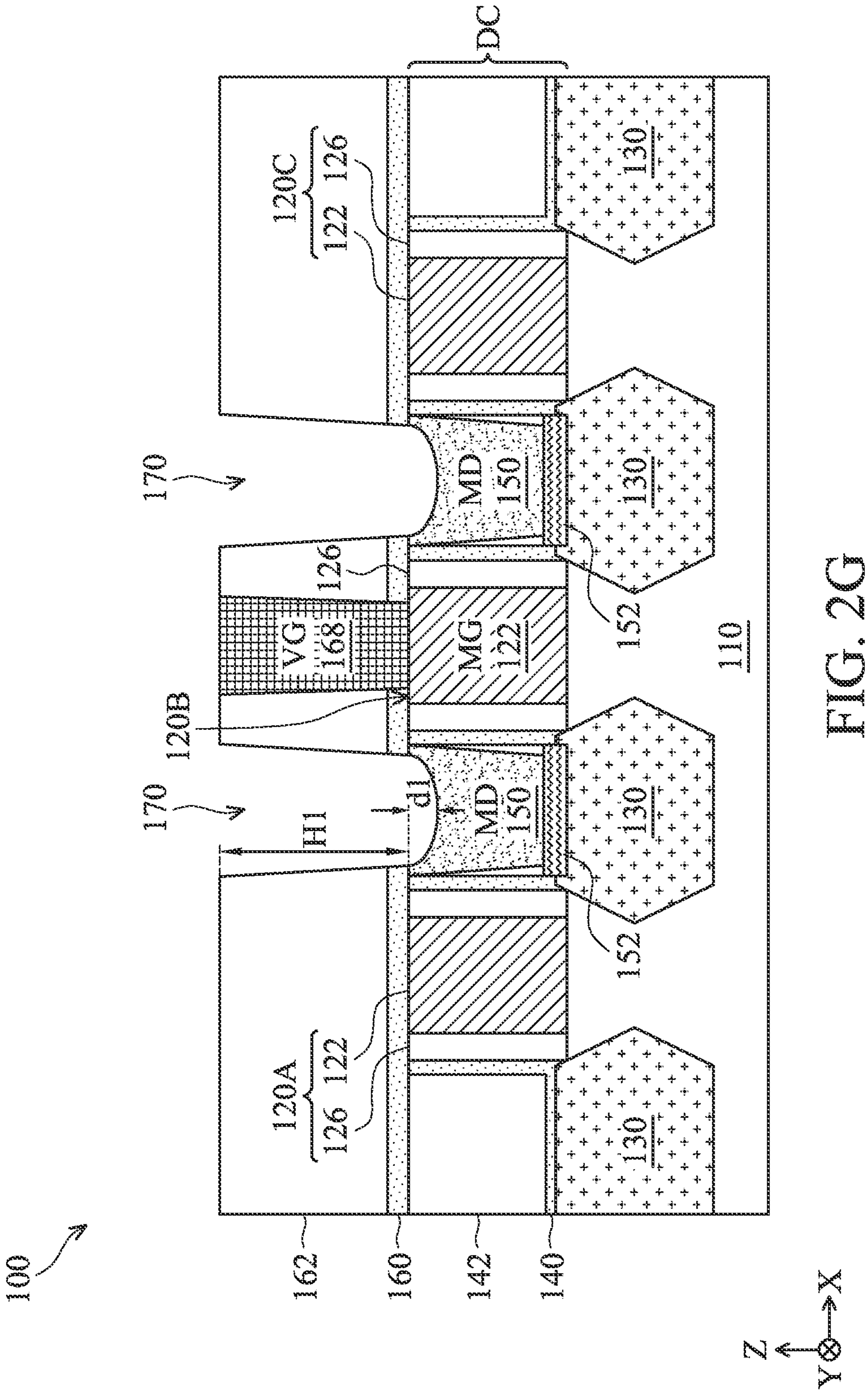
Figure 2H:
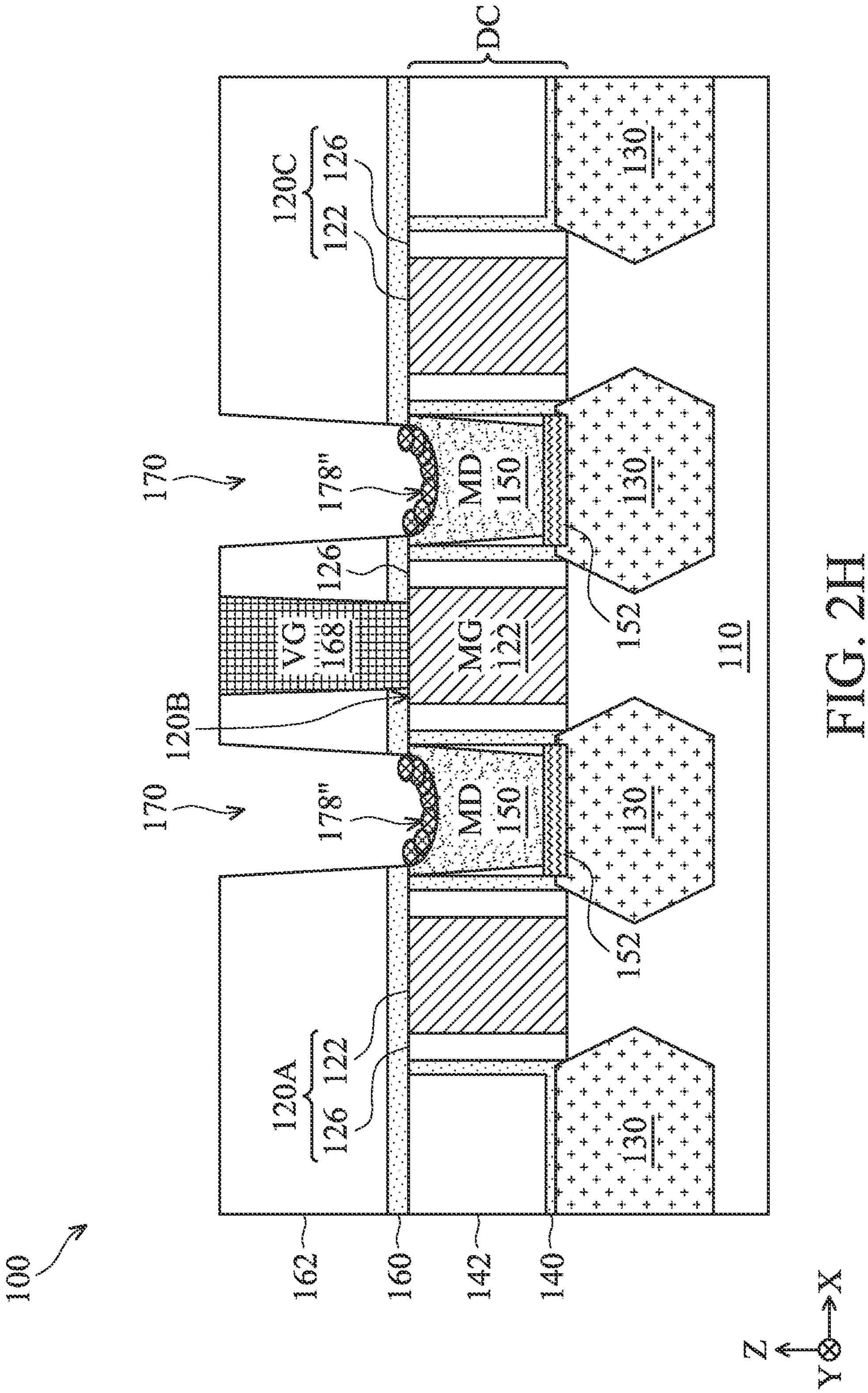

In FIG. 2G, source/drain via openings 170 are extended by recessing source/drain contacts 150. In some embodiments, an etching process is performed to extend source/drain via openings 170 into source/drain contacts 150 and below a top surface of ILD layer 142 and/or top surfaces of gate stacks 122. Such process can be referred to as a contact etch back, a contact recess, a plug recess (or etch back), or a combination thereof. After recessing, a distance d1 is between a top surface of source/drain contacts 150 and a top surface of ILD layer 142. Source/drain via openings 170 thus extend distance d1 below ILD layer 142 and/or top surfaces of gate stacks 122, and source/drain via openings 170 have a height that is a sum of height H1 and distance d1. In some embodiments, distance d1 is less than about 8 nm (i.e., distance d1≤8 nm). In the depicted embodiment, after recessing, source/drain contacts 150 have dished top surfaces that form bottoms of source/drain via openings 170. The contact etch back may increase a contact area between source/drain contacts 150 and subsequently formed source/drain vias, which can improve performance of device 100 and/or improve structural integrity of the source/drain vias and/or MOL interconnect structures including the source/drain vias.

The etching process is a dry etch, a wet etch, other suitable etching process, or a combination thereof. In some embodiments, the contact etch back is a wet etch and/or a wet soak that utilizes a wet etchant solution for removing the material of source/drain contacts 150 (e.g., metal material, such as tungsten) at a higher rate than the material of ILD layer 162 (e.g., dielectric material, such as silicon-and-oxygen containing material) and the material of CESL 160 (e.g., dielectric material, such as silicon-and-nitrogen containing material, metal-and-oxygen containing material, metal-and-nitrogen containing material, etc.) (i.e., the etchant has a high etch selectivity with respect to source/drain contacts 150). The wet etch may implement a wet etchant solution that includes ammonia ($NH_4OH$), hydrogen peroxide ($H_2O_2$), water ($H_2O$), deionized water (DIW), carbon dioxide ($CO_2$), ozone ($O_3$), hydrofluoric acid (HF), nitric acid ($HNO_3$), hydrochloric acid (HCl), other suitable wet etchant/soak constituents, or a combination thereof. In some embodiments, a pH of the wet etchant solution, an etch temperature, an etch time, or a combination thereof may be tuned to achieve desired etch selectively. In some embodiments, a dry etching process is implemented to form source/drain via openings 170 in the dielectric layer, and a wet etching process is implemented to extend source/drain via openings 170.

In some embodiments, before or after recessing source/drain contacts 150, device 100 may undergo a cleaning process to remove native oxides, chemical oxides, other contaminants, or a combination thereof from device 100, such as those that may be on source/drain contacts 150, ILD layer 162, CESL 160, or a combination thereof. In some embodiments, the cleaning process is configured to both remove contamination from source/drain contacts 150 (and surfaces forming source/drain via openings 170) and recess source/drain contacts 150. The cleaning process may be a wet clean, a dry clean, other suitable clean, or a combination thereof. In some embodiments, the cleaning process is a dry clean that applies a dry clean gas (e.g., an etch gas) to device 100, including within source/drain via openings 170. The dry clean gas can include a mixture of HF and ammonia ($NH_3$). In such embodiments, the cleaning process may be a chemical oxide removal (COR) process. The dry clean gas can include other gaseous mixtures. In some embodiments, the cleaning process is a wet clean that applies a wet clean solution to device 100, including within source/drain via openings 170. The wet clean solution can include $H_2O$ (which may be DIW or ozonated de-ionized water ($DIWO_3$)), $O_3$, $H_2SO_4$ (sulfuric acid), $H_2O_2$ (hydrogen peroxide), $NH_4OH$ (ammonium hydroxide), HCl (hydrochloric acid), HF, DHF (diluted HF), $HNO_3$, $H_3PO_4$ (phosphoric acid), tetramethylammonium hydroxide (TMAH), other suitable chemicals, or a combination thereof (e.g., a standard clean 1 (SC1) (i.e., mixture of $NH_4OH$, $H_2O_2$, and DIW), a standard clean 2 (SC2) (i.e., mixture of HCl, $H_2O_2$, and DIW), a sulfuric peroxide mix (SPM) (i.e., mixture of $H_2SO_4$ and $H_2O_2$), a sulfuric oxide mix (SOM) (i.e., mixture of $H_2SO_4$ and $O_3$), other mixtures, or a combination thereof). In some embodiments, during a wet clean, device 100 and/or the wet cleaning solution may be agitated using ultrasonic energy or any other technique to facilitate cleaning. Likewise, in some embodiments, during a wet clean and/or a dry clean, heat may be applied to promote cleaning.

Figure 2I:
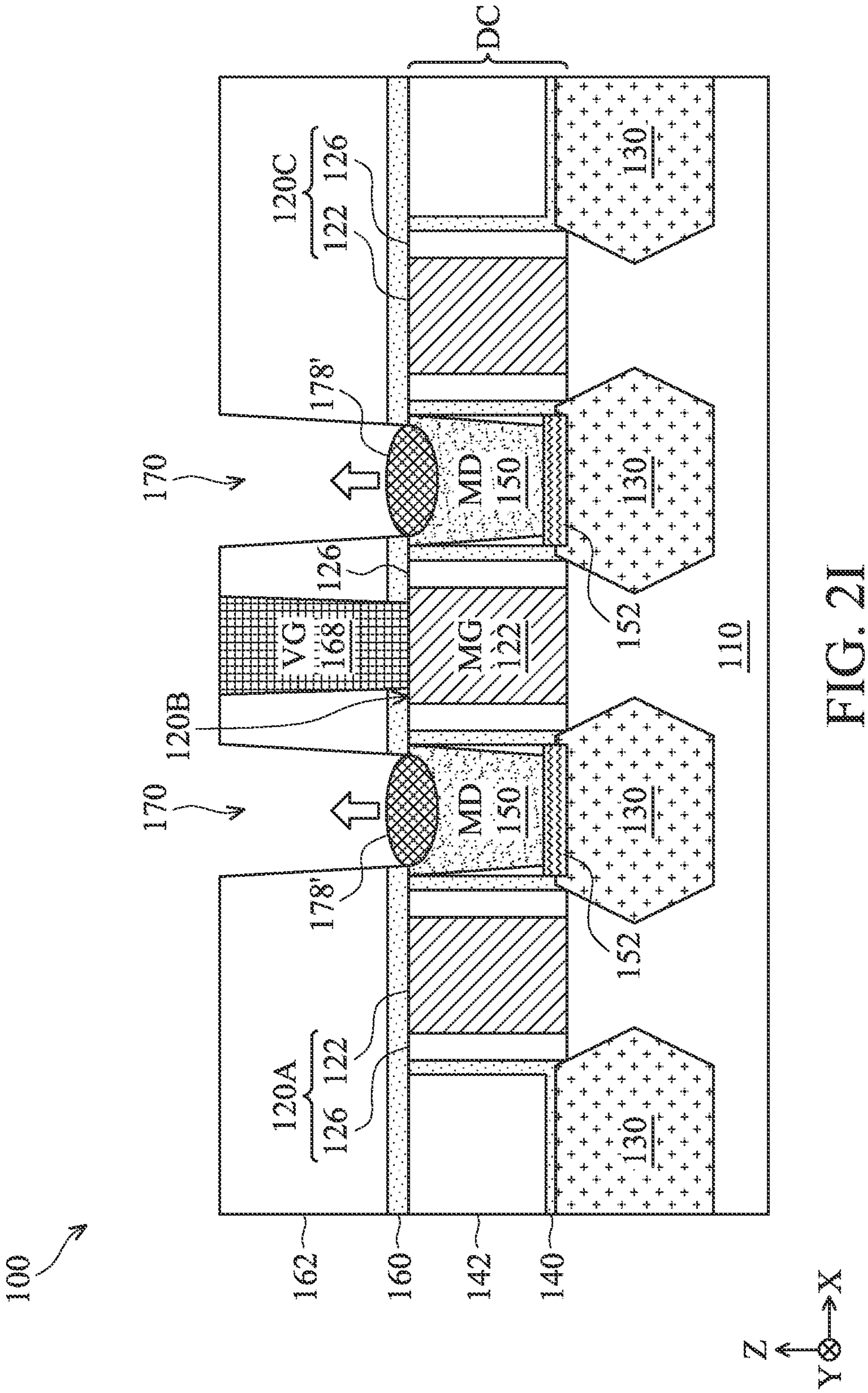
Figure 2J:
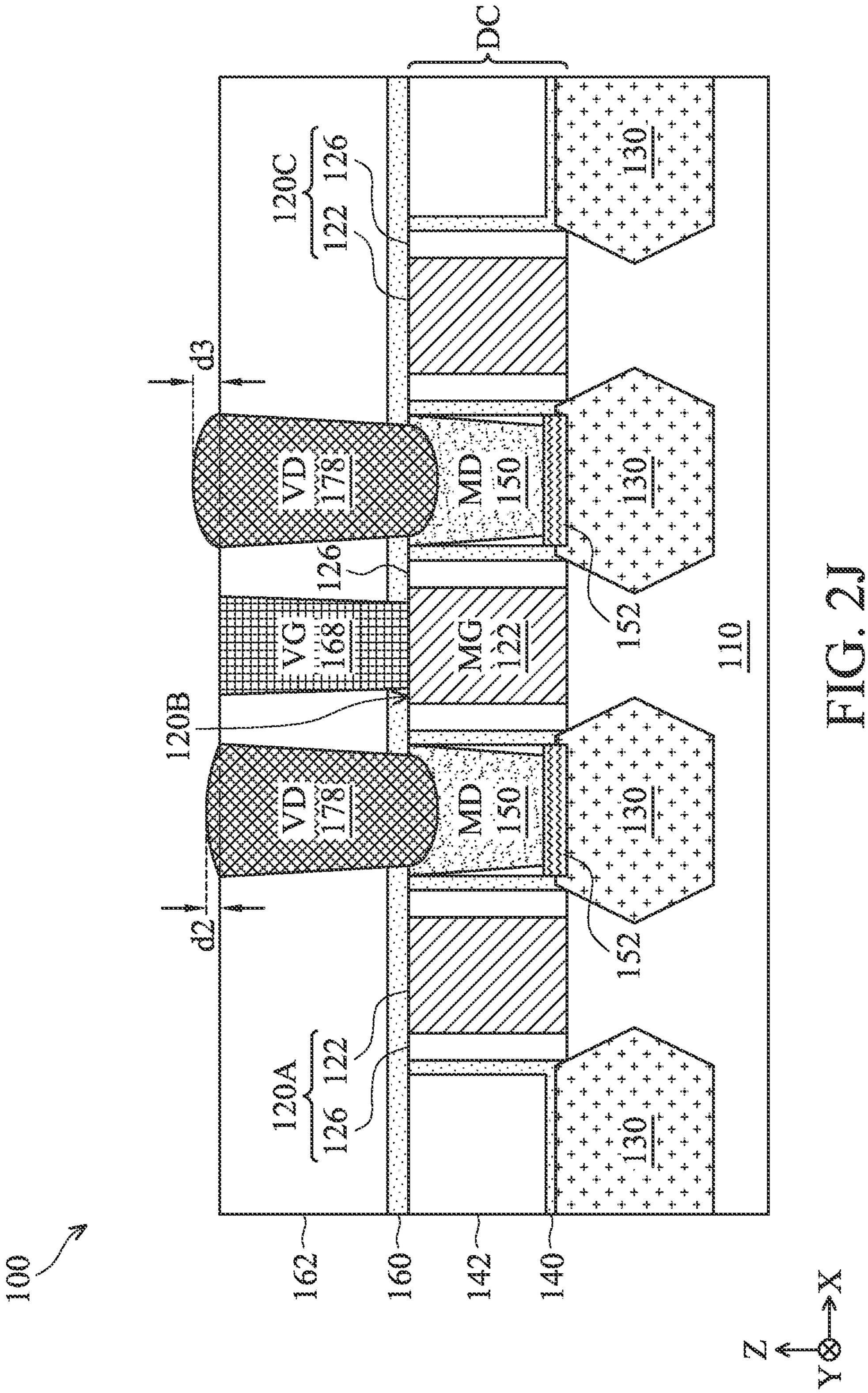
Figure 2K:
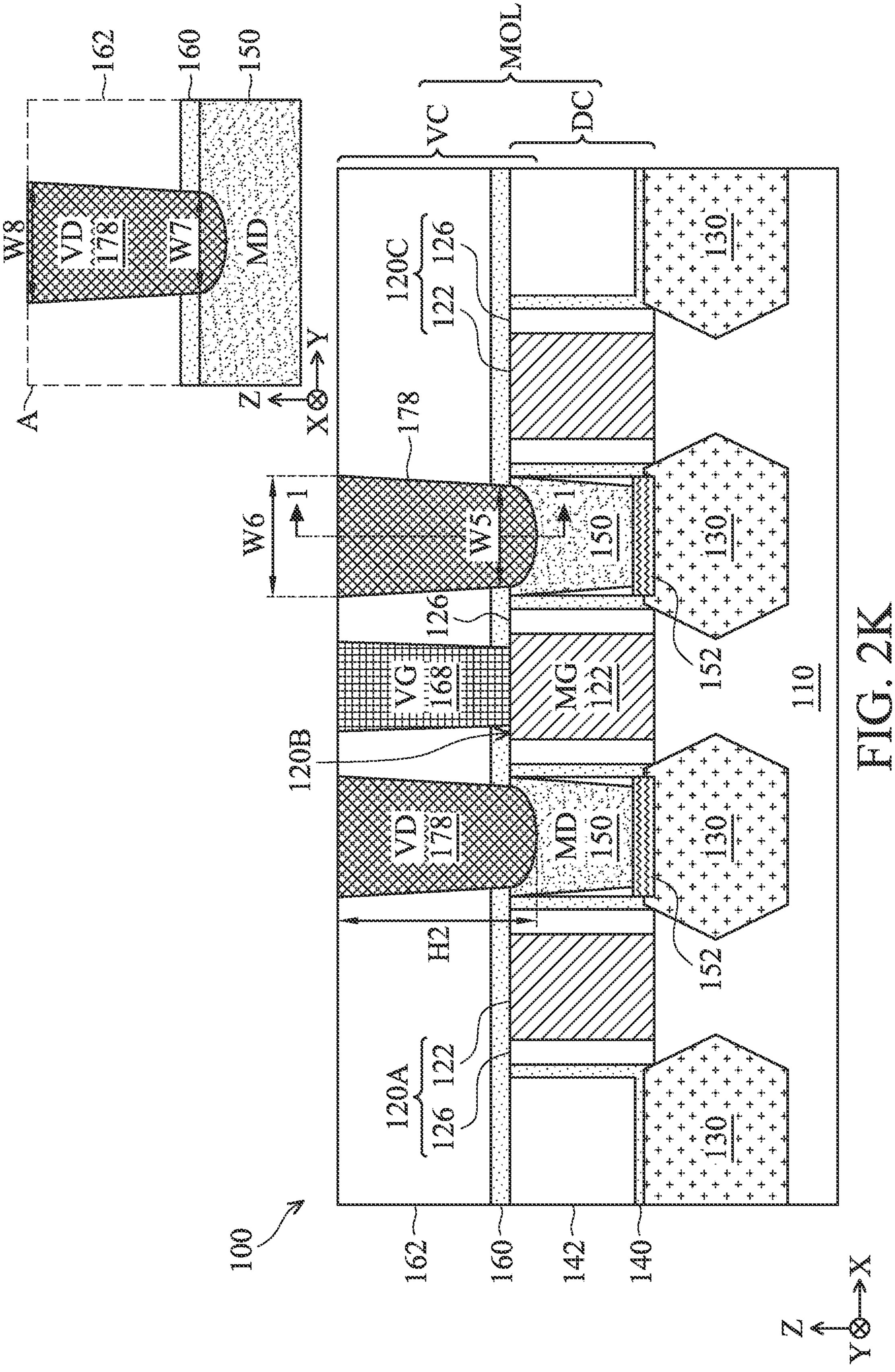

In FIGS. 2H-2K, barrier-free molybdenum-containing source/drain vias 178 (VD) are formed in source/drain via openings 170. In FIG. 2K, barrier-free source/drain vias 178 extend through ILD layer 162 and/or CESL 160 to physically contact gate stack 122 of gate structure 120B. For example, source/drain vias 178 includes an electrically conductive plug having sidewalls that physically contact surrounding dielectric material, such as ILD layer 162, CESL 160, contact spacers, or a combination thereof. Source/drain vias 178 include molybdenum, alloys thereof, or a combination thereof. Source/drain vias 178 may also include other electrically conductive material, such as tungsten, ruthenium, cobalt, copper, aluminum, titanium, tantalum, iridium, palladium, platinum, nickel, tin, gold, silver, other suitable metal, alloys thereof, or a combination thereof. In the depicted embodiment, source/drain vias 178 are barrier-free/liner-free molybdenum plugs having a molybdenum concentration that is greater than or equal to about 98 atomic percent (at %), such as about 98 at % to about 99.5 at %. For example, source/drain vias 178 includes molybdenum plugs (metal bulk layers) that physically, directly contact surrounding dielectric materials, such as ILD layer 162, CESL 160, other dielectric features, or a combination thereof. Source/drain vias 178 are thus free of sidewall barriers/liners. In some embodiments, the molybdenum plugs also physically, directly contacts underlying source/drain contacts 150. In some embodiments, source/drain vias 178 include a metal bulk layer (e.g., a molybdenum plug) and a bottom metal liner(s), where the metal bottom liner(s) is between the metal bulk layer and a respective source/drain contact 150. In the depicted embodiment, source/drain vias 178 further extend into source/drain contacts 150 and below the top surface of ILD layer 142 and/or top surfaces of gate stacks 122.

Forming barrier-free source/drain vias 178 includes performing a bottom-up deposition process to form at least one electrically conductive material (e.g., a bulk molybdenum material) that fills source/drain via openings 170 (FIGS. 2H-2J) from bottom to top (i.e., a bottom-up fill of source/drain via openings 170) and performing a planarization process on the at least one electrically conductive material (FIG. 2K), which may remove portions of the at least one electrically conductive material that are disposed over a top surface of ILD layer 162. The bottom-up deposition process, such as selective CVD or selective ALD, includes flowing a molybdenum-containing precursor and a reactant precursor into a process chamber and tuning deposition parameters to selectively grow molybdenum material from source/drain contacts 150, metal seed layers, bottom metal liner(s) formed before the molybdenum material, or a combination thereof while limiting growth of the molybdenum material from dielectric materials (e.g., ILD layer 162 and/or CESL 160). The molybdenum-containing precursor may thus adsorb on metal surfaces, such as bottoms of source/drain via openings 170 formed by source/drain contacts 150, but not dielectric surfaces, such as sidewalls of source/drain via openings 170 formed by ILD layer 162 and/or CESL 160. The molybdenum-containing precursor includes molybdenum hexafluoride ($MoF_6$), molybdenum pentachloride ($MoCl_5$), molybdenum dichloride dioxide ($MoO_2Cl_2$), other suitable molybdenum-containing gas, or a combination thereof. The reactant precursor includes $H_2$ and/or other suitable reactant gas. In some embodiments, a carrier gas delivers the molybdenum-containing precursor gas and/or the reactant gas to the process chamber. The carrier gas may be an inert gas, such as an argon-containing gas, a helium-containing gas, a xenon-containing gas, other suitable inert gas, or a combination thereof. The deposition parameters include deposition precursors (e.g., metal precursors and/or reactants), deposition precursor flow rates, deposition temperature, deposition time, deposition pressure, source power, RF bias voltage, RF bias power, other suitable deposition parameters, or a combination thereof. In some embodiments, the bottom-up deposition process includes multiple deposition/etch cycles, each of which may include depositing and etching back molybdenum material successively. In some embodiments, one or more insulation layers may be deposited in source/drain via openings 170 and processed to form contact spacers, such as dielectric layers and/or air gaps, along sidewalls of the molybdenum plugs.

In the depicted embodiment, the bottom-up deposition process includes a first deposition step and a second deposition step. The first deposition step includes forming a molybdenum nucleation layer 178" on source/drain contacts 150 (FIG. 2H), and the second deposition step includes forming a molybdenum bulk layer, such as a via bulk molybdenum material 178', on molybdenum nucleation layer 178" (FIG. 2I and FIG. 2J). Molybdenum nucleation layer 178" is a thin, selective molybdenum layer that facilitates uniform, seam-free formation of via bulk molybdenum material 178', and via bulk molybdenum material 178' and molybdenum nucleation layer 178" combine to form barrier-free molybdenum plugs. In some embodiments, a thickness of molybdenum nucleation layer 178" is about 12 nm to about 30 nm. Each of the first deposition step and the second deposition step is configured to selectively deposit and/or grow molybdenum or alloys thereof on and/or from source/drain contacts 150 (e.g., tungsten plugs) while limiting and/or preventing deposition and/or growth of molybdenum or alloys thereof on and/or from dielectric materials (e.g., ILD layer 162 and/or CESL 160).

The first deposition step and the second deposition step may use the same or different type of selective deposition process and/or the same or different deposition parameters. In some embodiments, the first deposition step and the second deposition step implement selective CVD and various parameters of the selective CVD are tuned to selectively grow molybdenum on source/drain contacts 150 (e.g., tungsten) using a reduction reaction. In such embodiments, the selective CVD includes flowing a molybdenum-containing precursor and a reactant precursor into a process chamber. In some embodiments, a molybdenum-containing precursor implemented by the first deposition step is $MoF_6$, $MoCl_5$, $MoO_2Cl_2$, or a combination thereof, a molybdenum-containing precursor implemented by the second deposition step is $MoCl_5$, and a reactant precursor implemented by the first deposition step and the second deposition step is $H_2$. In some embodiments, a flow rate of the molybdenum-containing precursor is less than a flow rate of the reactant precursor. For example, in some embodiments, the second deposition step implements a flow rate of $MoCl_5$ that is about 0.01 standard cubic centimeters per minute (sccm) to about 5 sccm. In some embodiments, the second deposition step implements a flow rate of $H_2$ that is about 10,000 sccm to about 250,000 sccm. In some embodiments, a chamber pressure during the bottom-up deposition process (e.g., during the first deposition step and/or the second deposition step) is about 1 Torr to about 500 Torr. In some embodiments, a temperature of device 100 (for example, substrate 110) during the bottom-up deposition process (e.g., during the first deposition step and/or the second deposition step) is about 200° C. to about 450° C. In some embodiments, the first deposition step implements a pulsed nucleation layer (PNL) deposition process. In some embodiments, the first deposition step and/or the second deposition step is selective ALD, where various parameters of the ALD are tuned to selectively grow molybdenum or alloys thereof. In some embodiments, multiple ALD cycles are performed to form via bulk molybdenum material 178'.

The bottom-up deposition process is performed until via bulk molybdenum material 178' fills source/drain openings 170 and extends from source/drain contacts 150 to at least the top surface of ILD layer 162. In the depicted embodiment, via bulk molybdenum material 178' extends beyond the top surface of ILD layer 162, such that via bulk molybdenum material 178' protrudes from ILD layer 162. In FIG. 2J, the bottom-up deposition process may not uniformly deposit/grow via bulk molybdenum material 178' in source/drain via openings 170. For example, via bulk molybdenum material 178' deposited on/grown from one of source/drain contacts 150 extends a distance d2 above the top surface of ILD layer 162, while via bulk molybdenum material 178' deposited on/grown from another one of source/drain contacts 150 extends a distance d3. Distance d3 may be greater than or less than distance d2. In some embodiments, distance d2 is less than about 8 nm (i.e., distance d2≤8 nm) and/or distance d3 is less than about 8 nm (i.e., distance d3≤8 nm). In some embodiments, the various deposition parameters of the bottom-up deposition process are tuned to minimize variations in via bulk material 178' in source/drain via openings 170 across device 100.

In FIG. 2K, a CMP process and/or other planarization process is performed to remove excess via bulk molybdenum material 178', such as that disposed over the top surface of ILD layer 162. The planarization process may be performed until reaching and/or exposing ILD layer 162. Remainders of via bulk molybdenum material 178', which fill source/drain via openings 170, form barrier-free molybdenum source/drain vias 178 (i.e., barrier-free molybdenum plugs). ILD layer 162 may function as a planarization stop layer. In the depicted embodiment, source/drain vias 178 do not protrude from the top surface of ILD layer 162 after planarization. Top surfaces of source/drain vias 178 may be planarized, such that the top surface of ILD layer 162 and the top surfaces of source/drain vias 178 form a substantially planar surface.

In FIG. 2K, barrier-free source/drain vias 178 extend through ILD layer 162 and/or CESL 160 to physically contact source/drain contacts 150, and in the depicted embodiment, further extend into source/drain contacts 150. Source/drain vias 178 have sidewalls that physically contact ILD layer 162 and/or CESL 160 and a bottom that physically contacts a respective source/drain contact 150. Because source/drain contacts 150 have dished top surfaces, source/drain vias 178 have curved bottom surfaces, and bottom portions of source/drain vias 170 are disposed in source/drain contacts 150. Source/drain vias 178 have a height H2 (e.g., along the z-direction), which may be a sum of height H1 and distance d1. In some embodiments, height H2 is about 10 nm to about 30 nm. Further, source/drain vias 178 may have a trapezoidal shape. For example, source/drain vias 178 have tapered sidewalls, source/drain vias 178 have a bottom width (e.g., a width W5 along the x-direction) proximate source/drain contacts 150, and source/drain vias 178 have a top width (e.g., a width W6 along the x-direction) proximate a top surface of ILD layer 162. A width of source/drain vias 178 decreases along the z-direction from the top width to the bottom width. Width W5 is thus less than width W6. In some embodiments, width W5 and width W6 are each less than about 16 nm. In some embodiments, width W5 is equal to width W3, and width W6 is equal to width W4. In some embodiments, a difference between width W5 and width W6 is less than about 2 nm to provide source/drain vias 178 with minimally tapered sidewalls, which may be considered substantially vertical sidewalls, in some embodiments. The present disclosure contemplates source/drain vias 178 having other shapes, such as rectangular shapes where width W5 equals width W6.

In FIG. 2K, a portion A depicts a cross-sectional view of the MOL interconnect structure along a line 1-1. In portion A, source/drain vias 178 may have a trapezoidal shape. For example, source/drain vias 178 have tapered sidewalls, source/drain vias 178 have a bottom width (e.g., a width W7 along the y-direction) proximate source/drain contacts 150, and source/drain vias 178 have a top width (e.g., a width W8 along the y-direction) proximate a top surface of ILD layer 162. A width of source/drain vias 178 decreases along the z-direction from the top width to the bottom width. Width W7 is thus less than width W8. In some embodiments, width W7 and width W8 are each less than about 16 nm. In some embodiments, width W7 is equal to width W5, and width W8 is equal to width W6. In such embodiments, source/drain vias 178 may have a square profile or a circular profile in a top view. In some embodiments, a difference between width W7 and width W8 is less than about 2 nm to provide source/drain vias 178 with minimally tapered sidewalls, which may be considered substantially vertical sidewalls, in some embodiments. The present disclosure contemplates source/drain vias 178 having other shapes, such as rectangular shapes where width W7 equals width W8. In the depicted embodiment, along the y-direction, a width of source/drain vias 178 (e.g., width W7 and/or width W8) is less than a width of source/drain contacts 150, while along the x-direction, the width of source/drain vias 178 is substantially the same as source/drain contacts 150.

Figure 2L:
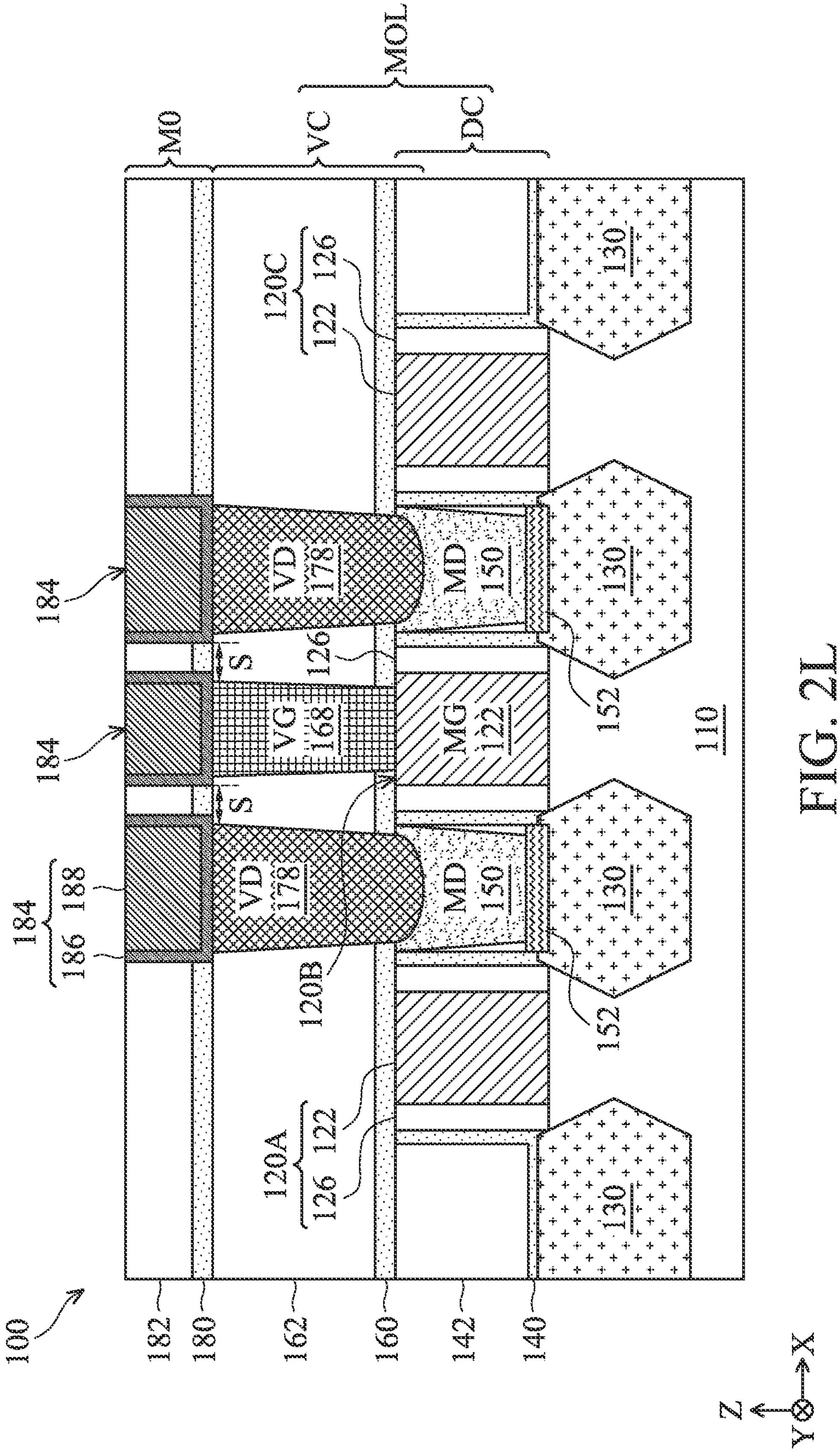

Referring to FIG. 2L, BEOL processing includes forming a first metallization layer, such as a metal zero layer (M0 level) of a multilayer interconnect MLI. M0 level includes an insulator layer (e.g., a dielectric layer, such as a CESL 180 and an ILD layer 182) having a patterned electrically conductive layer (e.g., formed from electrically conductive lines 184, such as metal lines) disposed therein. In the depicted embodiment, M0 level is a bottommost BEOL metallization layer, and electrically conductive lines 184 are physically and/or electrically connected to a respective one of source/drain vias 178 or a respective gate via 168. VC layer connects DC layer and DL layer to M0 level. For example, in FIG. 2L, each source/drain via 178 connects a respective source/drain contact 150 to a respective electrically conductive line 184, and gate via 168 connects a respective gate stack 122 to a respective electrically conductive line 184. In some embodiments, electrically conductive lines 184 electrically connect a first one of epitaxial source/drains 130 to a first voltage, gate stack 122 to a second voltage, and a second one of epitaxial source/drains 130 to a third voltage via VC layer.

ILD layer 182 and CESL 180 may be configured and/or formed similar to ILD layers and CESLs, respectively, described herein. For example, ILD layer 182 includes a dielectric material, such as those described herein, and CESL 180 includes a dielectric material, such as those described herein, that is different than the dielectric material of ILD layer 182. In some embodiments, ILD layer 182 includes a low-k dielectric material (including, for example, silicon and oxygen). In some embodiments, CESL 180 includes silicon and nitrogen and/or carbon (for example, SiN, SiCN, SiCON, SION, SiC, SiCO, or a combination thereof). In some embodiments, CESL 180 includes a metal oxide layer and/or a metal nitride layer.

In contrast to barrier-free source/drain vias 178, barrier-free gate via 168, and barrier-free source/drain contacts 150, electrically conductive lines 184 have sidewall barriers/liners. For example, electrically conductive lines 184 include a respective barrier/liner layer 186 (referred to as liner 186 hereafter) and a respective metal plug 188. Liner 186 is disposed between sidewalls of metal plug 188 and the dielectric layer (e.g., ILD layer 182 and/or CESL 180) and between a bottom of metal plug 188 and an underlying via contact (e.g., a respective source/drain via 178 and/or a respective gate via 186). Liner 186 may wrap metal plug 188, such as depicted. Liner 186 includes a material that promotes adhesion between a surrounding dielectric material (e.g., ILD layer 182 and/or CESL 180) and metal plug 188. The material of liner 186 may prevent diffusion of metal constituents from electrically conductive lines 184 into the surrounding dielectric material. In some embodiments, liner 186 includes titanium, tantalum, cobalt, ruthenium, molybdenum, palladium, alloys thereof, other suitable constituent configured to promote and/or enhance adhesion between a metal material and a dielectric material and/or prevent diffusion of metal constituents from the metal material to the dielectric material, or a combination thereof. For example, liner 186 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or a combination thereof. In some embodiments, liner 186 includes multiple layers. For example, liner 186 may include a first sublayer that includes titanium and a second sublayer that includes titanium nitride. In another example, liner 186 may include a first sublayer that includes tantalum and a second sublayer that includes tantalum nitride. Metal plug 188 includes tungsten, ruthenium, cobalt, molybdenum, copper, aluminum, iridium, palladium, platinum, nickel, low resistivity metal constituent, alloys thereof, or a combination thereof. In the depicted embodiment, metal plug 188 includes a material different than barrier-free molybdenum-containing source/drain vias 178. For example, metal plug 188 includes tungsten, cobalt, copper, or a combination thereof. In some embodiments, metal plug 188 includes multiple layers.

In some embodiments, forming the first metallization layer includes forming a dielectric layer (e.g., CESL 180 and ILD layer 182) over the VC layer (e.g., ILD layer 162, source/drain vias 178, and gate vias 168), performing a patterning process (e.g., a lithography process and an etching process) to form interconnect openings in the dielectric layer that expose source/drain vias 178 and/or gate via 168, depositing at least one electrically conductive material that fills the interconnect openings in the dielectric layer, and performing a planarization process (e.g., CMP) to remove excess of the at least one electrically conductive material, such as that disposed over a top surface of ILD layer 182. The interconnect openings may extend through the dielectric layer, and the interconnect openings may have sidewalls formed by the dielectric layer, and have a bottom formed by a respective via contact. The lithography process may include forming a patterned mask layer over ILD layer 182 that has one or more openings therein that overlap respective via contacts. The etching process may include transferring a pattern in the patterned mask layer to the dielectric layer, for example, by removing portions of ILD layer 182 and/or CESL 180 exposed by the one or more openings in the patterned mask layer. The etching process is a dry etch, a wet etch, other suitable etching process, or a combination thereof. The etching process selectively removes the dielectric layer (i.e., dielectric material(s)) with respect to source/drain vias 178 and/or gate via 168 (e.g., metal material(s)). In some embodiments, the etching process removes the patterned mask layer, in portion or entirety, from over the dielectric layer. In some embodiments, after the etching process, the patterned mask layer is removed from over ILD layer 182, for example, by an etching process and/or a resist stripping process.

In some embodiments, depositing the at least one electrically conductive material that fills the interconnect openings in the dielectric layer includes performing a first deposition process to form a barrier/liner material over ILD layer 282 that partially fills the interconnect openings and performing a second deposition process to form a metal bulk material over the barrier/liner material, where the metal bulk material fills remainders of the interconnect openings. In such embodiments, the barrier/liner material and the metal bulk material are disposed in the interconnect openings and over a top surface of ILD layer 182. The first deposition process and the second deposition process may be CVD, PVD, ALD, HDPCVD, MOCVD, RPCVD, PECVD, LPCVD, ALCVD, APCVD, PEALD, electroplating, electroless plating, other suitable deposition methods, or a combination thereof. In some embodiments, liner 186 has a substantially uniform thickness along sidewalls and bottom of the interconnect openings. Liner 186 may thus be formed by a conformal deposition process. A CMP process and/or other planarization process is then performed to remove excess metal bulk material and barrier/liner material, for example, from over ILD layer 182. In some embodiments, after the planarization process, the top surface of ILD layer 182 and top surfaces of electrically conductive lines 184 may form a substantially planar surface.

As CDs of via contacts (e.g., source/drain vias and gate vias) and device contacts (e.g., source/drain contacts) shrink for advanced IC technology nodes (e.g., to less than about 16 nm), barriers/liners will consume more volume thereof, which reduces a volume of low resistance material plugs thereof and correspondingly increases contact resistance. Incorporating barriers/liners into via contacts and device contacts may also lead to poor metal gap filling, such as where a metal bulk/plug material is unable to fill an interconnect opening without forming seams/voids therein, which may also undesirably increase contact resistance. To address these challenges, the disclosed MOL interconnect structures eliminate sidewall barriers/liners in both via contacts and device contacts, which maximizes a volume of metal plugs thereof (e.g., tungsten plugs, molybdenum plugs, or a combination thereof) and correspondingly reduces contact resistance. Further, source/drain vias (and/or gate vias) of the MOL interconnect structures have molybdenum plugs as described herein, which provide molybdenum-tungsten interfaces or molybdenum-molybdenum interfaces between the source/drain vias and the source/drain contacts (and/or gate stacks), which may exhibit lower contact resistance than a contact resistance exhibited by tungsten-tungsten interfaces formed between source/drain vias and source/drain contacts having tungsten plugs. Further, because molybdenum may seamlessly, uniformly, and selectively grow well from tungsten and/or metal gate stacks, the disclosed MOL interconnect structures have barrier-free, seamless molybdenum-containing source/drain vias (and, in some embodiments, barrier-free, seamless molybdenum-containing gate vias) that may reduce contact resistance. The ability to grow molybdenum seamlessly and selectively from tungsten also enables source/drain vias with more vertical profiles, which increases a lateral spacing between source/drain vias and overlying M0 lines (e.g., a spacing S (also referred to as line-via or M0-VC spacing) along the x-direction between source/drain vias 178 and overlying electrically conductive lines 184). Increasing the lateral spacing reduces risks of electrical shorting between via contacts and M0 lines, such as where overlay shift results in unintentional exposure of a via contact when forming an M0 line adjacent to the via contact but not intended to be connected thereto, and/or reduces parasitic resistance therebetween. Different embodiments may have different advantages, and no particular advantage is required of any embodiment.

Figure 2M:
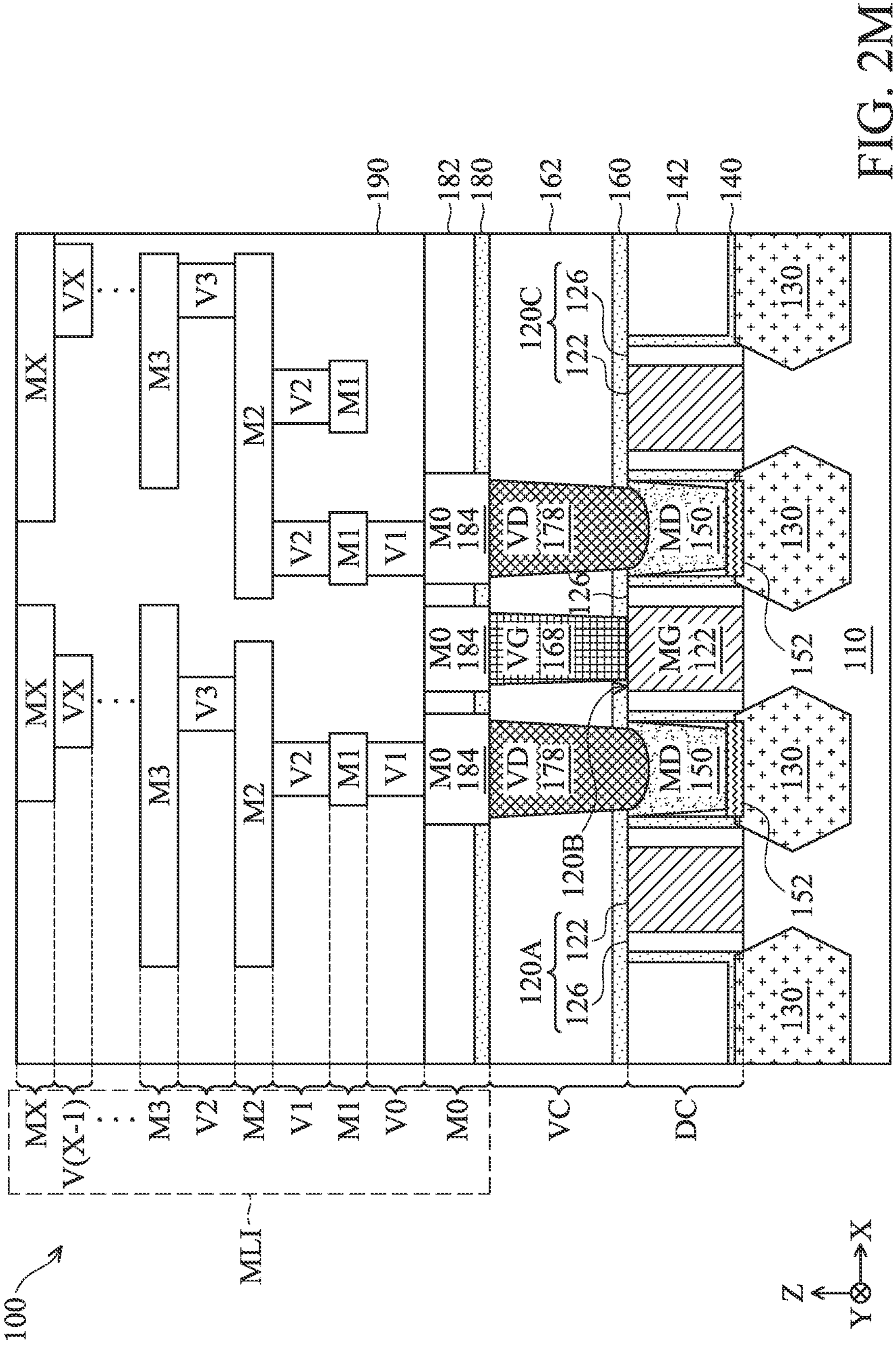

Referring to FIG. 2M, BEOL processing may continue with forming additional metallization layers (levels) of multilayer interconnect MLI over the first metallization layer. For example, BEOL processing includes forming a second metallization layer (i.e., a metal one layer (M1 level) and a via one layer (V1 level)), a third metallization layer (i.e., a metal two layer (M2 level) and a via two layer (V2 level)), a fourth metallization layer (i.e., a metal three layer (M3 level) and a via three layer (V3 level)), and so on to a topmost metallization layer (i.e., a metal X layer (MX level) and a via X layer (VX level)). X is an integer greater than or equal to 1. Each level of multilayer interconnect MLI includes a respective patterned electrically conductive layer (e.g., conductive lines, conductive vias, conductive contacts, or a combination thereof) disposed in a respective insulation layer (e.g., an ILD layer and/or a CESL). For example, V1 level includes a portion of an insulation layer 190 having V1 vias disposed therein, M1 level includes a portion of insulation layer 190 having M1 lines disposed therein, V2 level includes a portion of insulation layer 190 having V2 vias disposed therein, M2 level includes a portion of insulation layer 190 having M2 lines disposed therein, V3 level includes a portion of insulation layer 190 having V3 vias disposed therein, M3 level includes a portion of insulation layer 190 having M3 lines disposed therein, VX level includes a portion of insulation layer 190 having VX vias disposed therein, and MX level includes a portion of insulation layer 190 having MX lines disposed therein. V1 vias connect M0 lines to M1 lines, V2 vias connect M1 lines to M2 lines, V3 vias connect M2 lines to M3 lines, and VX vias connect M(X-1) lines to MX lines. Each portion of insulation layer 190 may include at least one ILD layer and at least one CESL similar to the ILD layers and the CESLs, respectively, described herein. It is noted that though multilayer interconnect MLI is depicted with a given number of metallization layers disposed within a given number of dielectric layers, the present disclosure contemplates multilayer interconnect MLI having more or less conductive line layers, via layers, and dielectric layers depending on design requirements of device 100. In some embodiments, multilayer interconnect MLI has seven to fourteen metallization layers (e.g., M0 to M14 and V1 to V14).

M1-MX lines and V1-VX vias can be referred to as BEOL lines and BEOL vias, respectively. BEOL lines and BEOL vias are formed by any suitable process and include any suitable materials, layers, configurations, etc. In some embodiments, BEOL interconnect structures, such as a metal line and a metal via of a given metallization level (e.g., an M1 interconnect structure may include a respective V1 via and a respective M1 line connected thereto) may be formed by a dual damascene process, which involves depositing materials for the metal via and the metal line at the same time. In such embodiments, the metal via and the metal line may share a liner and a metal plug, instead of each having a respective and distinct liner and metal plug (e.g., where a contact barrier layer of metal line 264 would separate a metal plug of metal line 264 from a via plug of via 262). In some embodiments, the dual damascene process includes performing a patterning process to form an interconnect opening that extends through a dielectric layer to expose an underlying BEOL interconnect structure (e.g., a metal line thereof). The patterning process can include a first lithography step and a first etch step to form a trench opening of the interconnect opening (which corresponds with the metal line) in the dielectric layer, a second lithography step and a second etch step to form a via opening of the interconnect opening (which corresponds with the metal via) in the dielectric layer, and in some embodiments, a third etch step to remove a portion of the dielectric layer to expose the underlying BEOL interconnect structure. The first lithography/first etch step and the second lithography/second etch step may be performed in any order (e.g., trench first via last or via first trench last). In some embodiments, the first etch step and the second etch step are each configured to selectively remove an ILD layer with respect to a patterned mask layer and CESL, while the third etch step is configured to selectively remove the CESL with respect to the ILD and underlying BEOL interconnect structure. After performing the patterning process, the dual damascene process may include performing a first deposition process to form a barrier/liner material that partially fills the interconnect opening, performing a second deposition process to form a metal bulk material over the barrier/liner material, where the metal bulk material fills a remainder of the interconnect opening, and performing a planarization process to remove excess metal bulk material and barrier/liner material. The barrier/liner material and the metal bulk material fill the trench opening and the via opening of the interconnect opening without interruption, such that the liner and metal plug each extend continuously from metal line to via without interruption (i.e., a liner and metal plug form both a V1 via and an M1 line).

Multilayer interconnect MLI electrically connects devices of device layer DL (e.g., transistor T), components of device layer DL, devices (e.g., a memory device) within multilayer interconnect MLI, components of multilayer interconnect MLI, or a combination thereof to one another and/or to external devices/components, such that the various devices and/or components can operate as needed. Multilayer interconnect MLI includes a combination of insulation layers and electrically conductive layers (e.g., patterned metal layers formed by conductive lines, conductive vias, conductive contacts, or a combination thereof) arranged to form interconnect/routing structures. The conductive layers form vertical interconnect structures, such as device-level contacts, via contacts, and vias, that connect horizontal interconnect structures, such as conductive lines, in different layers/levels (or different planes) of multilayer interconnect MLI. In some embodiments, the interconnect structures route electrical signals between devices and/or components of device layer DL and/or multilayer interconnect MLI. In some embodiments, the interconnect structures route electrical signals to and/or from the devices and/or the device components of device layer DL and/or multilayer interconnect MLI. During operation of device 100, the DC layer, the VC layer, the first metallization layer (e.g., M0 level), other metallization layers of multilayer interconnect MLI, or a combination thereof can route signals between the devices and/or the components thereof and/or distribute signals (e.g., clock signals, voltage signals, ground signals, other signals, or a combination thereof) to/from the devices, the components of the devices, external devices, or a combination thereof. In some embodiments, the DC layer and/or the VC layer form a portion of multilayer interconnect MLI.

Figure 3:
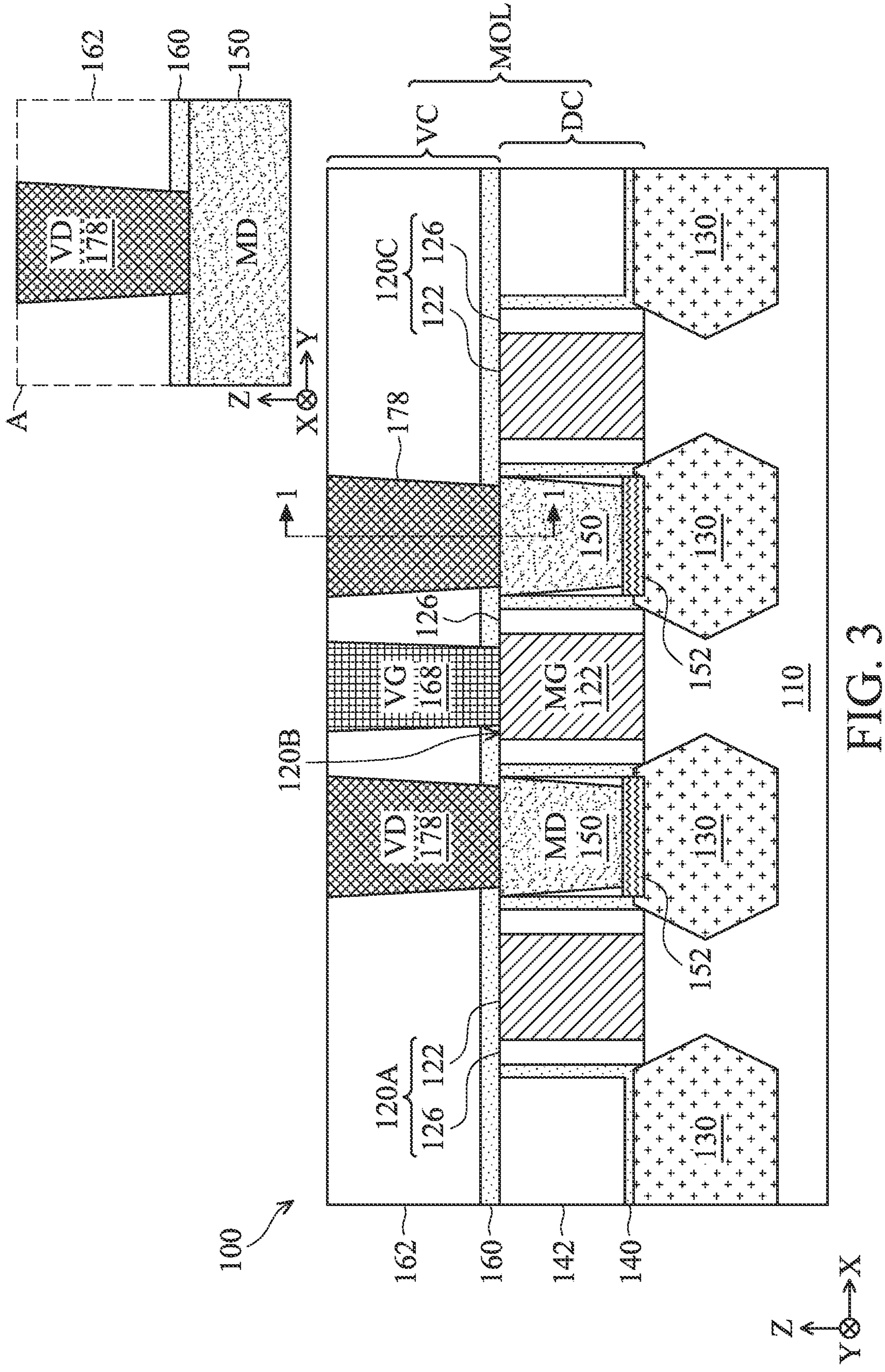
FIG. 3 and FIG. 4 are cross-sectional views of MOL interconnect structures, in portion or entirety, that may be fabricated by the methods in FIG. 1A, FIG. 1B, FIGS. 2A-2M, or a combination thereof according to various aspects of the present disclosure.
Figure 4:
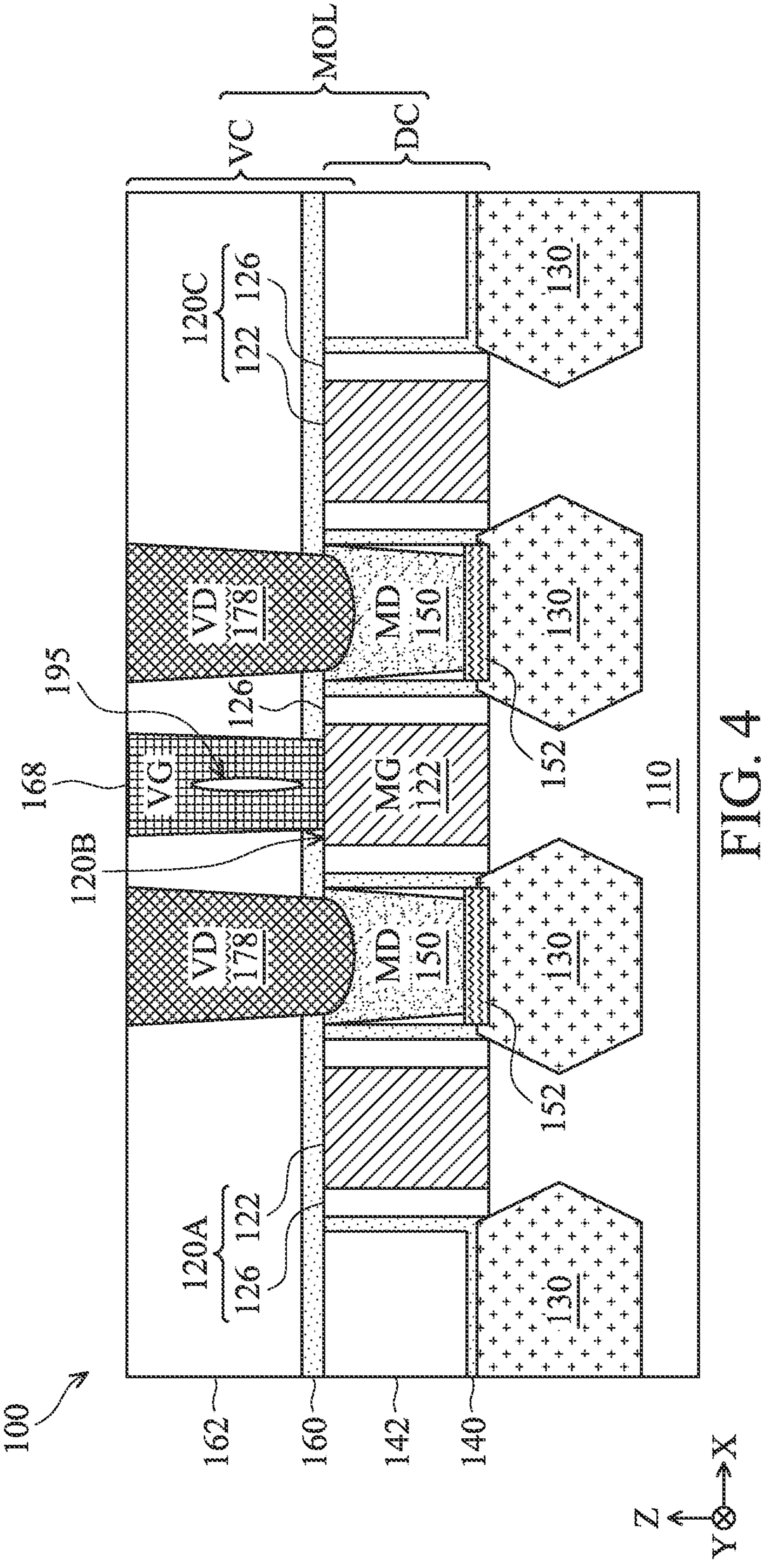

In FIGS. 2A-2M, device 100 includes an MOL interconnect structure having barrier-free, seam-free molybdenum-containing source/drain vias 178, barrier-free, seam-free tungsten-containing gate vias 168, and barrier-free, seam-free tungsten-containing source/drain contacts 150, and processing is configured to provide barrier-free tungsten-containing source/drain contacts 150 having dished, recessed top surfaces, such that barrier-free molybdenum-containing source/drain vias 178 extend into barrier-free tungsten-containing source/drain contacts 150 and below top surface of ILD layer 142. In some embodiments, processing associated with recessing barrier-free tungsten-containing source/drain contacts 150 and described with reference to FIG. 2G is omitted when forming the MOL interconnect structure, and processing associated with FIGS. 2H-2K is performed after forming source/drain via openings 170 in FIG. 2F. In such embodiments, the MOL interconnect structure of device 100 has barrier-free molybdenum-containing source/drain vias 178 that do not extend below top surface of ILD layer 142 and/or top surfaces of gate stacks 122, such as depicted in FIG. 3. In such embodiments, barrier-free molybdenum-containing source/drain vias 178 have height H1, and a cleaning process may be performed, such as described with reference to FIG. 2G, before performing the bottom-up deposition process of FIGS. 2H-2K. In some embodiments, seams (e.g., voids) may form within the via contacts and/or the source/drain contacts, such as depicted in FIG. 4. In FIG. 4, barrier-free tungsten-containing gate via 168 of the MOL interconnect structure of device 100 has a seam 195 therein that extends lengthwise along a height thereof.

In some embodiments, both source/drain vias and gate vias may be barrier-free, seam-free molybdenum-containing plugs (i.e., MOL interconnect structure has a molybdenum VC layer). For example, FIGS. 5A-5I are fragmentary diagrammatic views of a device 200, in portion or entirety, at various stages of fabricating an MOL interconnect structure thereof (such as those associated with method 10 in FIG. 1A and method 30 in FIG. 1B), according to various aspects of the present disclosure. A VC layer of device 200 is fabricated to have barrier-free, seam-free molybdenum-containing source/drain vias and barrier-free, seam-free molybdenum-containing gate vias. Device 200 is similar in many respects to device 100 and is fabricated in a similar manner as device 100, such as in the manner described in FIGS. 2A-2M. Accordingly, similar features in FIGS. 5A-5I and FIGS. 2A-2M are identified by the same reference numerals for clarity and simplicity. Device 200 may be included in a microprocessor, a memory, other IC device, or a combination thereof. In some embodiments, device 200 is a portion of an IC chip, an SoC, or portion thereof, that includes various passive and active electronic devices such as resistors, capacitors, inductors, diodes, PFETs, NFETs, MOSFETs, CMOS transistors, BJTs, LDMOS transistors, high voltage transistors, high frequency transistors, other suitable components, or a combination thereof. The various transistors may be planar transistors or non-planar transistors, such as FinFETs or GAA transistors. FIGS. 5A-5I have been simplified for the sake of clarity to better understand the inventive concepts of the present disclosure.

Additional features can be added in device 200, and some of the features described below can be replaced, modified, or eliminated in other embodiments of device 200.

Figure 5A:
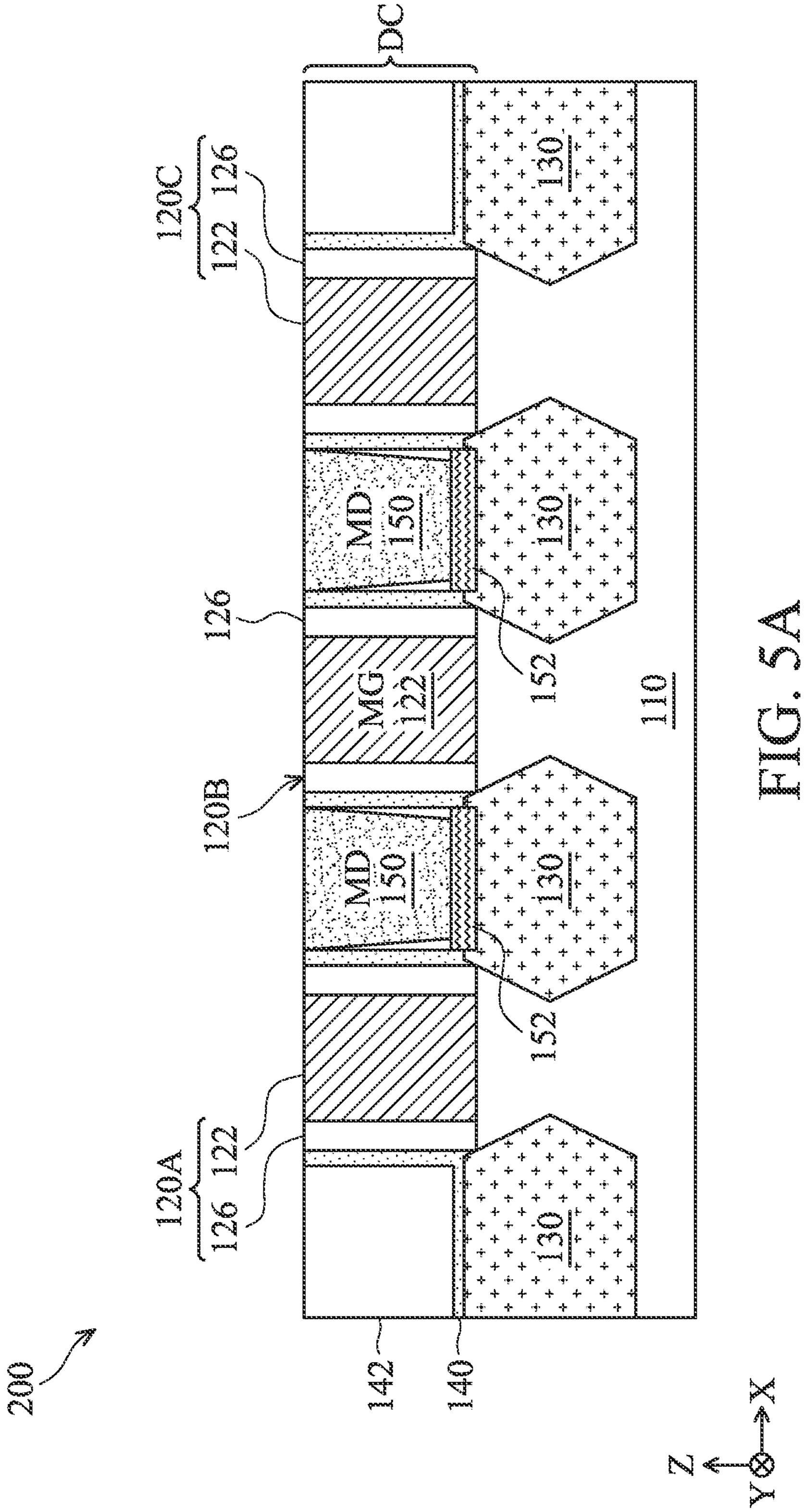
FIGS. 5A-5I are cross-sectional views of another MOL interconnect structure, in portion or entirety, at various stages of fabrication (such as those associated with the method in FIG. 1A and the method in FIG. 1B), according to various aspects of the present disclosure.
Figure 5B:
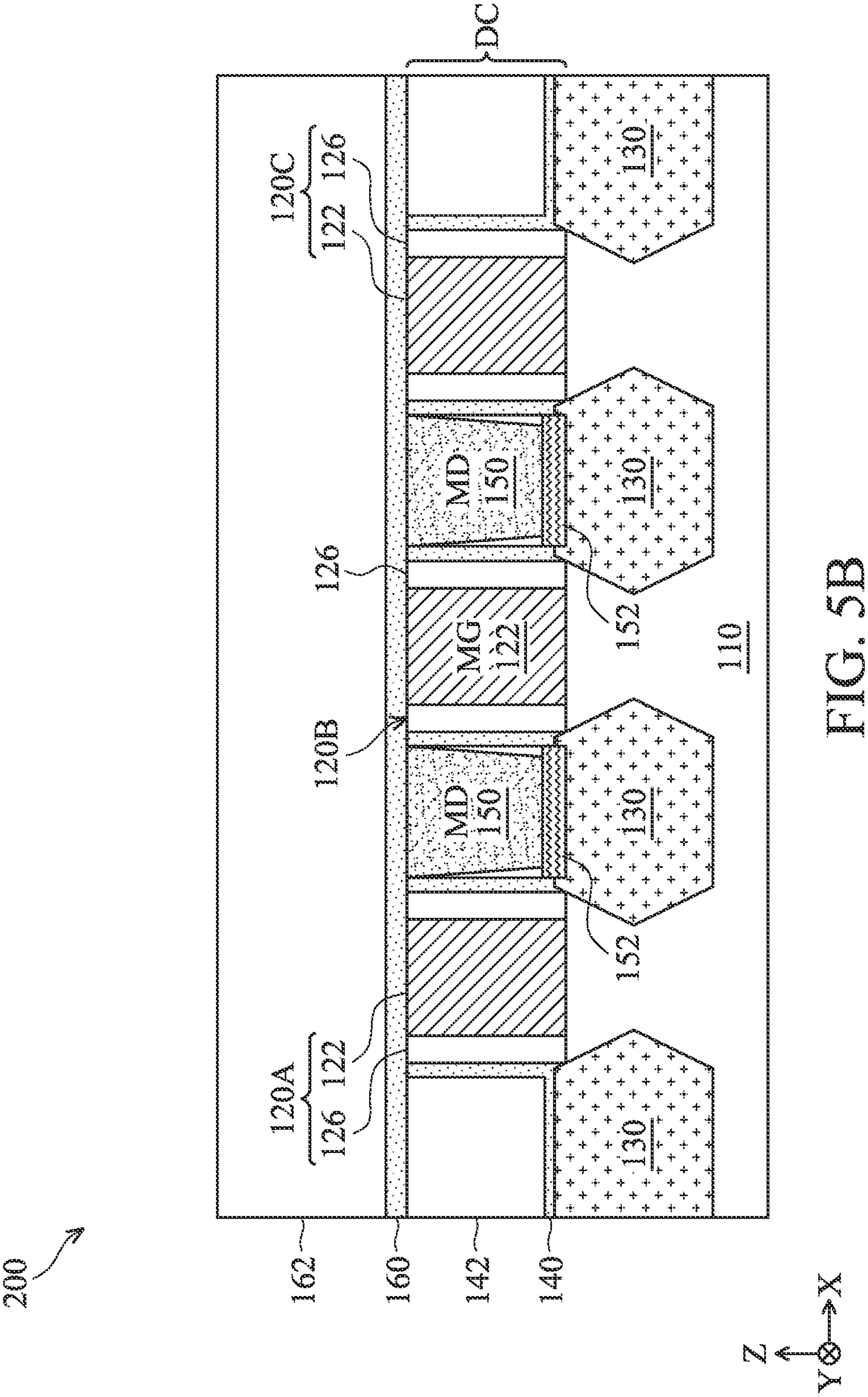
Figure 5C:
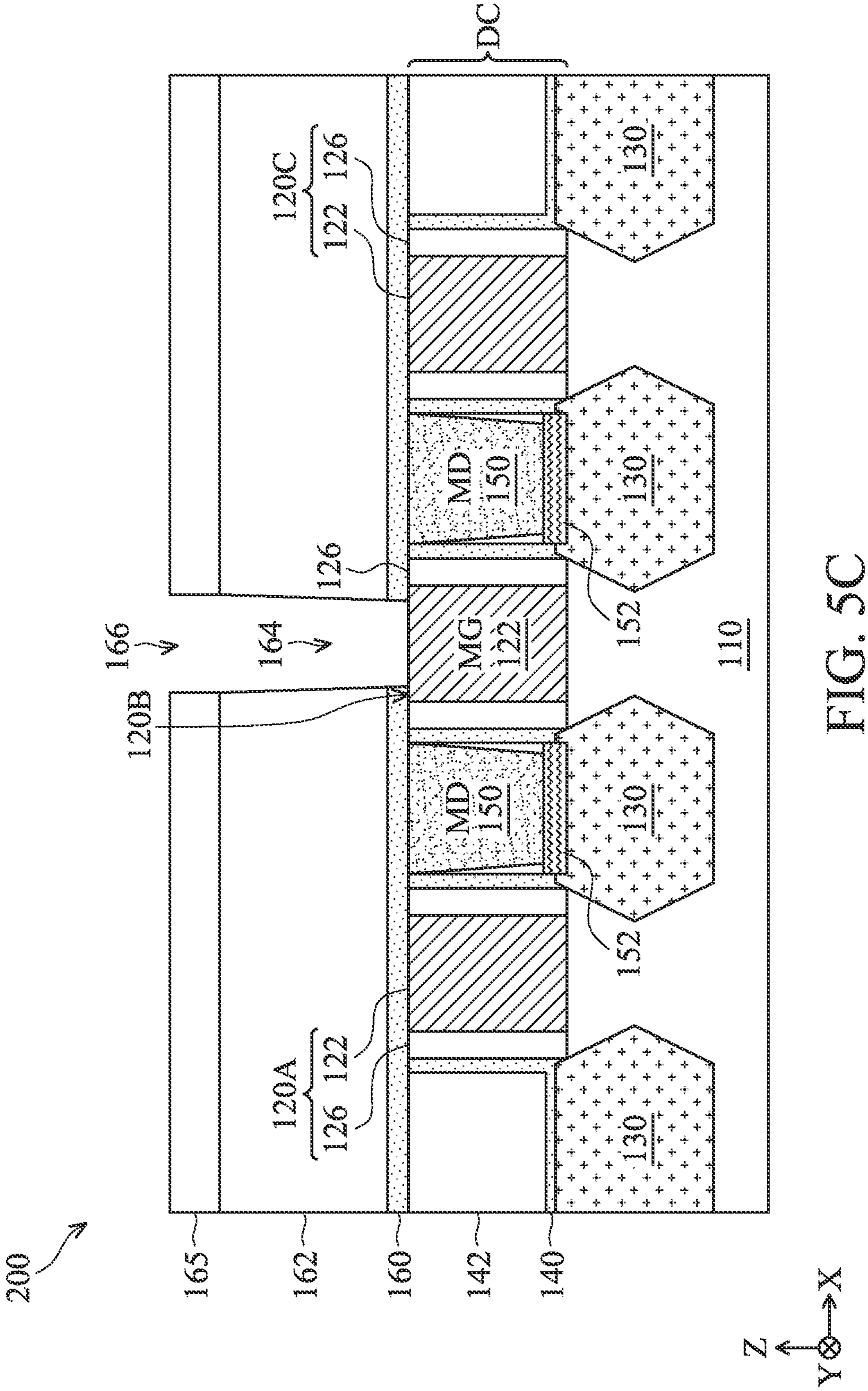
Figure 5D:
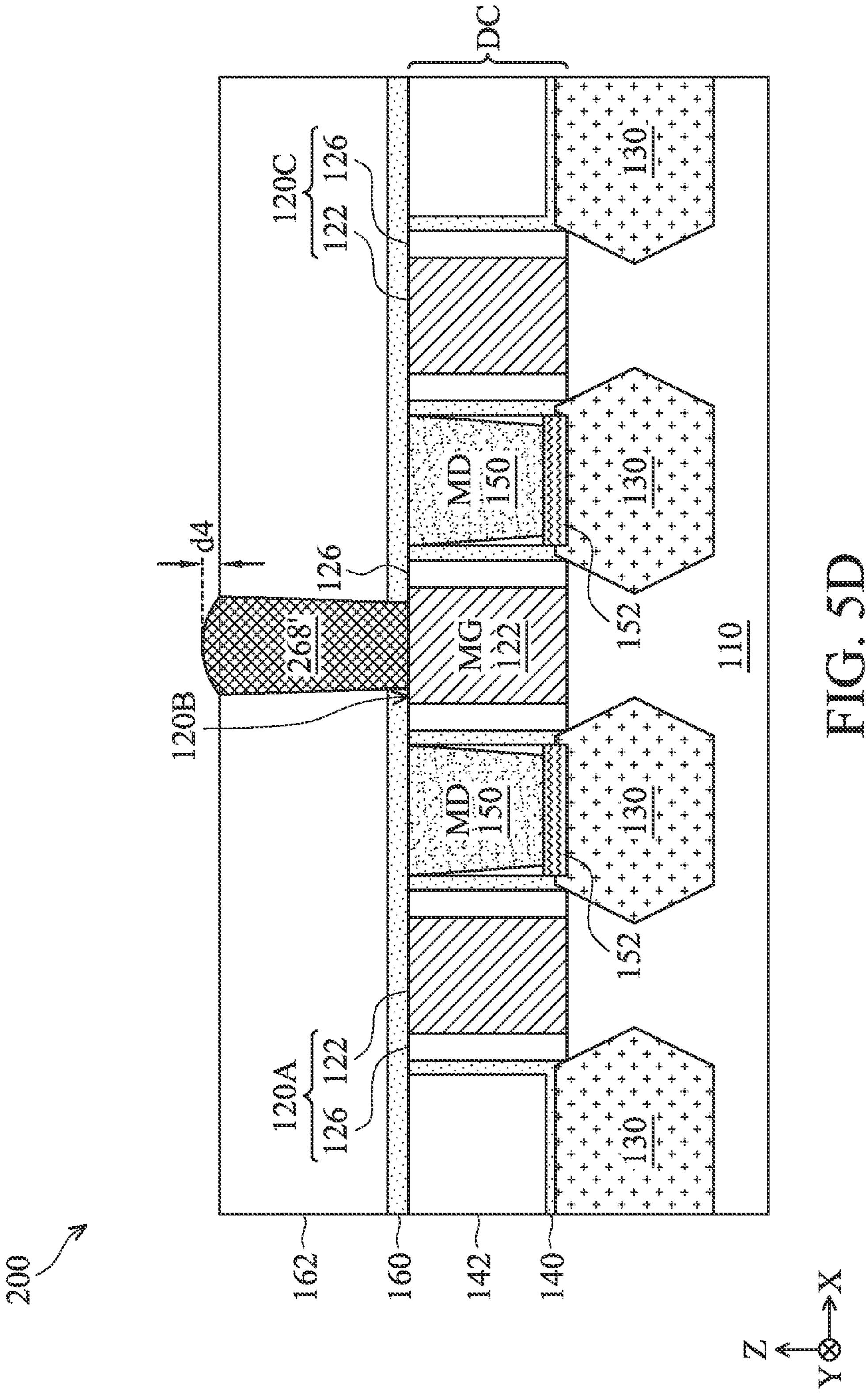
Figure 5E:
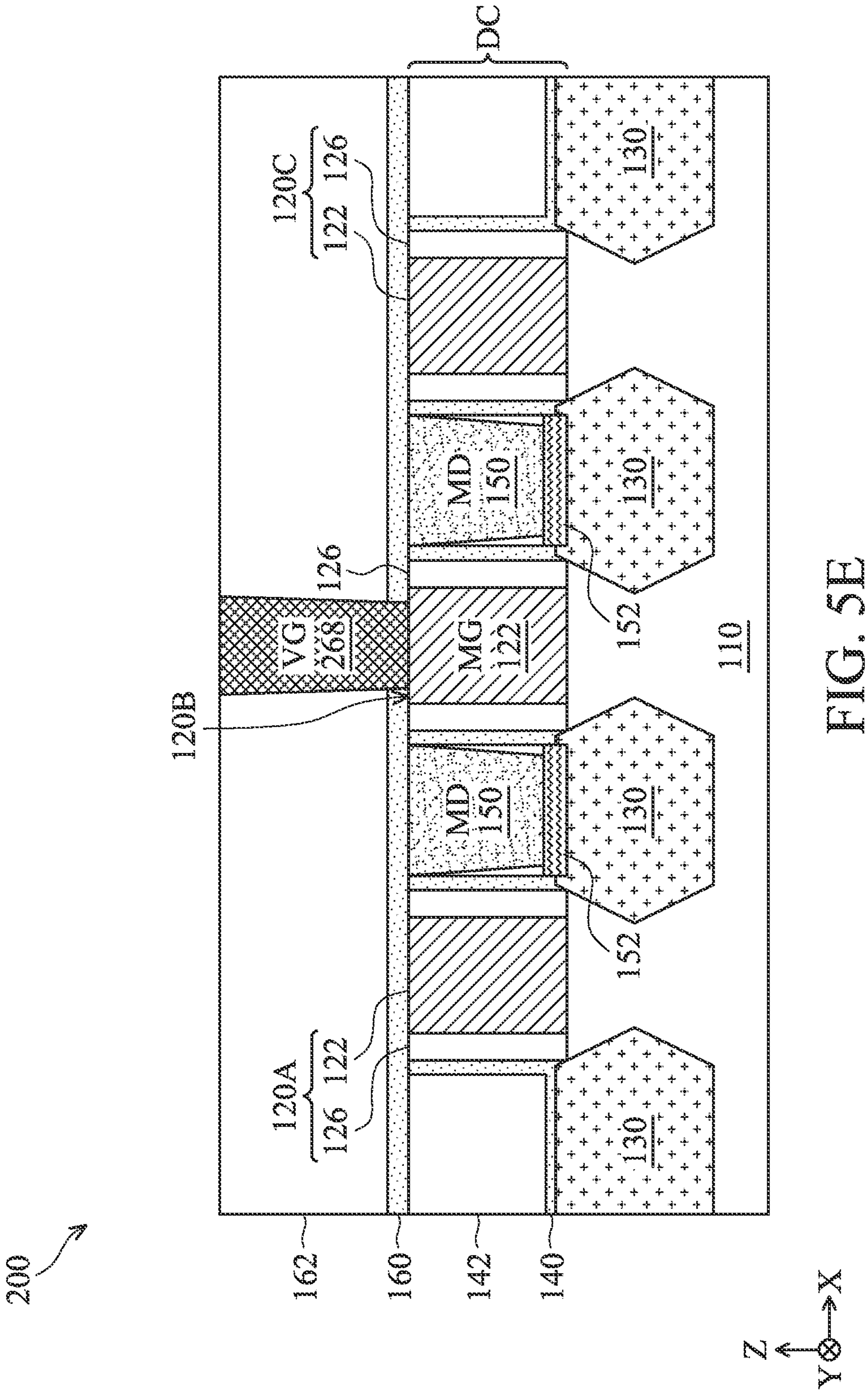
Figure 5F:
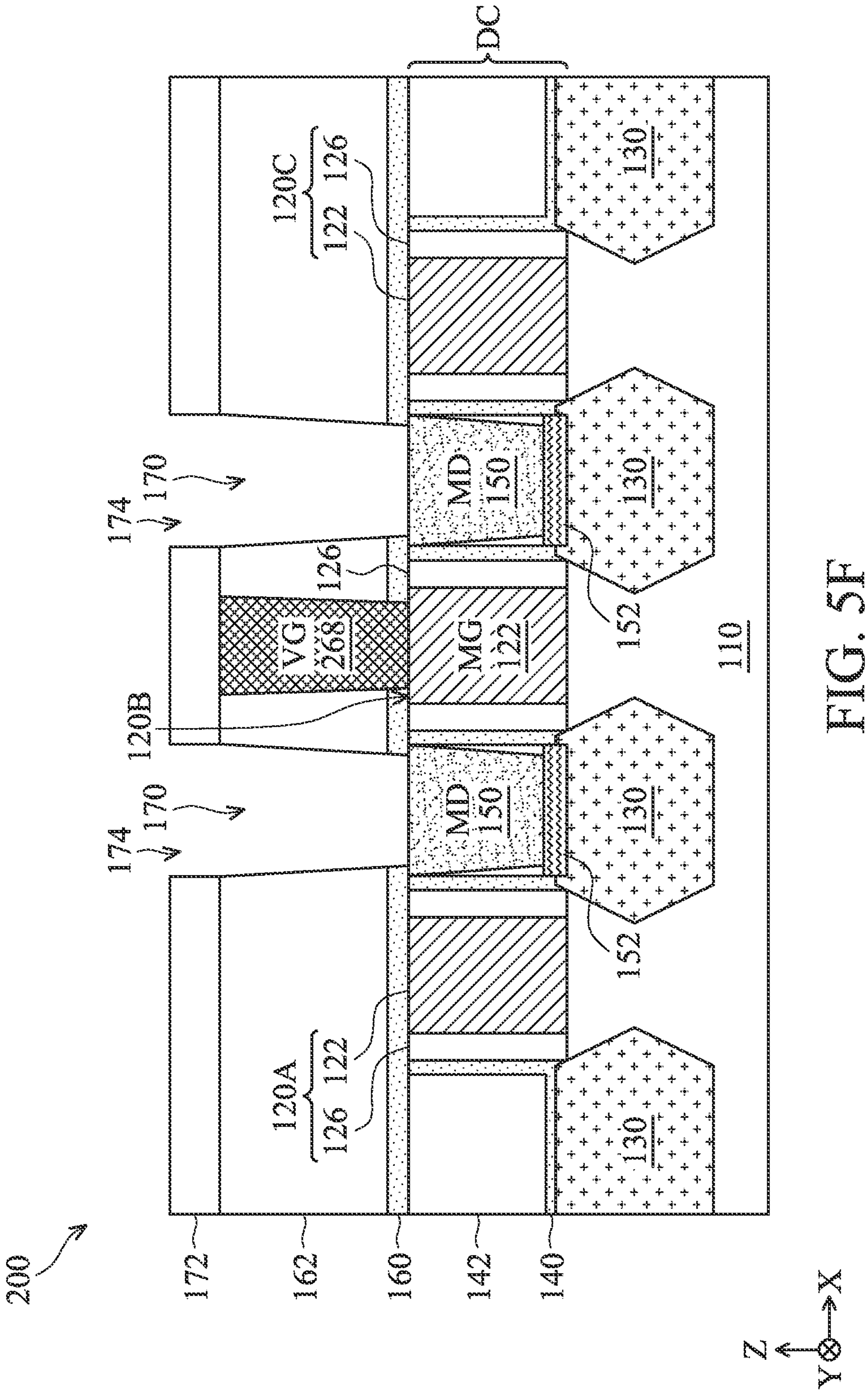
Figure 5G:
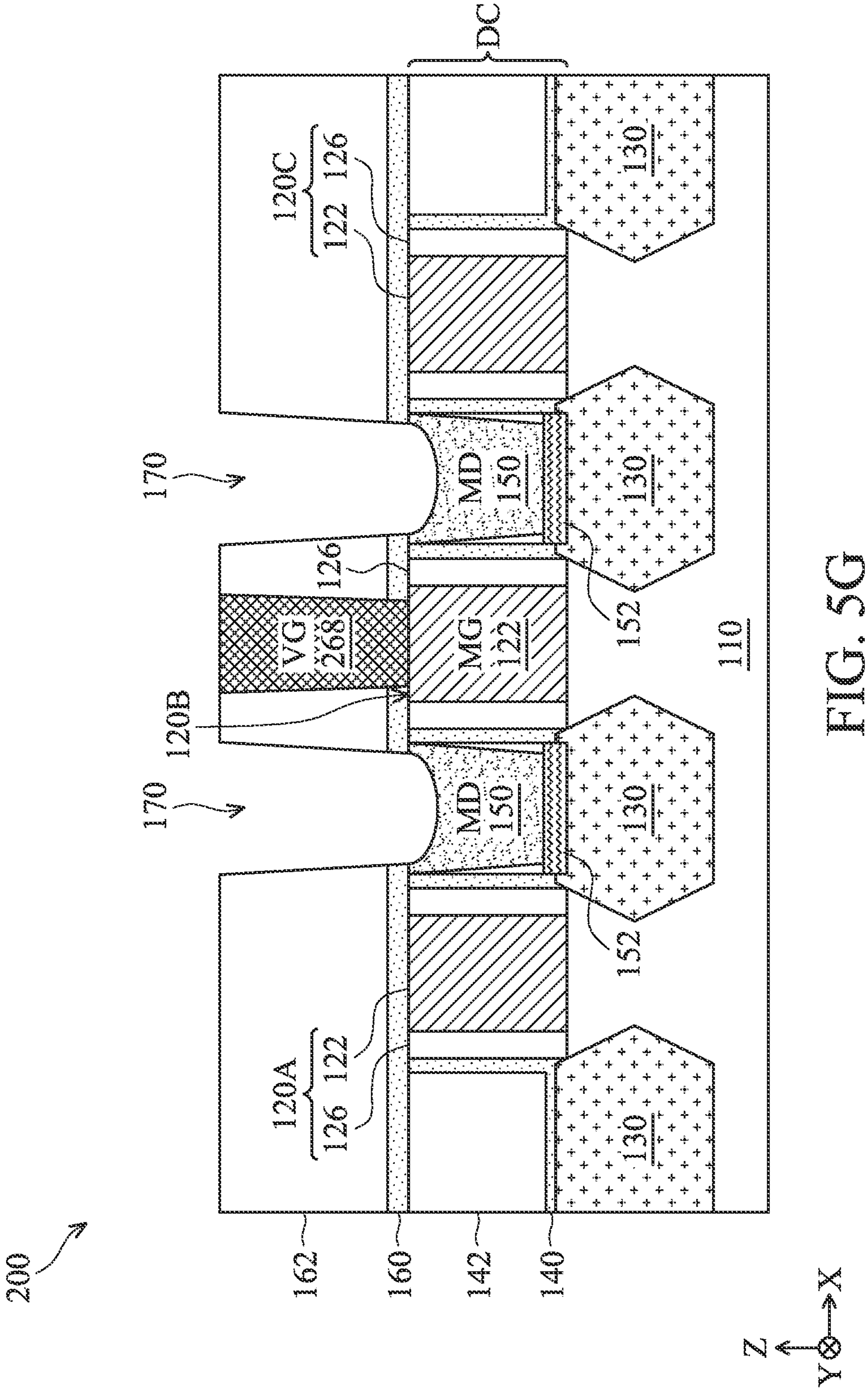
Figure 5H:
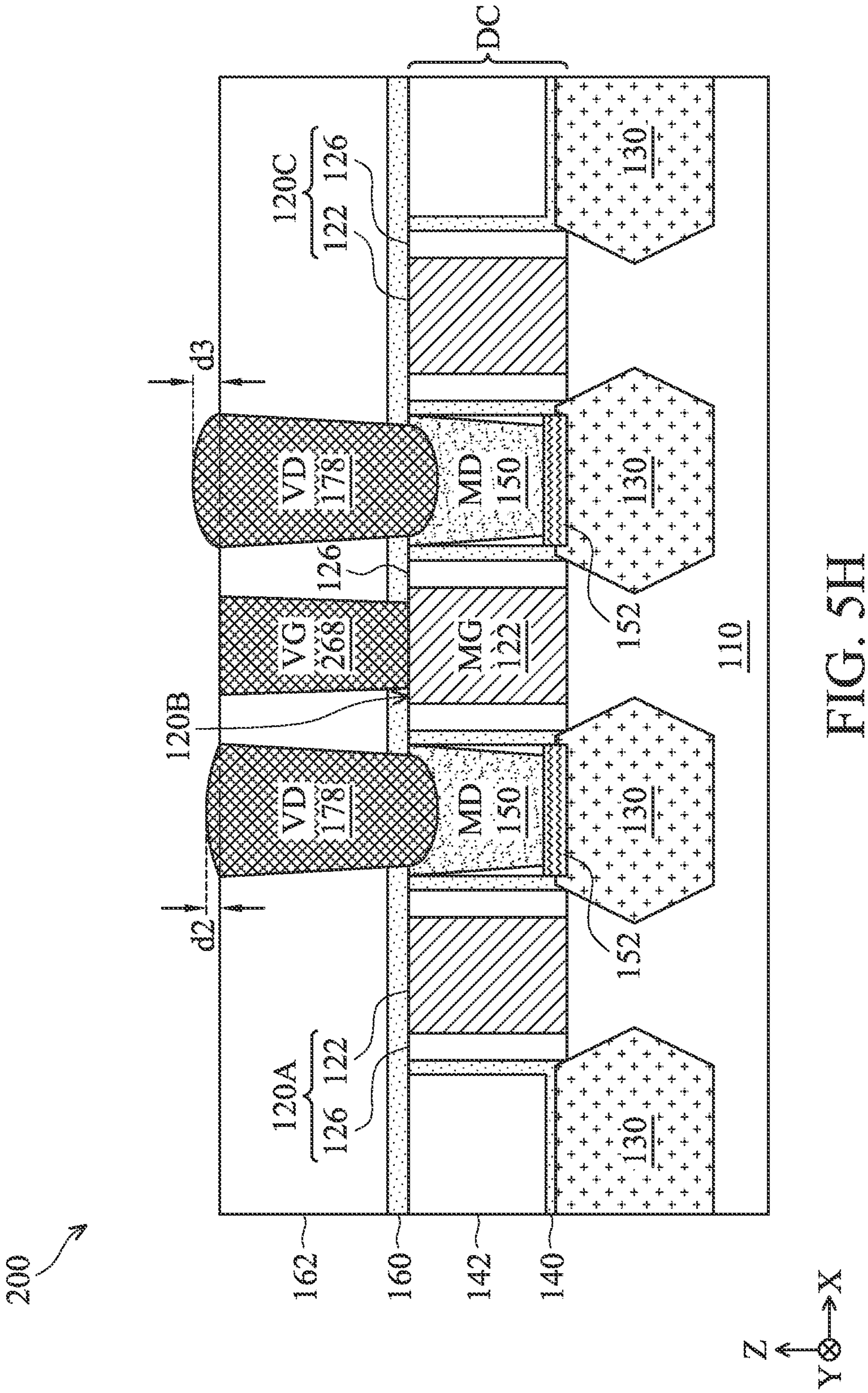
Figure 5I:
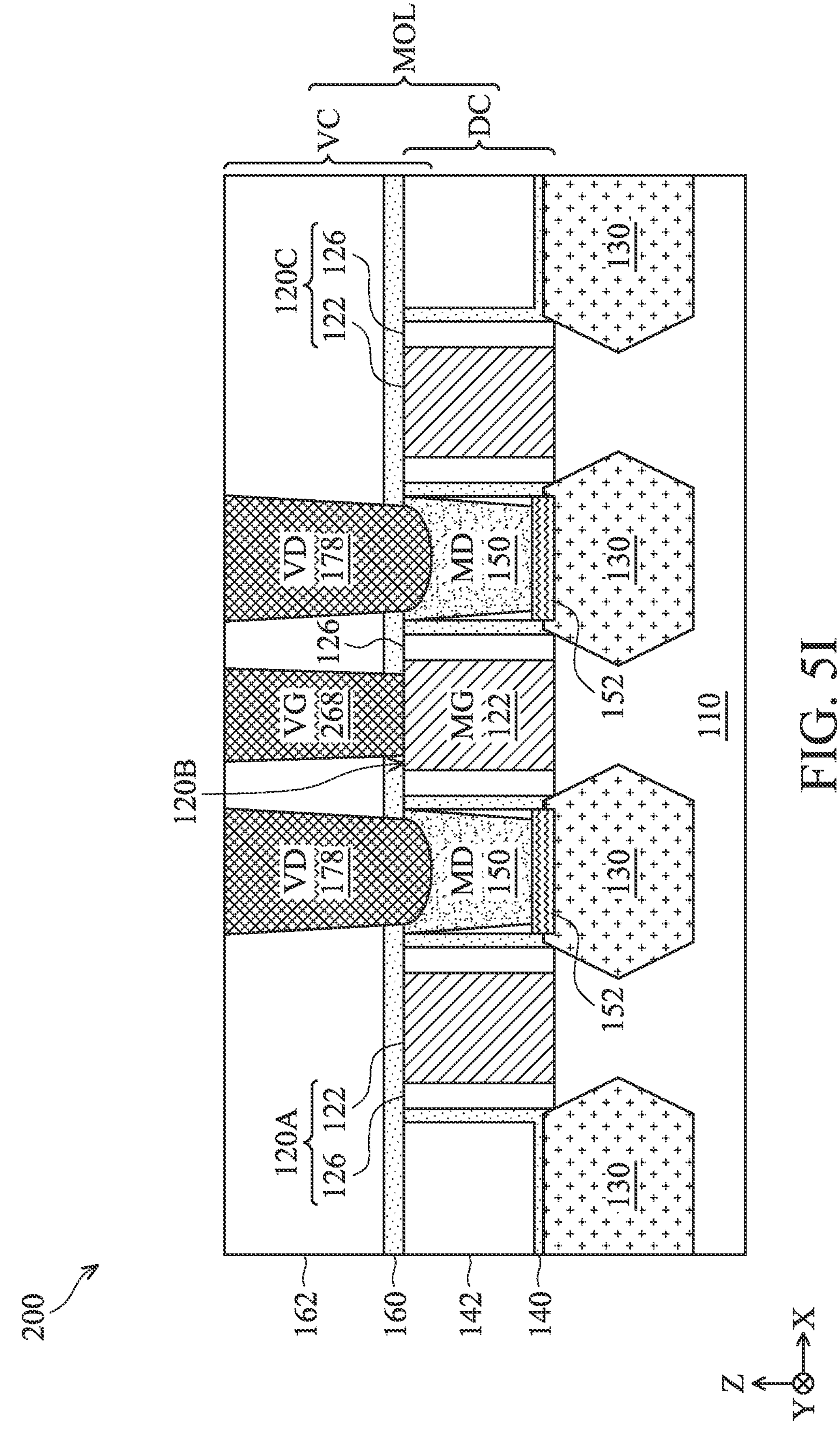

In FIGS. 5A-5C, device 200 undergoes FEOL processing, MOL processing associated with forming barrier-free, seam-free tungsten-containing source/drain contacts 150, and MOL processing associated with forming gate via opening 164, such as described above with reference to FIGS. 2A-2D. In FIG. 5D and FIG. 5E, MOL processing includes forming a barrier-free, seam-free molybdenum-containing gate via 268. For example, MOL processing includes performing a bottom-up deposition process to form a via molybdenum bulk material 268' that fills gate via opening 164 (FIG. 5D) from bottom to top and performing a planarization process (FIG. 5E) on via molybdenum bulk material 268', which may remove portions of via molybdenum bulk material 268' disposed over a top surface of ILD layer 162. A remainder of via molybdenum bulk material 268' fills gate via opening 164 and provides barrier-free molybdenum-containing gate via 268 (FIG. 5E). In some embodiments, gate stack 122 may have a gate cap, such as a tungsten gate cap. In such example, in some embodiments, gate via 268 may be deposited on/grown from a gate cap surface that includes tungsten alone or tungsten in combination with nitrogen and/or carbon. In some embodiments, gate stack 122 may be free of the gate cap. For example, gate stack 122 may include a gate dielectric and a gate electrode, and gate via 268 may be deposited on/grown from the gate electrode (e.g., a top surface thereof, which may be formed by a work function layer and/or a bulk layer). In such example, gate via 268 may be deposited on/grown from a gate electrode surface, instead of a gate cap surface, that includes titanium, tantalum, aluminum, tungsten, nitrogen, carbon, oxygen, silicon, or a combination thereof. In such example, the gate dielectric may wrap the gate electrode.

The bottom-up deposition process, such as selective CVD or selective ALD, may include flowing a molybdenum-containing precursor (e.g., $MoCl_x$ and/or other suitable molybdenum-containing precursor), a reactant precursor (e.g., $H_2$ and/or other suitable reactant gas), and a carrier gas into a process chamber and tuning deposition parameters to selectively grow via molybdenum bulk material 268' from gate stack 122, metal seed layers, bottom metal liner(s) formed before the metal bulk material, or a combination thereof while limiting growth of the metal bulk material from dielectric materials (e.g., ILD layer 162 and/or CESL 160). The bottom-up deposition process is performed until via molybdenum bulk material 268' fills gate via opening 164 and extends from gate stack 122 to at least the top surface of ILD layer 162. In the depicted embodiment, via bulk molybdenum material 268' extends beyond the top surface of ILD layer 162, such that via bulk molybdenum material 268' protrudes from ILD layer 162. Via bulk molybdenum material 268' deposited on/grown from gate stack 122 extends a distance d4 above ILD layer 162. In some embodiments, distance d4 is less than about 8 nm (i.e., distance $d4 \leq 8$ nm). In the depicted embodiment, gate vias 268 does not protrude from the top surface of ILD layer 162 after planarization, and the top surface of ILD layer 162 and the top surface of gate via 268 may form a substantially planar surface.

Figure 6:
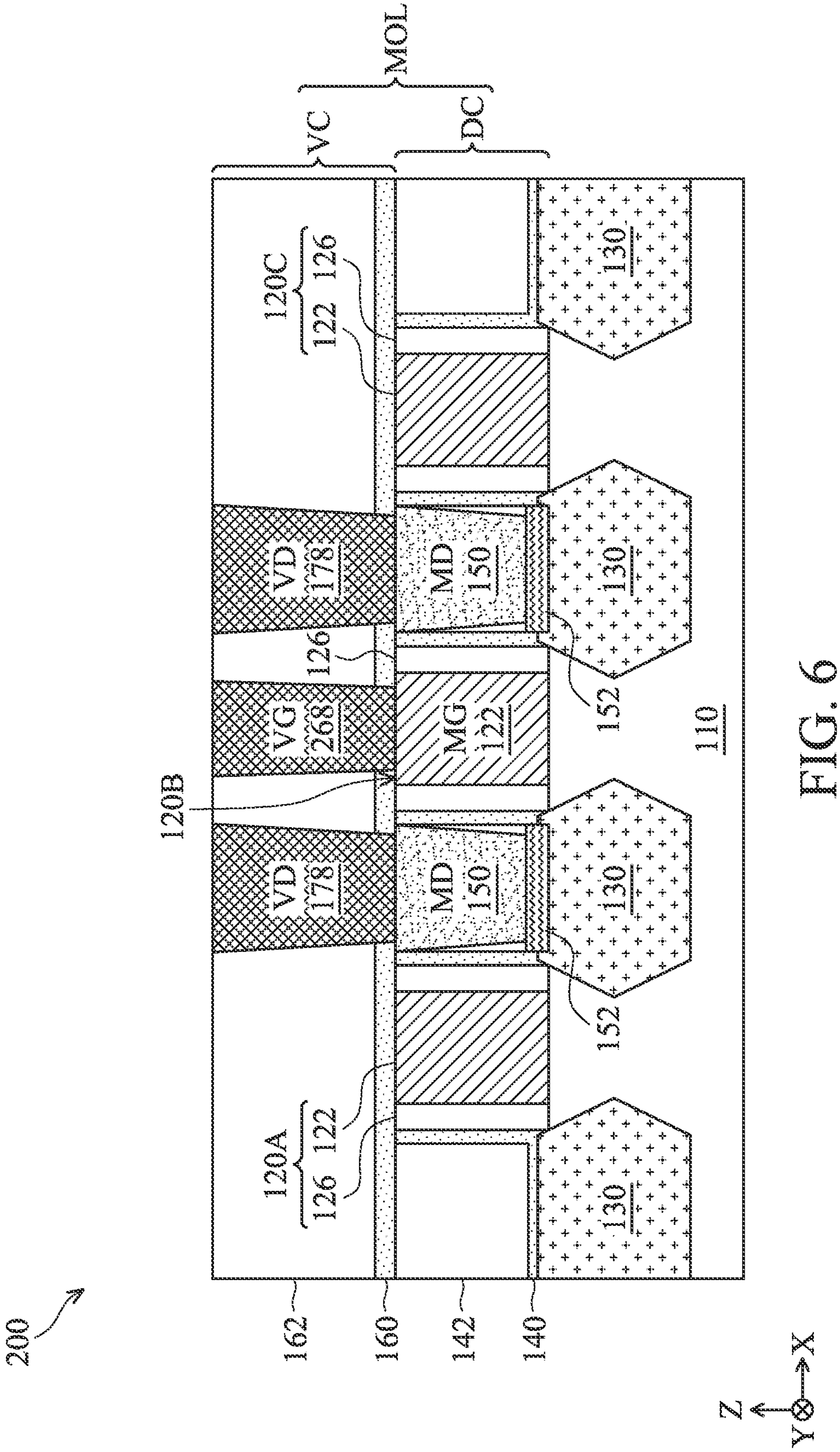
FIG. 6 is a cross-sectional view of an MOL interconnect structure, in portion or entirety, that may be fabricated by the methods in FIG. 1A, FIG. 1B, FIGS. 5A-5I, or a combination thereof according to various aspects of the present disclosure.

In FIGS. 5F-51, MOL processing may form barrier-free, seam-free molybdenum-containing source/drain vias 178 as described above with reference to FIGS. 2F-2K. Device 200 thus includes an MOL interconnect structure having a molybdenum VC layer (i.e., barrier-free molybdenum-containing source/drain vias 178 and barrier-free molybdenum-containing gate vias 268) and a tungsten DC layer (i.e., barrier-free tungsten-containing source/drain contacts 150), and source/drain vias 178, gate vias 268, and source/drain contacts 150 are seamless. In some embodiments, processing associated with recessing barrier-free tungsten-containing source/drain contacts 150 and described with reference to FIG. 2G is omitted when forming the MOL interconnect structure of device 200, the MOL interconnect structure of device 200 has barrier-free molybdenum-containing source/drain vias 178 that do not extend below top surface of ILD layer 142 and/or top surfaces of gate stacks 122, such as depicted in FIG. 6. In such embodiments, barrier-free molybdenum-containing source/drain vias 178 have height H1. After forming the MOL structure of device 200, BEOL processing may form metallization layers of a multilayer interconnect MLI, such as M0 level and so on, of device 200 over VC layer, such as described above with reference to FIG. 2L and FIG. 2M, and source/drain vias 178 and gate via 268 may each be connected to a respective electrically conductive line of M0 level.

Figure 7A:
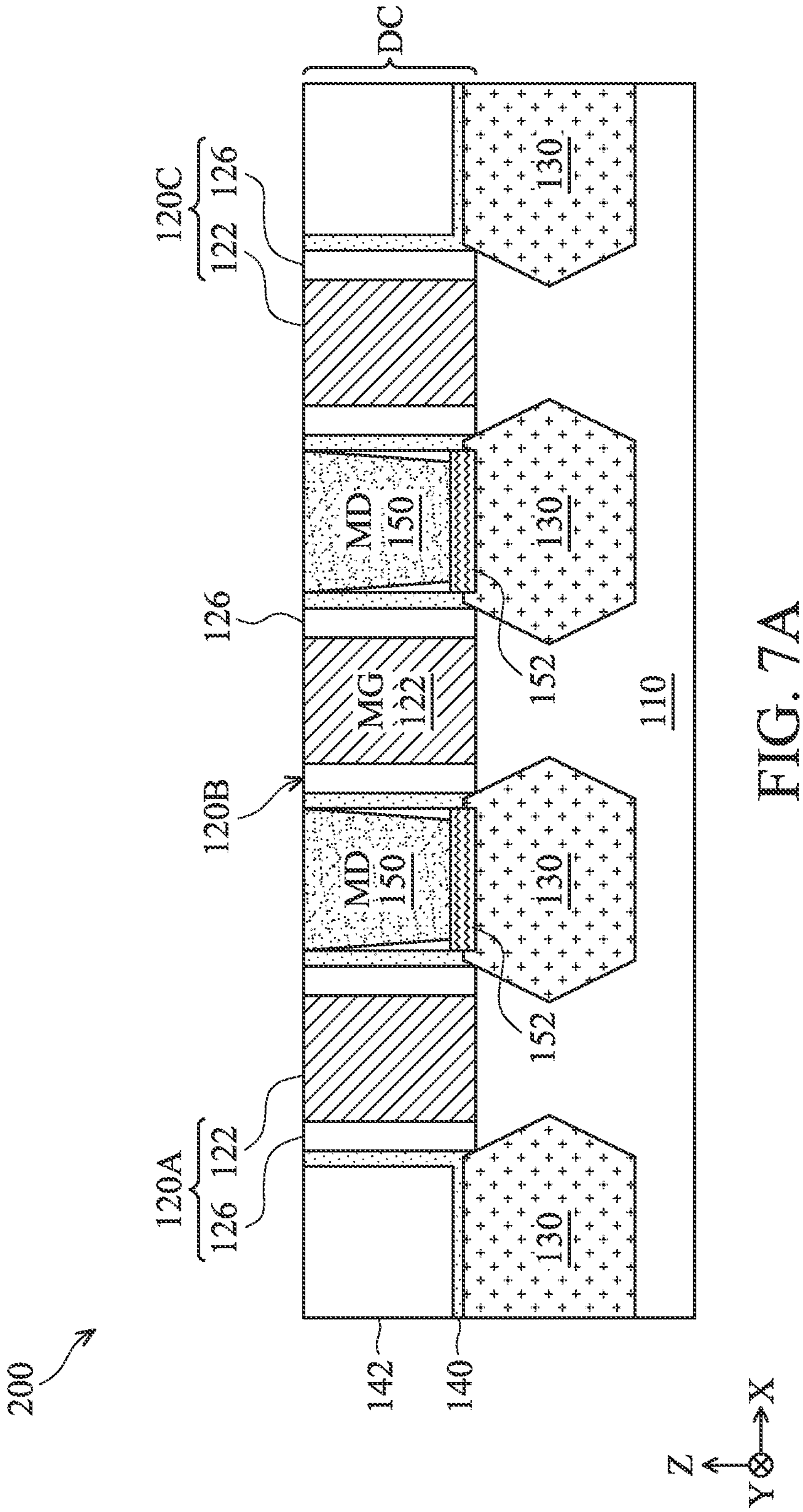
FIGS. 7A-7E are cross-sectional views of the MOL interconnect structure, in portion or entirety, of FIG. 5I at various stages of fabrication (such as those associated with the method in FIG. 1A and the method in FIG. 1B), according to various aspects of the present disclosure.
Figure 7B:
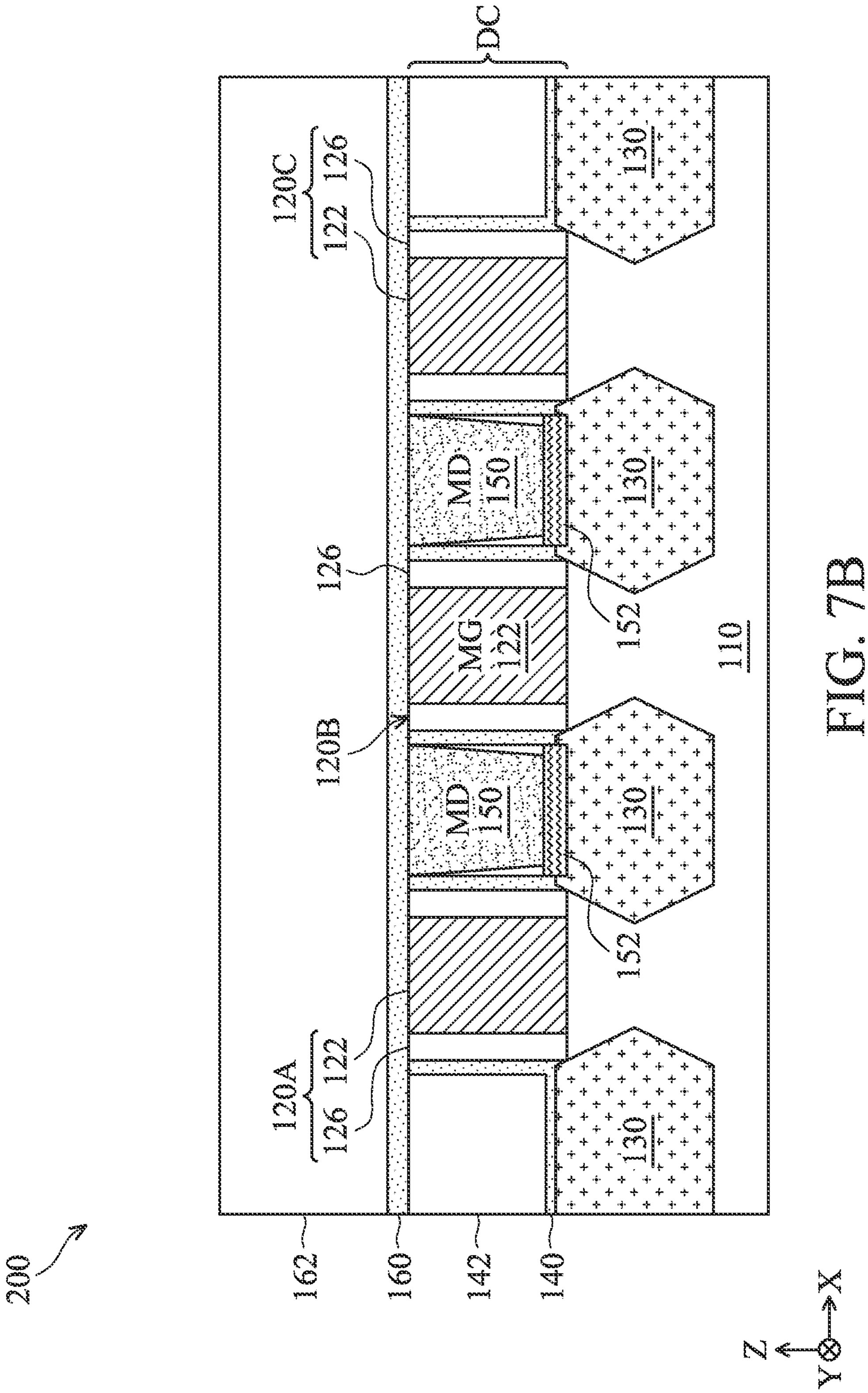
Figure 7C:
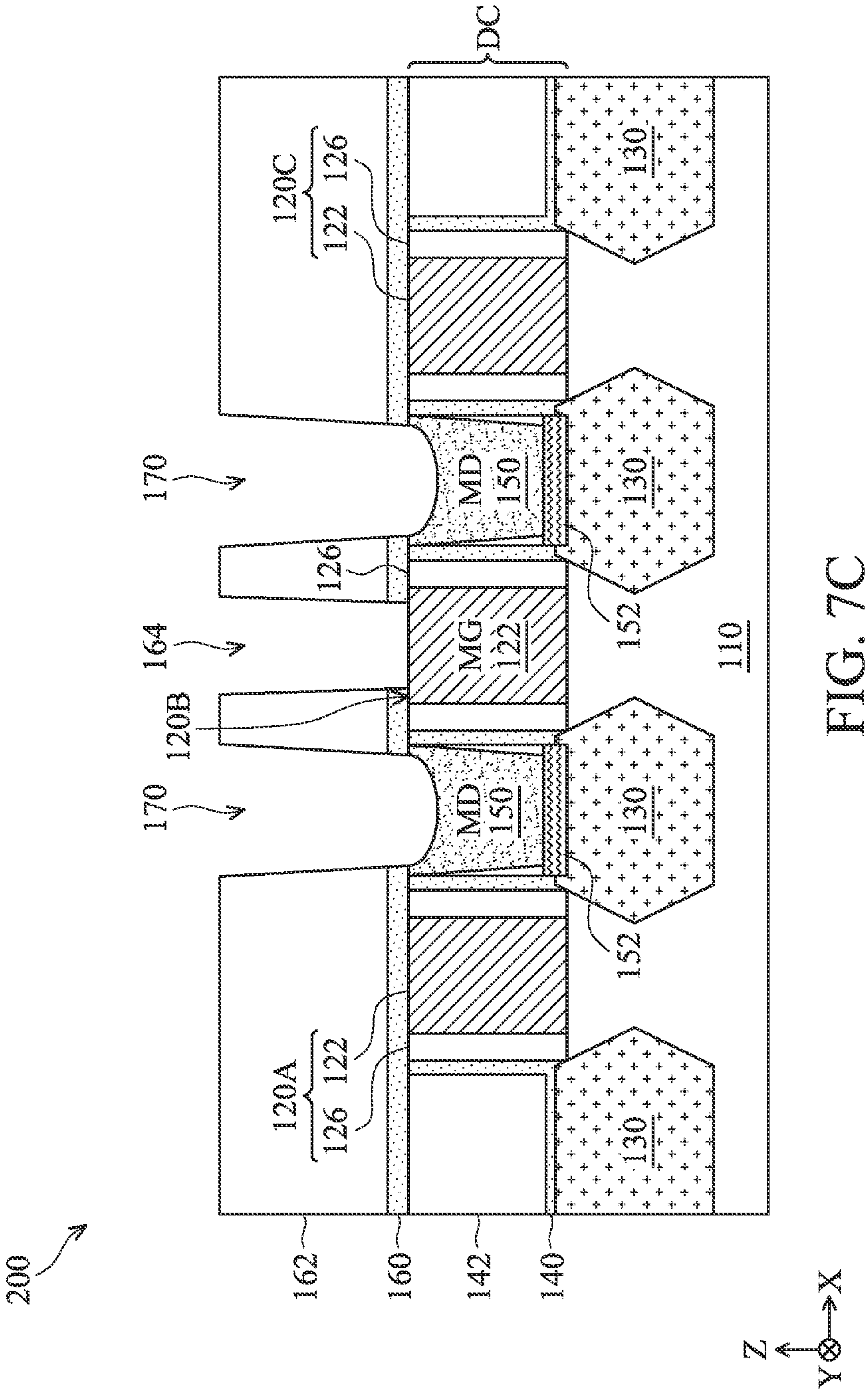

In FIGS. 5A-5I, barrier-free molybdenum-containing source/drain vias 178 and barrier-free molybdenum-containing gate via 268 are formed separately. For example, a first bottom-up deposition process forms molybdenum-containing gate via 268, and a second deposition process forms molybdenum-containing source/drain vias 178. In some embodiments, such as depicted in FIGS. 7A-7E, molybdenum-containing source/drain vias 178 and barrier-free molybdenum-containing gate via 268 are grown/deposited at the same time. In FIG. 7A, device 200 undergoes FEOL processing and MOL processing associated with forming barrier-free, seam-free tungsten-containing source/drain contacts 150, such as described above with reference to FIG. 2A and FIG. 2B. In FIG. 7B, device 200 undergoes MOL processing associated with forming a dielectric layer (e.g., CESL 160 and ILD layer 162) over DC layer, such as described above with reference to FIG. 2C. In FIG. 7C, gate via opening 164 and source/drain via openings 170 are formed in the dielectric layer to expose gate stack 122 and source/drain contacts 150, respectively, such as described above with reference to FIG. 2D, FIG. 2F, and FIG. 2G. In the depicted embodiment, gate via opening 164 is formed before source/drain via openings 170 (e.g., a gate via lithography and etch process is performed before a source/drain via lithography and etch process). In some embodiments, source/drain via openings 170 are formed before gate via opening 164. In some embodiments, source/drain via openings 170 and gate via opening 164 are formed at the same time (e.g., a same lithography and etch process).

Figure 7D:
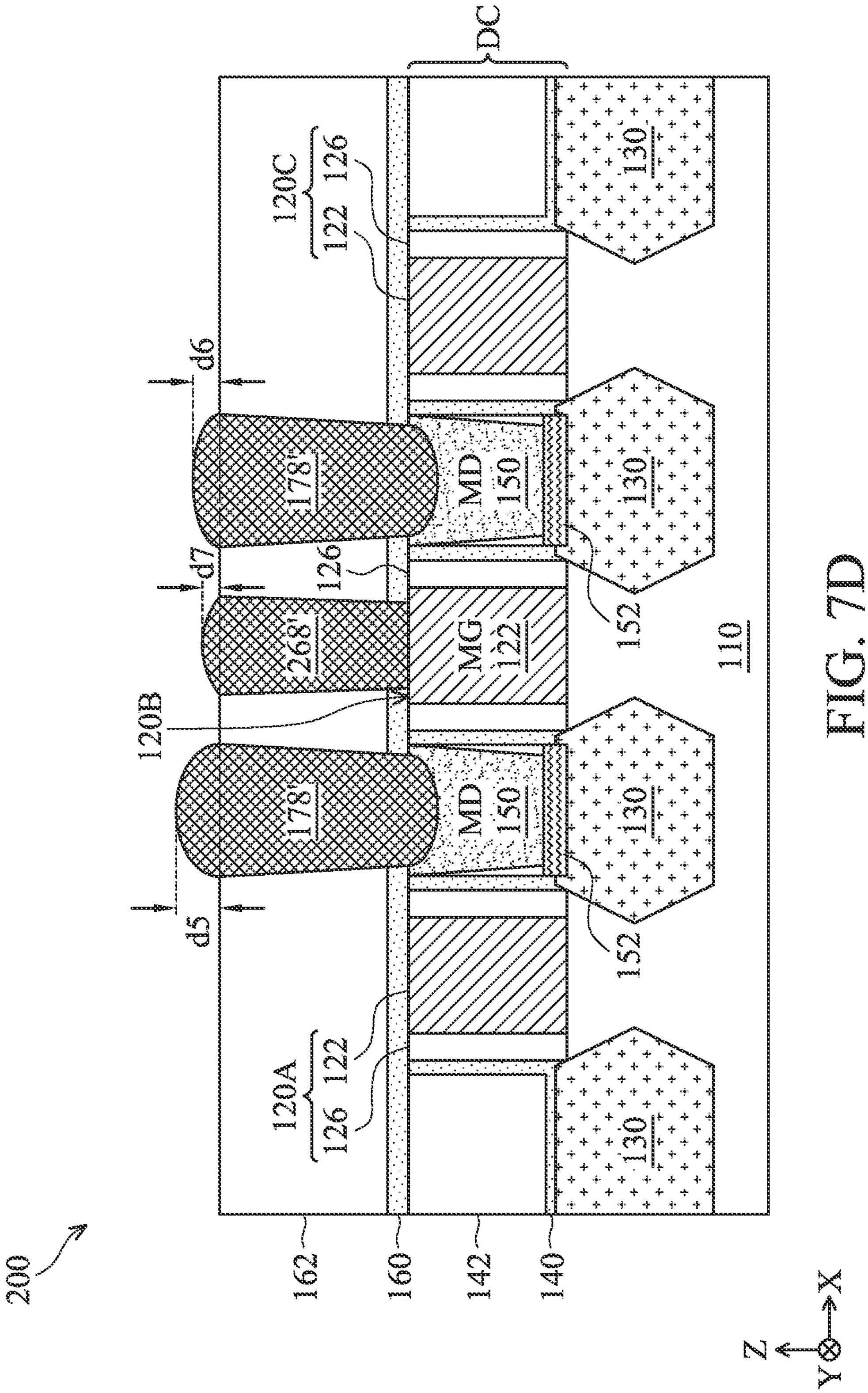

In FIG. 7D, MOL processing includes performing a bottom-up deposition process to form via molybdenum bulk material 178' and via molybdenum bulk material 268' that fills source/drain via openings 170 and gate via opening 164, respectively, from bottom to top, such as described above with reference to FIGS. 2H-2J and FIG. 5D. The bottom-up deposition process is performed until via molybdenum bulk material 178' fills source/drain via openings 170, via molybdenum bulk material 268' fills gate via openings 164, and via molybdenum bulk material 178' and via molybdenum bulk material 268' extend from source/drain contacts 150 and gate stack 122, respectively, to at least the top surface of ILD layer 162. In the depicted embodiment, via bulk molybdenum material 178' and via bulk molybdenum material 268' extend beyond the top surface of ILD layer 162, and via bulk molybdenum material 178' and via bulk molybdenum material 268' protrude from ILD layer 162. Via bulk molybdenum material 178' deposited on/grown from one of source/drain contacts 150 extends a distance d5 above ILD layer 162, via bulk molybdenum material 178' deposited on/grown from another one of source/drain contacts 150 extends a distance d6 above ILD layer 162, and via bulk molybdenum material 268' deposited on/grown from gate stack 122 extends a distance d7 above ILD layer 162. In FIG. 7D, since gate stack 122 and source/drain contacts 150 provide different growth surfaces (i.e., surfaces having different compositions), via molybdenum bulk material 178' may grow/deposit in source/drain via openings 170 faster than via molybdenum bulk material 268' in gate via opening 164, and distance d5 and distance d6 above ILD layer 162 may be greater than distance d7. In some embodiments, via molybdenum bulk material 268' may grow/deposit in gate via opening 164 faster than via molybdenum bulk material 178' in source/drain via openings 170, and distance d7 above ILD layer 162 may be greater than distance d5 and distance d6. In some embodiments, distance d5 is less than about 8 nm. In some embodiments, distance d6 is less than about 8 nm. In some embodiments, distance d7 is less than about 8 nm. In instances where the different growth surfaces may result in overflow of source/drain via openings 170 (or gate via opening 164), forming source/drain vias 178 and gate via 268 separately, such as in FIGS. 5A-5I, may optimize growth/deposition rates of via molybdenum material.

Figure 7E:
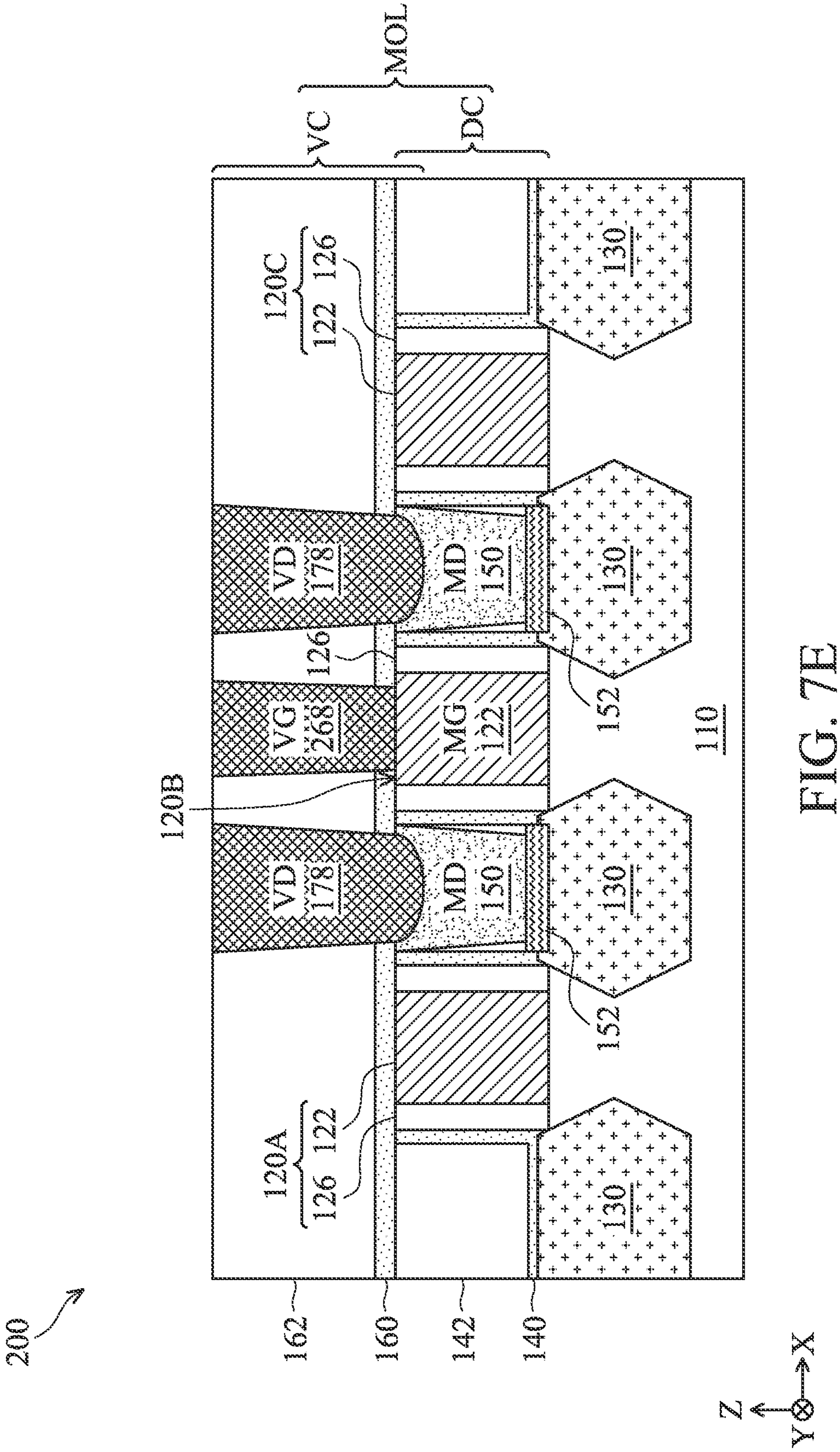

In FIG. 7E, MOL processing includes performing a planarization process on both via molybdenum bulk material 178' and via molybdenum bulk material 268' (i.e., a same planarization process forms source/drain vias and gate vias), which may remove portions of via molybdenum bulk material 178' and via molybdenum bulk material 268' disposed over a top surface of ILD layer 162. A remainder of via molybdenum bulk material 178' and via molybdenum bulk material 268' fills source/drain via openings 170 and gate via opening 164 and provides barrier-free molybdenum-containing gate via 268. In the depicted embodiment, source/drain vias 178 and gate vias 268 do not protrude from the top surface of ILD layer 162 after planarization, and the top surface of ILD layer 162, the top surface of gate via 268, and the top surfaces of source/drain vias 178 may form a substantially planar surface. After forming the MOL structure of device 200 in FIGS. 7A-7E, BEOL processing may form metallization layers of a multilayer interconnect MLI, such as M0 level and so on, of device 200 over VC layer, such as described above with reference to FIG. 2L and FIG. 2M, and source/drain vias 178 and gate via 268 may each be connected to a respective electrically conductive line of M0 level.

In some embodiments, source/drain contacts may have a multilayer structure, such as barrier-free, seam-free plugs that include a molybdenum-containing layer disposed over a tungsten-containing layer. For example, FIGS. 8A-8F are fragmentary diagrammatic views of a device 300, in portion or entirety, at various stages of fabricating an MOL interconnect structure thereof (such as those associated with method 10 in FIG. 1A and method 30 in FIG. 1B), according to various aspects of the present disclosure. A DC layer of device 300 is fabricated to have barrier-free and seam-free molybdenum-and-tungsten-containing bilayer source/drain contacts. Device 300 is similar in many respects to device 100 and/or device 200 and is fabricated in a similar manner as device 100 and device 200, such as in the manners described in FIGS. 2A-2M and FIGS. 5A-5I, respectively. Accordingly, similar features in FIGS. 8A-8F. FIGS. 5A-5I, and FIGS. 2A-2M are identified by the same reference numerals for clarity and simplicity. Device 300 may be included in a microprocessor, a memory, other IC device, or a combination thereof. In some embodiments, device 300 is a portion of an IC chip, an SoC, or portion thereof, that includes various passive and active electronic devices such as resistors, capacitors, inductors, diodes, PFETs, NFETs, MOSFETs, CMOS transistors, BJTs, LDMOS transistors, high voltage transistors, high frequency transistors, other suitable components, or a combination thereof. The various transistors may be planar transistors or non-planar transistors, such as FinFETs or GAA transistors. FIGS. 8A-8F have been simplified for the sake of clarity to better understand the inventive concepts of the present disclosure. Additional features can be added in device 300, and some of the features described below can be replaced, modified, or eliminated in other embodiments of device 300.

Figure 8A:
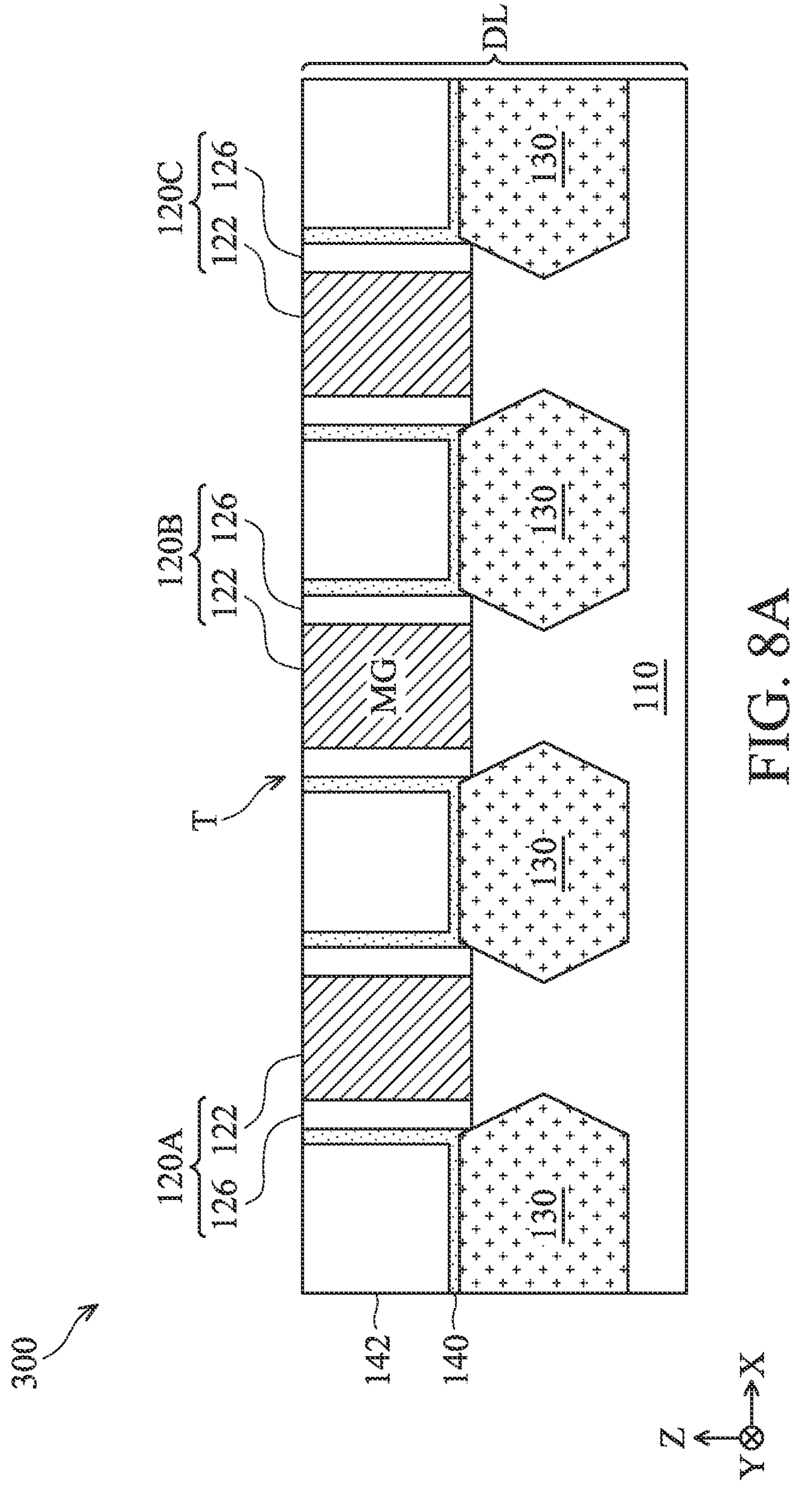
FIGS. 8A-8F are cross-sectional views of yet another MOL interconnect structure, in portion or entirety, at various stages of fabrication (such as those associated with the method in FIG. 1A and the method in FIG. 1B), according to various aspects of the present disclosure.
Figure 8B:
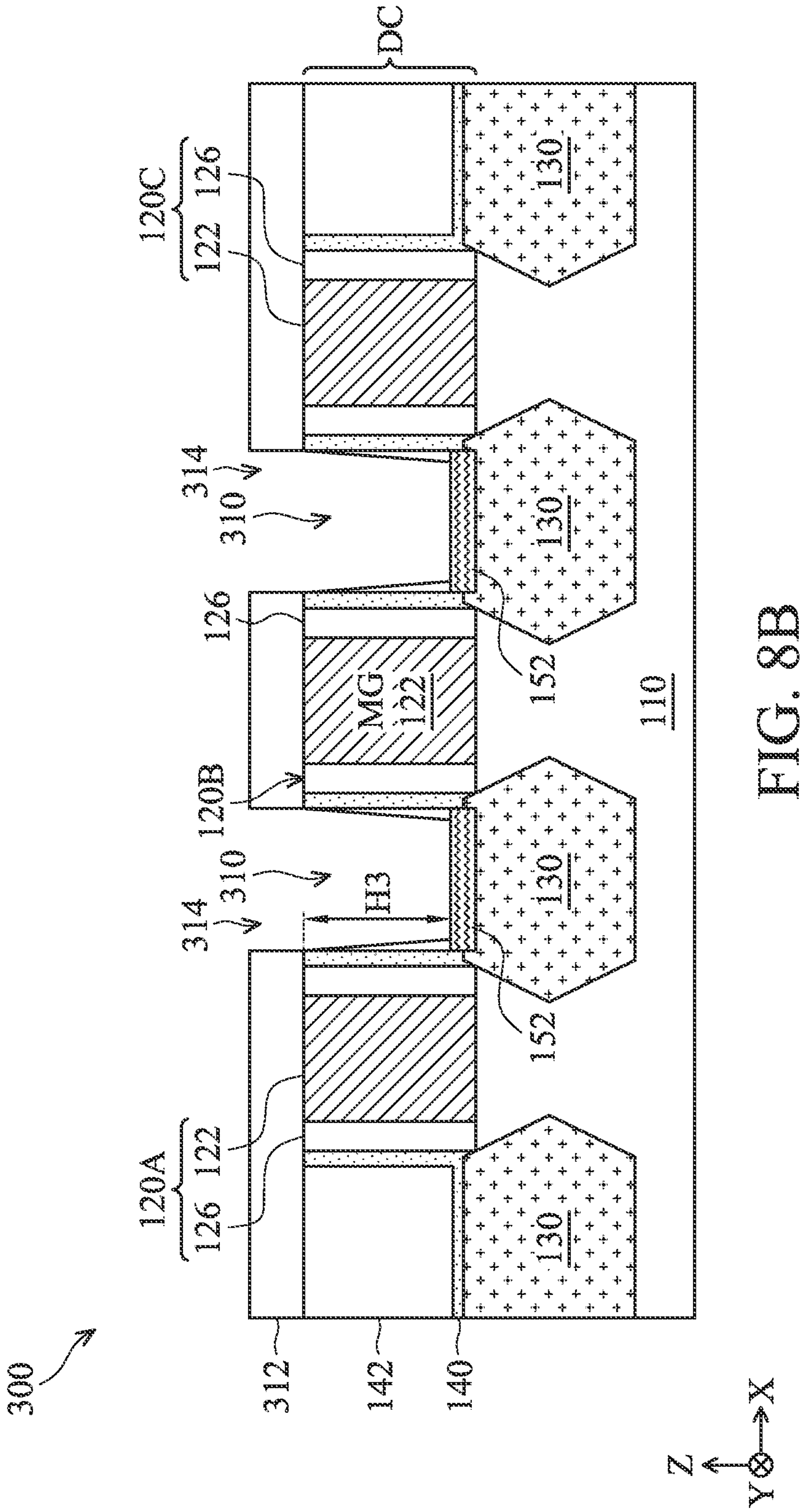

In FIG. 8A, device 300 undergoes FEOL processing, such as described above with reference to FIG. 2A. In FIG. 8B. MOL processing includes forming source/drain contact openings 310 in a dielectric layer (e.g., ILD layer 142 and/or CESL 140) and forming silicide layers 152. Source/drain contact openings 310 have a height H3 (e.g., along the z-direction), which may be between silicide layers 152 (or epitaxial source/drains 130 where silicide layers 152 are omitted) and a top surface of ILD layer 140. ILD layer 140 and/or CESL 142 may be patterned by a lithography process and an etching process. The lithography process may include forming a patterned mask layer 312 over ILD layer 142. The patterned mask layer has openings 314 therein, each of which overlaps a respective epitaxial source/drain 130. The etching process may include transferring a pattern in patterned mask layer 312 to the dielectric layer, for example, by removing portions of ILD layer 142 and/or CESL 140 exposed by openings 314. The etching process is a dry etch, a wet etch, other suitable etching process, or a combination thereof. The etching process selectively removes the dielectric layer (i.e., dielectric material(s)) with respect to epitaxial source/drains 130 (e.g., semiconductor material(s)). In some embodiments, the etching process removes patterned mask layer 314, in portion or entirety, from over the dielectric layer. In some embodiments, after the etching process, the patterned mask layer is removed, for example, by an etching process and/or a resist stripping process.

Figure 8C:
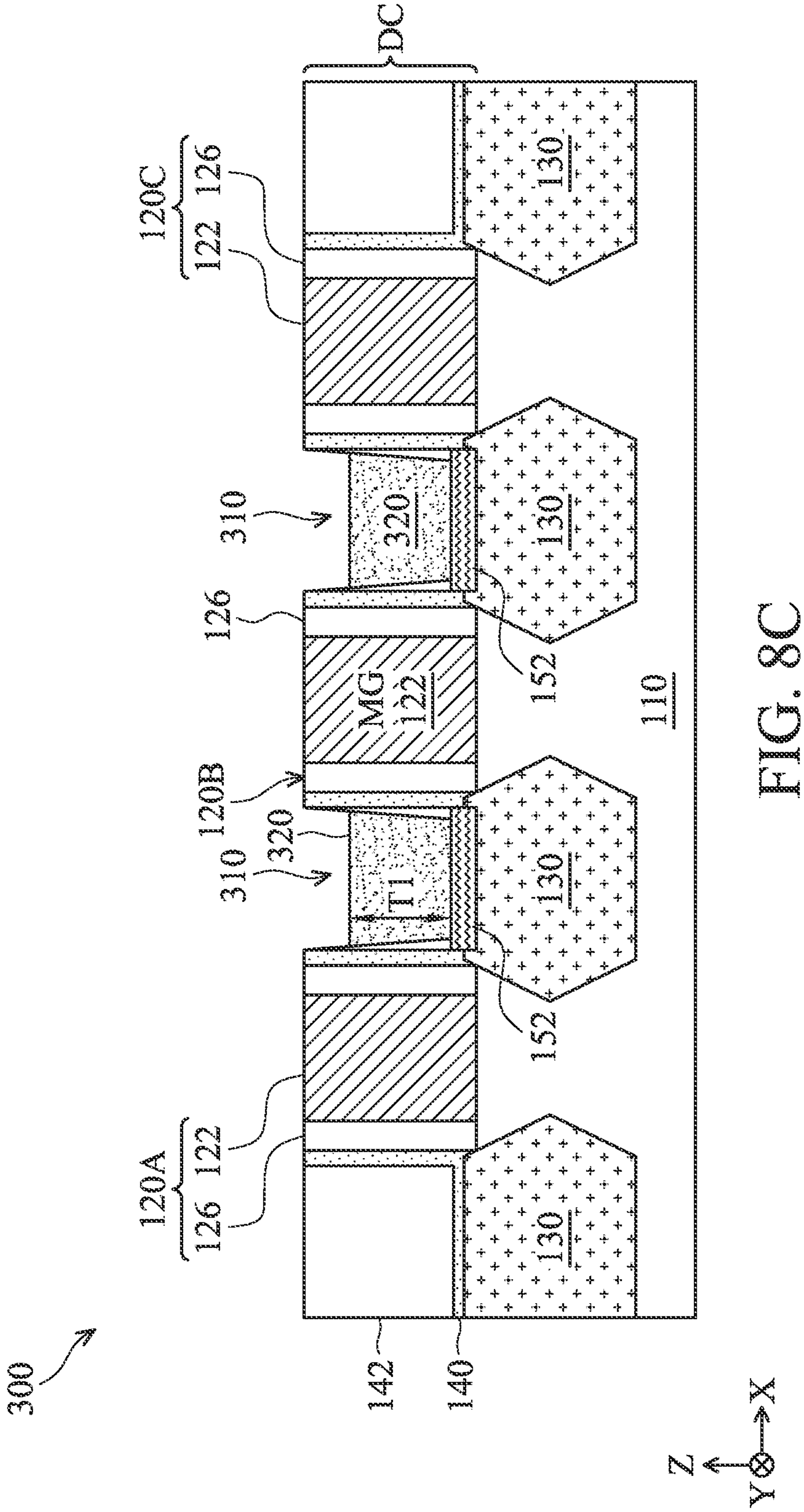

In FIG. 8C, MOL processing includes forming tungsten layers 320 in source/drain contact openings 310. Tungsten layers 320 have a thickness T1 (e.g., along the z-direction) that is less than height H3, such that top surfaces of tungsten layers 320 are below the top surface of ILD layer 142. In the depicted embodiment, tungsten layers 320 are free of sidewall barriers/liners. For example, tungsten layers 320 physically, directly contact surrounding dielectric materials, such as ILD layer 142, CESL 140, gate spacers 126, other dielectric features, or a combination thereof. In some embodiments, tungsten layers 320 also physically, directly contact a respective epitaxial source/drain 130 and/or a respective silicide layer 152. Tungsten layers 320 include tungsten, alloys thereof, or a combination thereof. In the depicted embodiment, tungsten layers 320 have a tungsten concentration that is greater than or equal to about 98 atomic percent (at %), such as about 98 at % to about 99.5 at %. In some embodiments, forming tungsten layers 320 includes performing a blanket deposition process (e.g., blanket CVD or blanket PVD) to form a tungsten bulk material over ILD layer 142 that fills source/drain contact openings 310, such as described herein, and etching back the tungsten bulk material until reaching a desired thickness (e.g., thickness T1). In some embodiments, forming tungsten layers 320 includes performing a bottom-up deposition process (e.g., selective CVD or selective ALD) that fills source/drain contact openings 310 with a tungsten bulk material from bottom to top, such as described herein, until reaching a desired thickness.

Figure 8D:
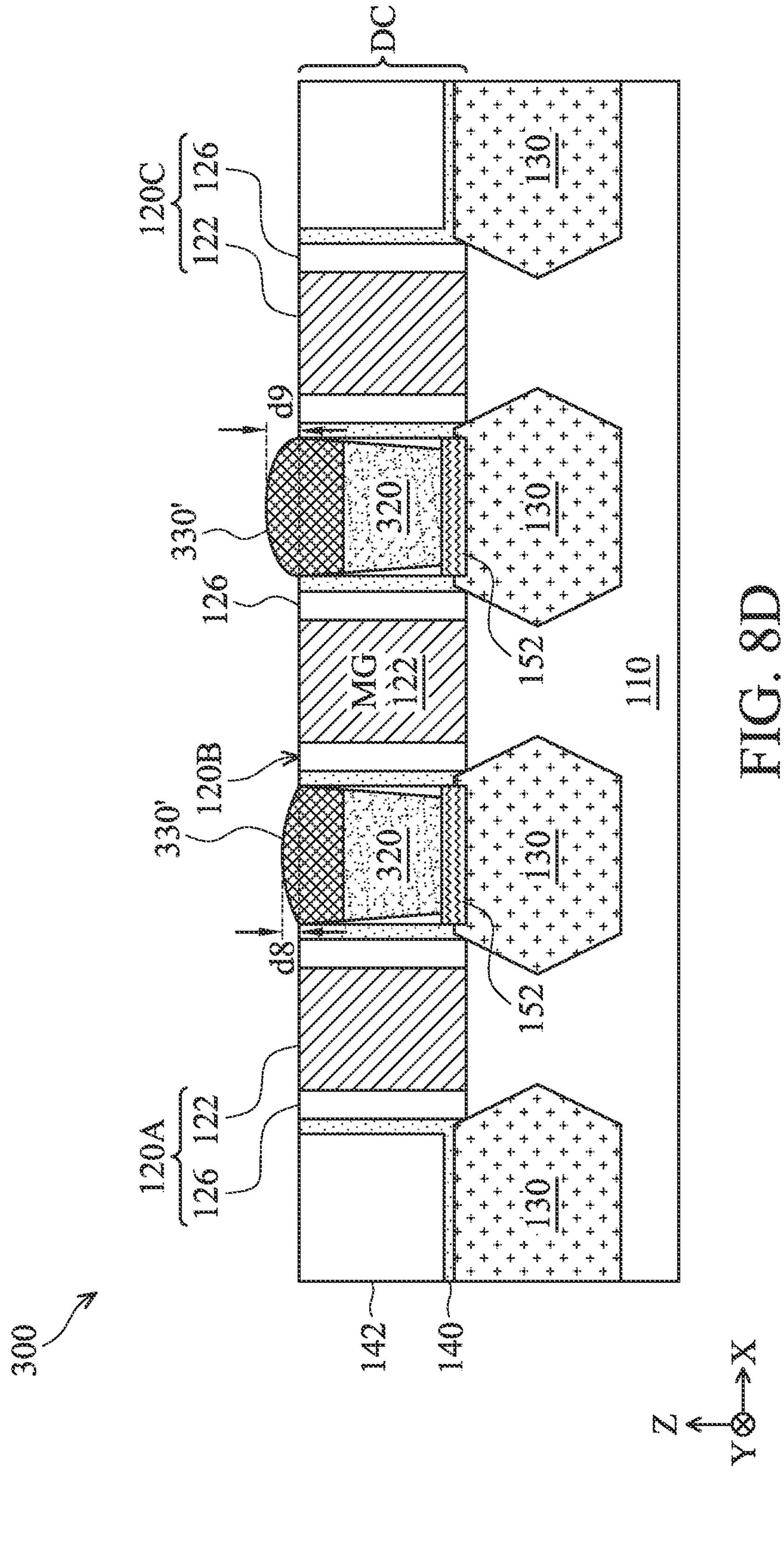
Figure 8E:
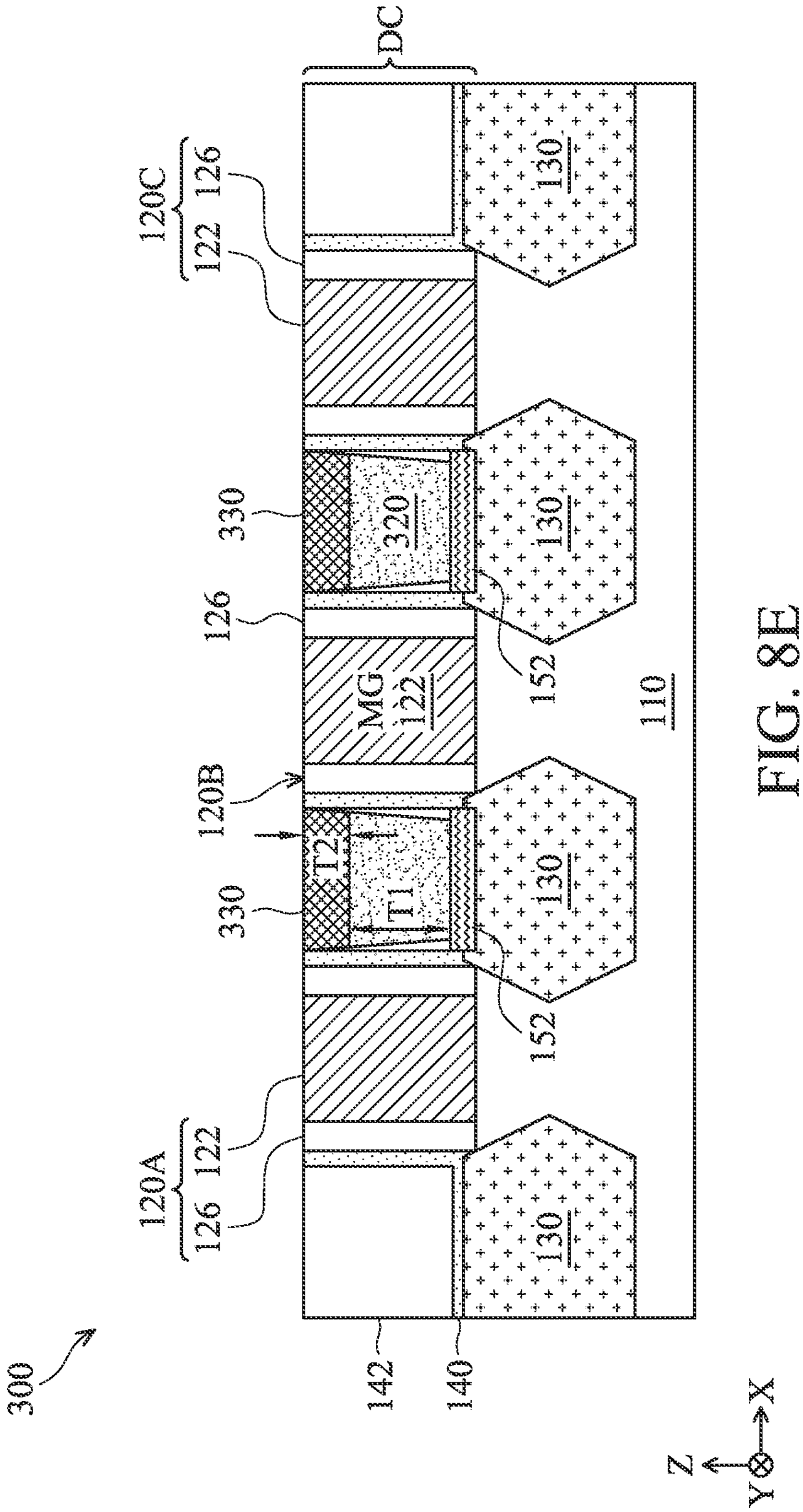

In FIG. 8D and FIG. 8E, MOL processing includes molybdenum layers 330 in source/drain contact openings 310 over tungsten layers 320. Molybdenum layers 330 have a thickness T2 (e.g., along the z-direction) that is less than height H3, and a sum of thickness T2 and thickness T1 is about equal to height H3. In the depicted embodiment, molybdenum layers 330 are free of sidewall barriers/liners. For example, molybdenum layers 330 physically, directly contact surrounding dielectric materials, such as ILD layer 142, CESL 140, gate spacers 126, other dielectric features, or a combination thereof. In some embodiments, molybdenum layers 330 also physically, directly contact a respective tungsten layer 320. Molybdenum layers 330 include molybdenum, alloys thereof, or a combination thereof. In the depicted embodiment, molybdenum layers 330 have a molybdenum concentration that is greater than or equal to about 98 atomic percent (at %), such as about 98 at % to about 99.5 at %.

In some embodiments, forming molybdenum layers 330 includes performing a bottom-up deposition process (e.g., selective CVD or selective ALD) to form a via molybdenum bulk material 330' that fills source/drain contact openings 310 from bottom to top (FIG. 8D), such as described herein, and performing a planarization process (FIG. 8E), such as described herein, which may remove portions of via molybdenum bulk material 330' disposed over a top surface of ILD layer 142. The bottom-up deposition process is performed until via molybdenum bulk material 330' fills source/drain contact openings 310 and extends from tungsten layers 320 to at least the top surface of ILD layer 142. In the depicted embodiment, via bulk molybdenum material 330' extends beyond the top surface of ILD layer 142, such that via bulk molybdenum material 330' protrudes from ILD layer 142. Via bulk molybdenum material 330' deposited on/grown from tungsten layers 320 extends a distance d8 and a distance d9 above ILD layer 142. In some embodiments, distance d8 is less than about 8 nm. In some embodiments, distance d9 is less than about 8 nm. In the depicted embodiment, molybdenum layers 330 do not protrude from the top surface of ILD layer 142 after planarization, and the top surface of ILD layer 142 and the top surface of molybdenum layers 330 may form a substantially planar surface. In some embodiments, forming molybdenum layers 330 includes performing a blanket deposition process (e.g., blanket CVD or blanket PVD) to form a molybdenum bulk material over ILD layer 142 that fills source/drain contact openings 310, such as described herein, and performing a planarization process on the molybdenum bulk material, which may remove portions of the molybdenum bulk material disposed over a top surface of ILD layer 142. In some embodiments, a cleaning process may be performed, such as described with reference to FIG. 2G, before forming molybdenum layers 330. In some embodiments, a source/drain contact recess process may be performed, such as described with reference to FIG. 2G, to provide tungsten layers 320 with dished, recessed surfaces before forming molybdenum layers 330.

In FIG. 8E, source/drain contacts 350 include tungsten, molybdenum, alloys thereof, or a combination thereof. For example, source/drain contacts 350 are barrier-free tungsten-and-molybdenum-containing plugs, each of which has a molybdenum plug (e.g., formed by a respective molybdenum layer 330) and a tungsten plug (e.g., formed by a respective tungsten layer 320). The tungsten-and-molybdenum-containing plugs physically, directly contact surrounding dielectric materials, such as ILD layer 142, CESL 140, gate spacers 126, other dielectric features, or a combination thereof. In some embodiments, the tungsten-and-molybdenum-containing plugs physically, directly contacts underlying electrically conductive feature, such as a respective epitaxial source/drain 130 and/or a respective silicide layer 152. In some embodiments, a bottom metal liner(s) is between the tungsten-and-molybdenum-containing plug (e.g., tungsten layer 320 thereof) and underlying electrically conductive feature. Source/drain contacts 350 may also include other electrically conductive material, such as ruthenium, cobalt, copper, aluminum, titanium, tantalum, iridium, palladium, platinum, nickel, tin, gold, silver, other suitable metal, alloys thereof, or a combination thereof.

Figure 8F:
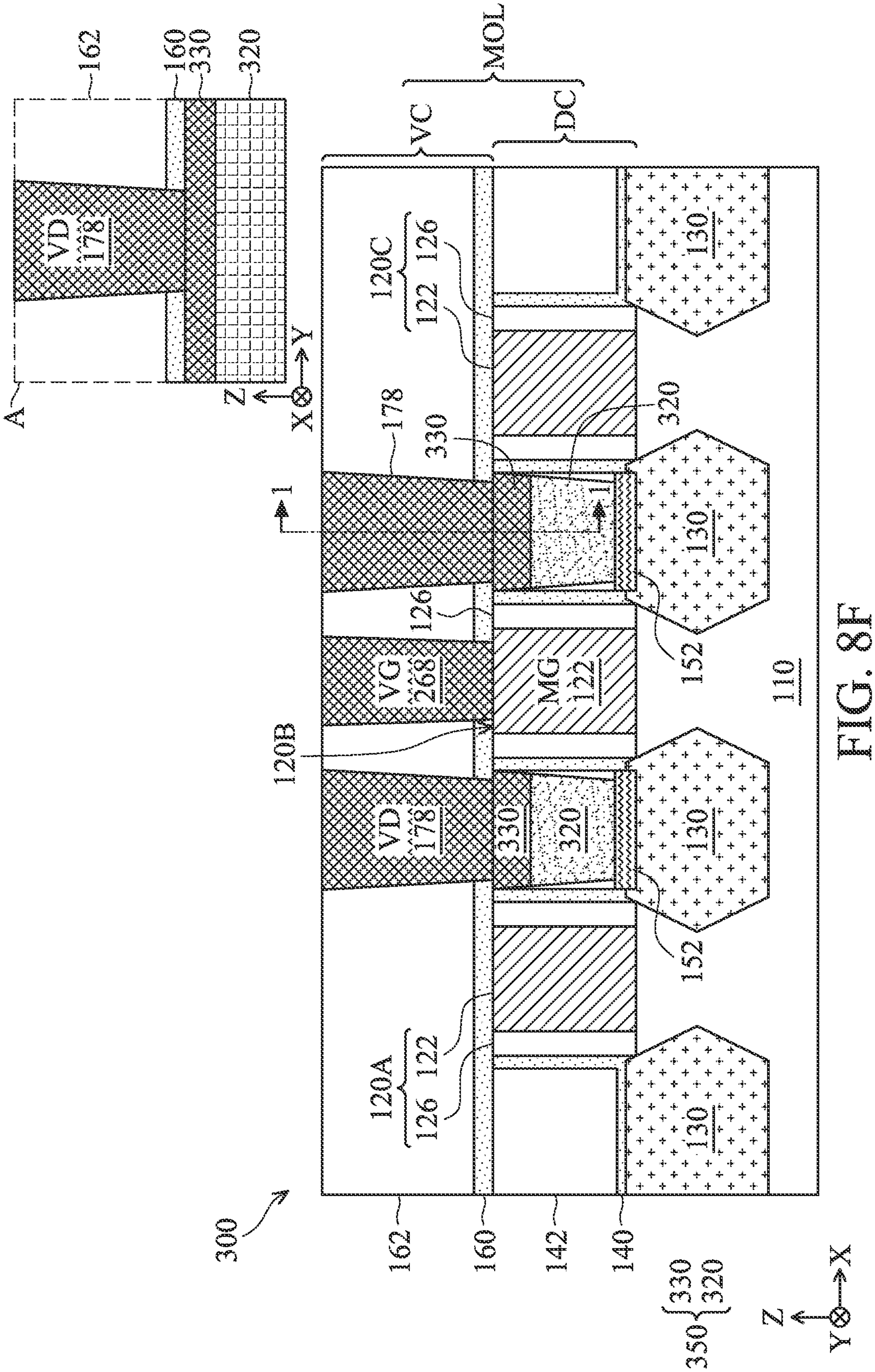
Figure 10:
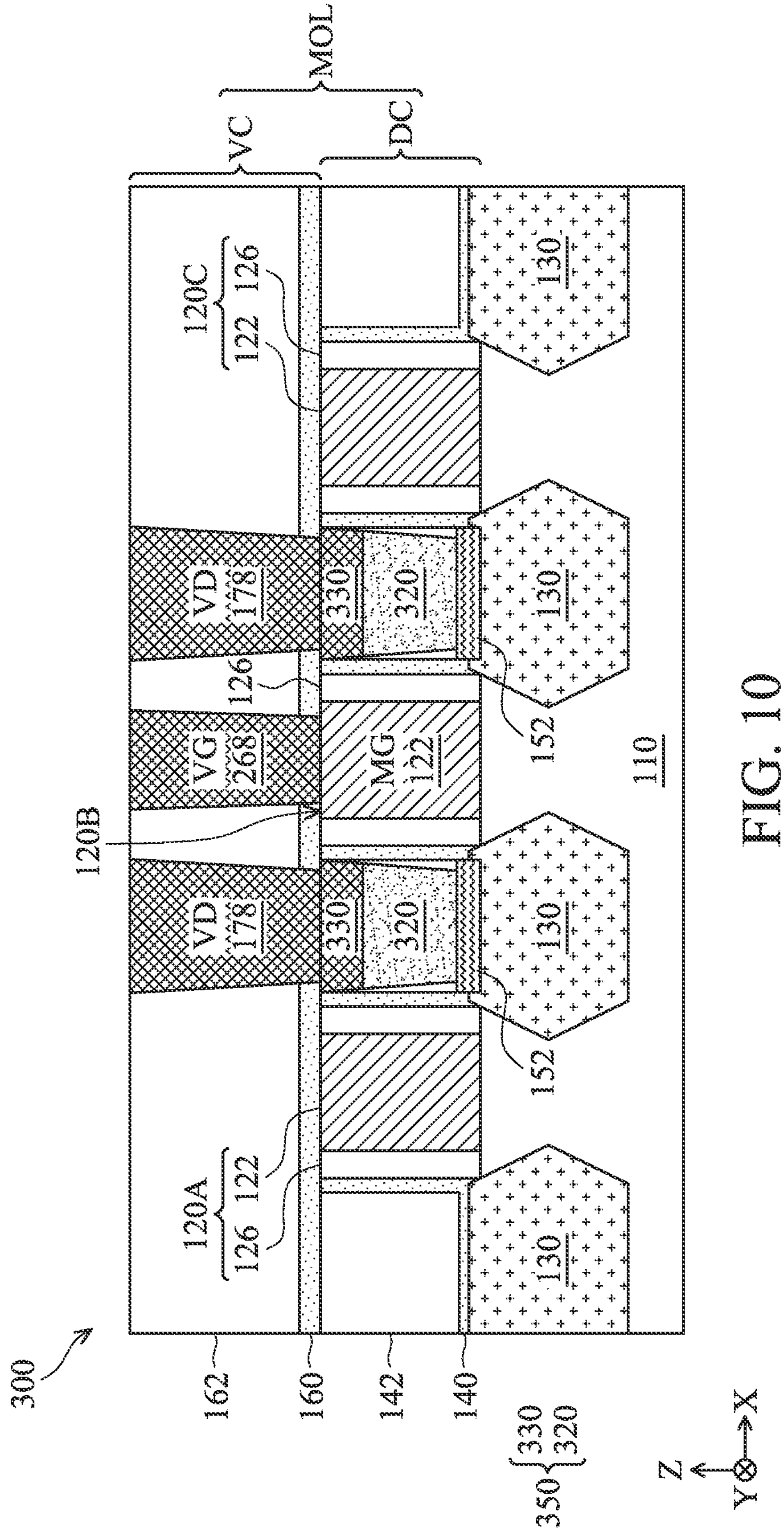

In FIG. 8F, MOL processing may form barrier-free, seam-free molybdenum-containing source/drain vias 178 and barrier-free, seam-free molybdenum-containing gate vias 268, such as described herein. Device 300 thus includes an MOL interconnect structure having a molybdenum VC layer (i.e., barrier-free molybdenum-containing source/drain vias 178 and barrier-free molybdenum-containing gate vias 268) and a molybdenum and tungsten DC layer (i.e., barrier-free tungsten-and-molybdenum-containing source/drain contacts 350). Source/drain vias 178, gate vias 268, and source/drain contacts 350 may be seamless. In the depicted embodiment, barrier-free molybdenum-containing source/drain vias 178 do not extend below top surface of ILD layer 142 and/or top surfaces of gate stacks 122. In some embodiments, the MOL interconnect structure of device 300 may have a molybdenum and tungsten VC layer, such as depicted in FIG. 10, where VC layer includes barrier-free molybdenum-containing source/drain vias 178 and barrier-free tungsten-containing gate vias 168. In some embodiments, barrier-free tungsten-containing gate vias 168 may have seams therein, such as described above. After forming the MOL structure of device 300, BEOL processing may form metallization layers of a multilayer interconnect MLI, such as M0 level and so on, of device 200 over VC layer, such as described above with reference to FIG. 2L and FIG. 2M, and source/drain vias 178 and gate via 268 may each be connected to a respective electrically conductive line of M0 level.

Figure 9:
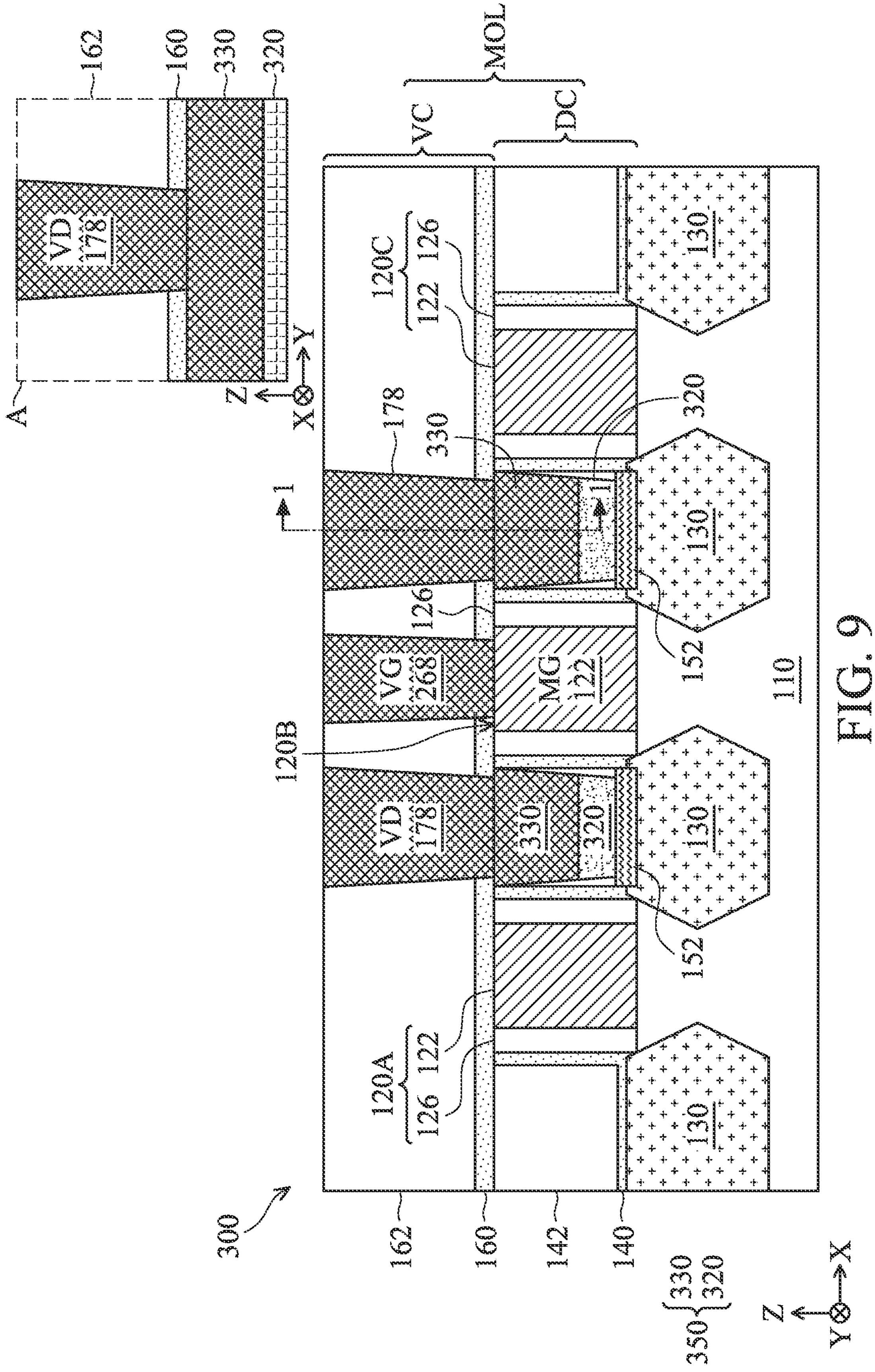
FIG. 9 and FIG. 10 are cross-sectional views of MOL interconnect structures, in portion or entirety, that may be fabricated by the methods in FIG. 1A, FIG. 1B, FIGS. 8A-8F, or a combination thereof according to various aspects of the present disclosure.

In the depicted embodiment, thickness T2 is less T1. In some embodiments, thickness T2 is greater than thickness T1, such as depicted in FIG. 9. In such embodiments, tungsten layers 320 may function as seed layers for facilitating growth of molybdenum layers 330. In such embodiments, thickness Tl may be less than about 10 nm (i.e., thickness T1≤10 nm). In some embodiments, thickness T2 is equal to thickness T1.

In some embodiments, source/drain contacts may be barrier-free, seam-free molybdenum-containing plugs (i.e., MOL interconnect structure has a molybdenum VC layer and a molybdenum DC layer). For example, FIGS. 11A-11E are fragmentary diagrammatic views of a device 400, in portion or entirety, at various stages of fabricating an MOL interconnect structure thereof (such as those associated with method 10 in FIG. 1A and method 30 in FIG. 1B), according to various aspects of the present disclosure. A DC layer of device 400 is fabricated to have barrier-free and seam-free molybdenum-containing source/drain contacts. Device 400 is similar in many respects to device 100, device 200, device 300, or a combination thereof, and is fabricated in a similar manner as device 100, device 200, and device 300, such as in the manners described above. Accordingly, similar features are identified by the same reference numerals for clarity and simplicity. Device 400 may be included in a microprocessor, a memory, other IC device, or a combination thereof. In some embodiments, device 400 is a portion of an IC chip, an SoC, or portion thereof, that includes various passive and active electronic devices such as resistors, capacitors, inductors, diodes, PFETs, NFETs, MOSFETs, CMOS transistors, BJTs, LDMOS transistors, high voltage transistors, high frequency transistors, other suitable components, or a combination thereof. The various transistors may be planar transistors or non-planar transistors, such as FinFETs or GAA transistors. FIGS. 11A-11E have been simplified for the sake of clarity to better understand the inventive concepts of the present disclosure. Additional features can be added in device 400, and some of the features described below can be replaced, modified, or eliminated in other embodiments.

Figure 11A:
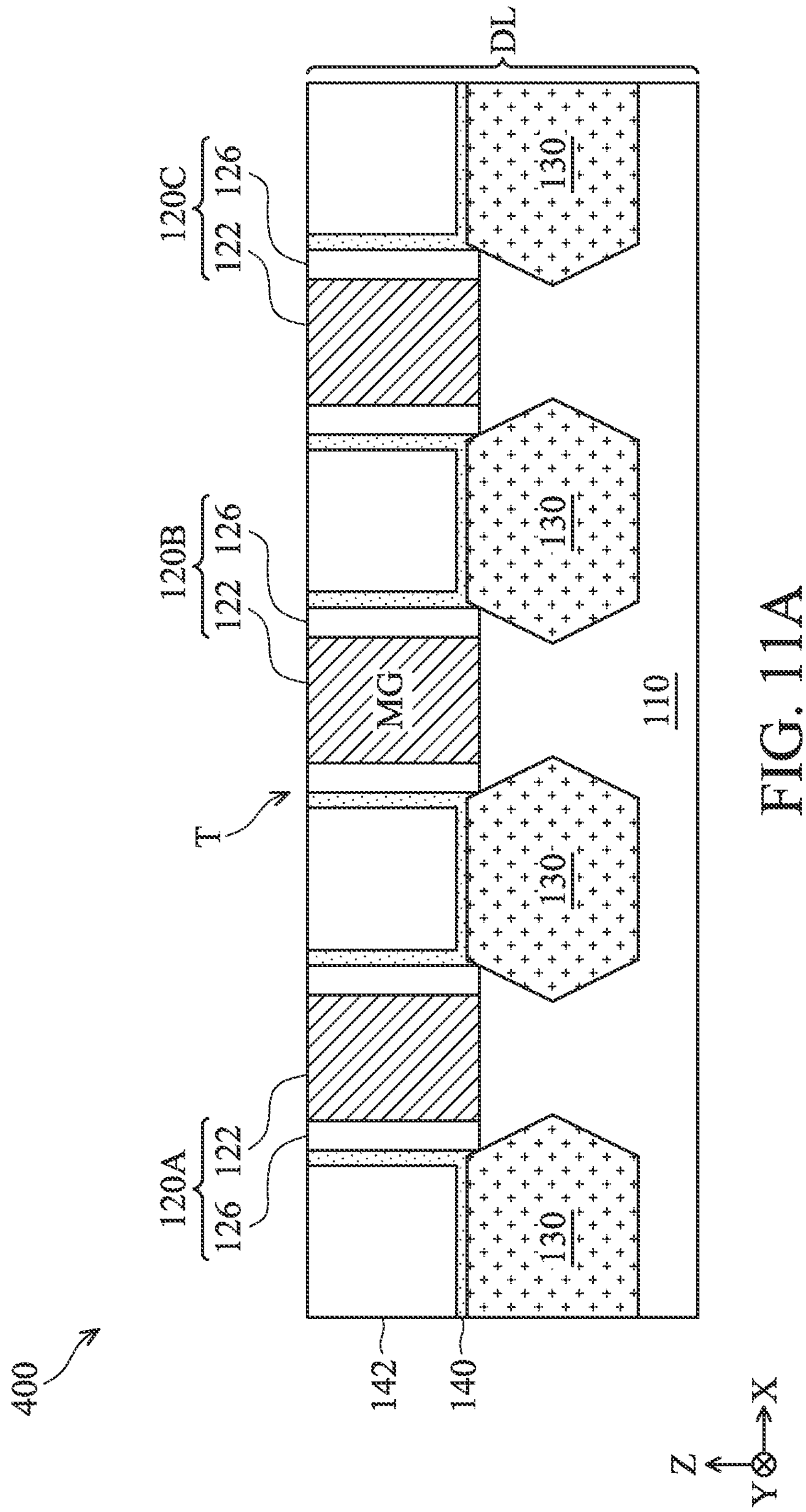
FIGS. 11A-11E are cross-sectional views of yet another MOL interconnect structure, in portion or entirety, at various stages of fabrication (such as those associated with the method in FIG. 1A and the method in FIG. 1B), according to various aspects of the present disclosure.
Figure 11B:
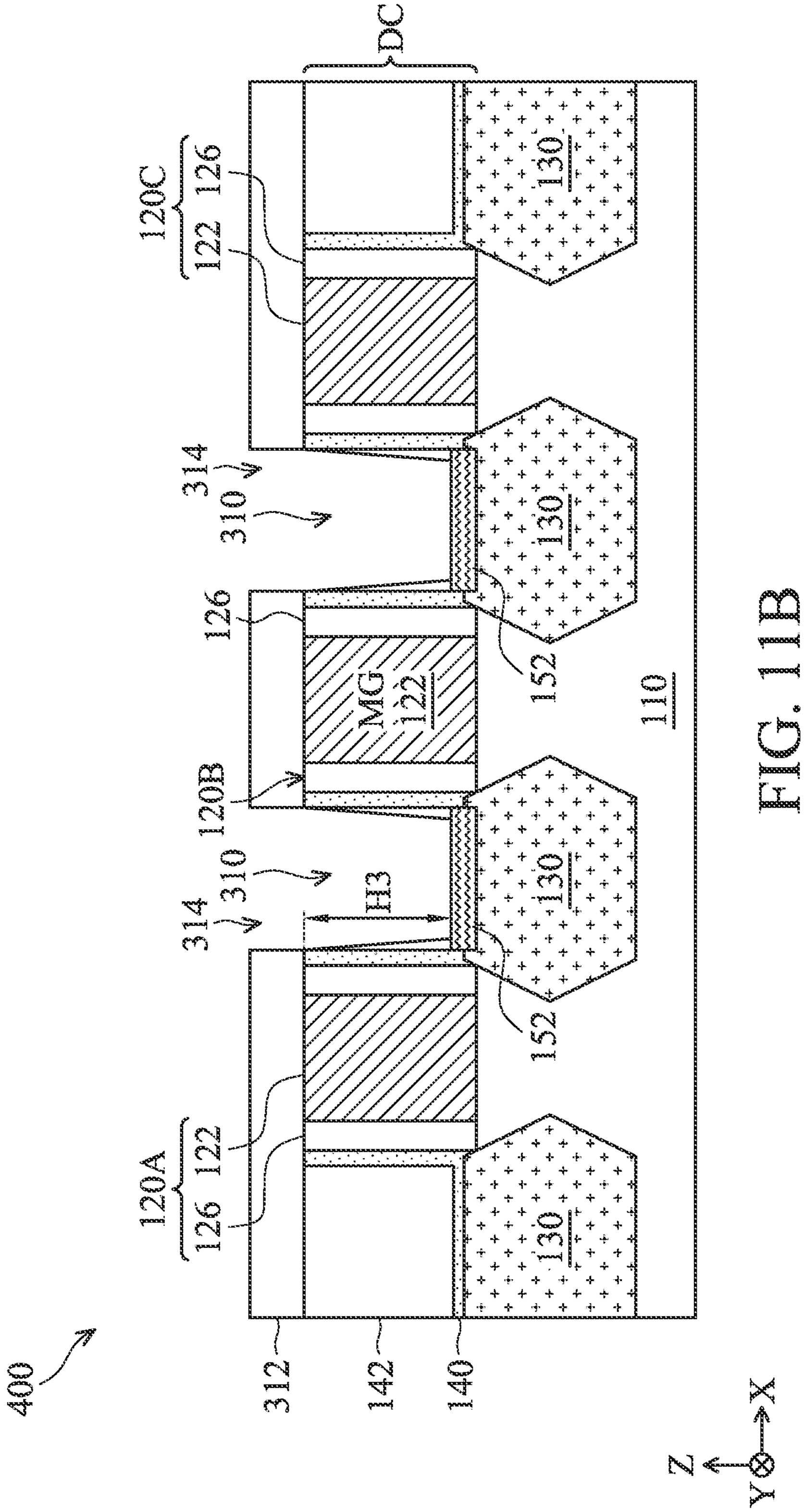
Figure 11C:
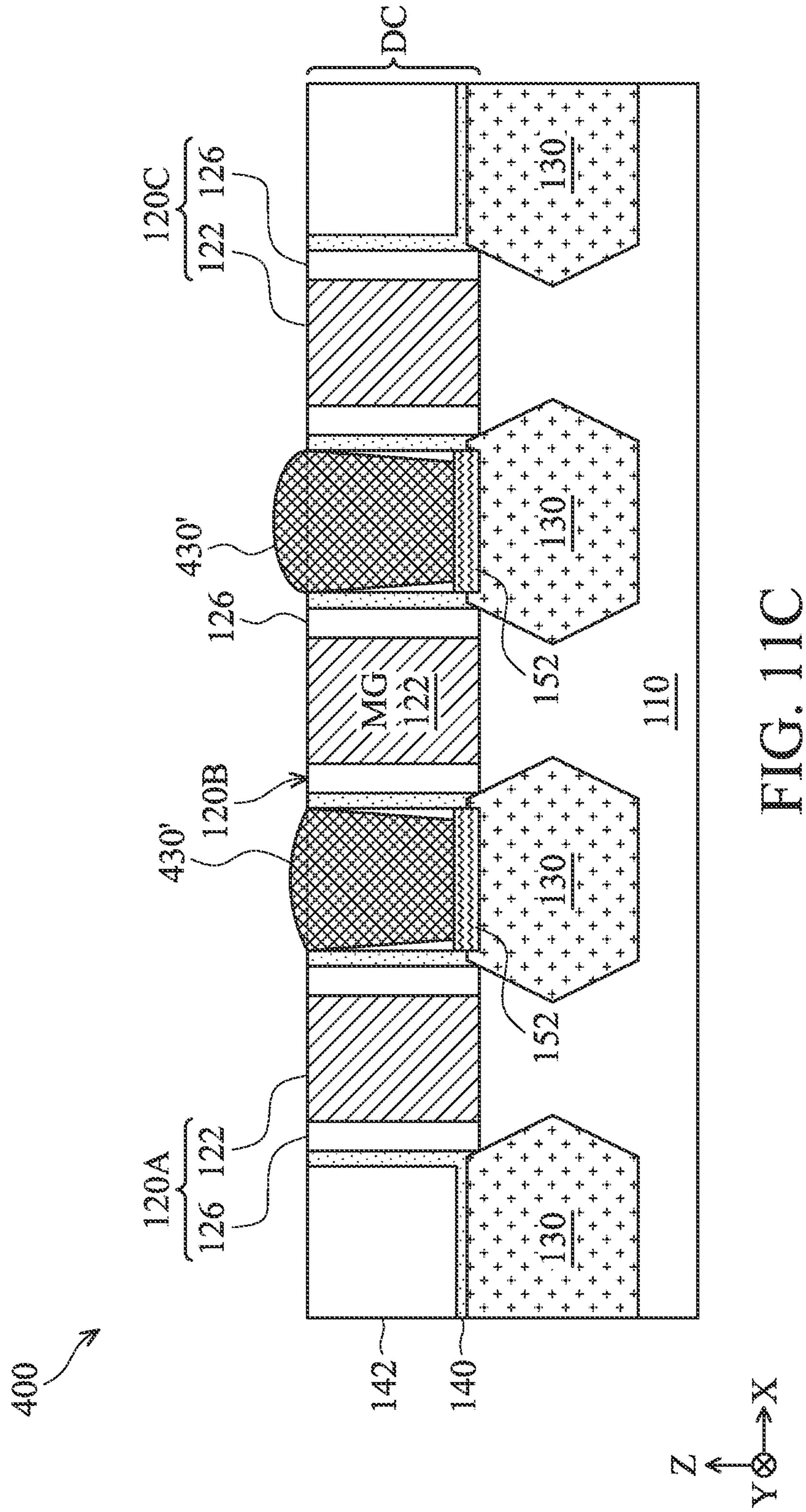
Figure 11D:
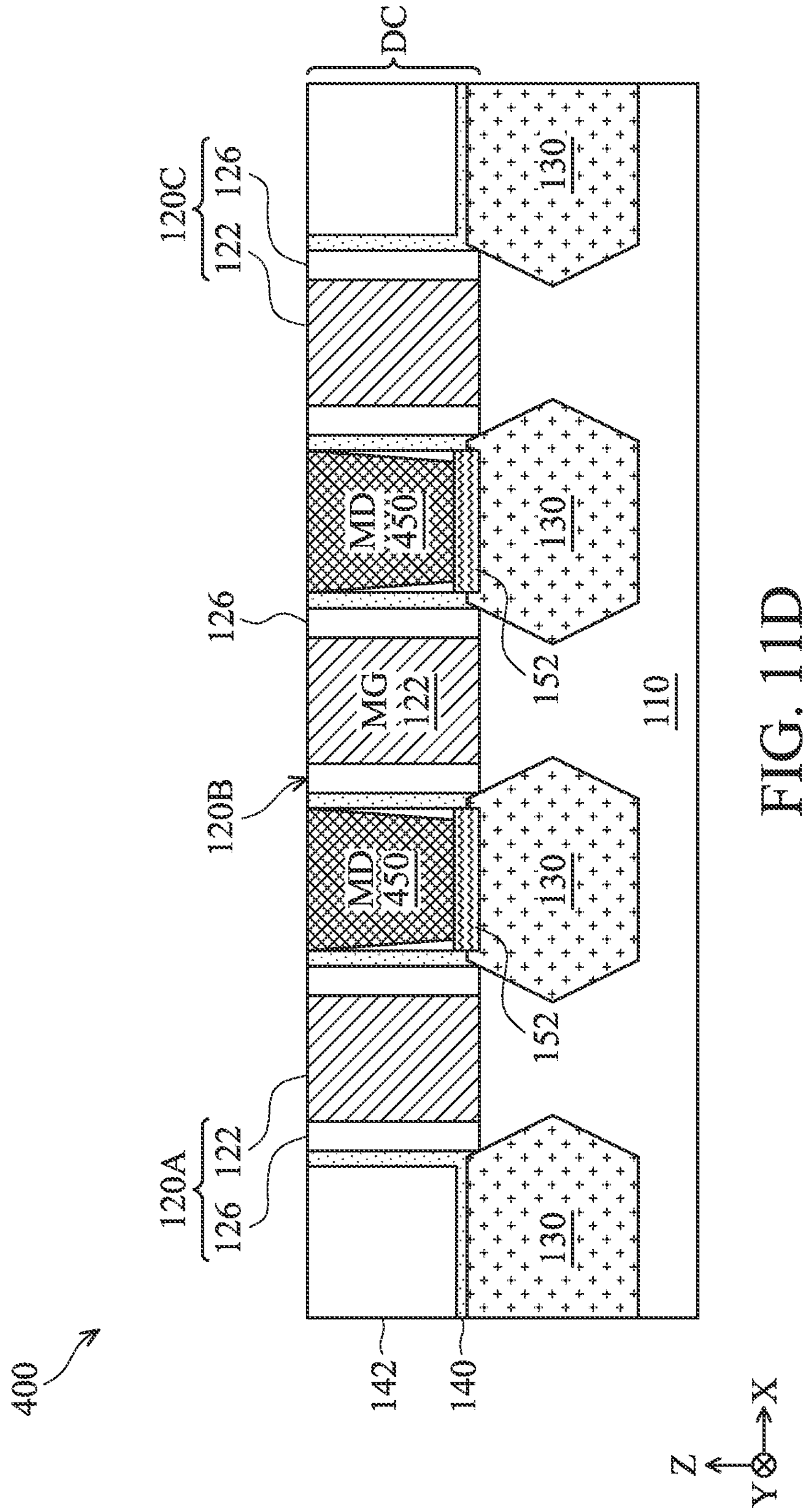

In FIG. 11A, device 400 undergoes FEOL processing, such as described above with reference to FIG. 2A. In FIG. 11B, MOL processing includes forming source/drain contact openings 310 in a dielectric layer (e.g., ILD layer 142 and/or CESL 140) and forming silicide layers 152, such as described above with reference to FIG. 8B. In FIG. 11C and FIG. 11D, source/drain contacts 450 include molybdenum, alloys thereof, or a combination thereof. For example, source/drain contacts 450 are barrier-free molybdenum-containing plugs having a thickness that is about equal to height H3. In some embodiments, the barrier-free molybdenum-containing plugs have a molybdenum concentration that is greater than or equal to about 98 atomic percent (at %), such as about 98 at % to about 99.5 at %. Source/drain contacts 450 physically, directly contact surrounding dielectric materials, such as ILD layer 142, CESL 140, gate spacers 126, other dielectric features, or a combination thereof. In some embodiments, source/drain contacts 450 physically, directly contact underlying electrically conductive feature, such as a respective epitaxial source/drain 130 and/or a respective silicide layer 152. In some embodiments, a bottom metal liner(s) is between the molybdenum-containing plug of source/drain contacts 450 and underlying electrically conductive feature. Source/drain contacts 450 may also include other electrically conductive material, such as tungsten, ruthenium, cobalt, copper, aluminum, titanium, tantalum, iridium, palladium, platinum, nickel, tin, gold, silver, other suitable metal, alloys thereof, or a combination thereof.

In some embodiments, forming source/drain contacts 450 includes performing a bottom-up deposition process (e.g., selective CVD or selective ALD) to form a via molybdenum bulk material 430' that fills source/drain contact openings 310 from bottom to top (FIG. 11C), such as described herein, and performing a planarization process (FIG. 11D), such as described herein, which may remove portions of via molybdenum bulk material 430' disposed over a top surface of ILD layer 142. The bottom-up deposition process is performed until via molybdenum bulk material 430' fills source/drain contact openings 310 and extends from silicide layers 152 (or epitaxial source/drains 130) to at least the top surface of ILD layer 142. In the depicted embodiment, via bulk molybdenum material 430' extends beyond the top surface of ILD layer 142, such that via bulk molybdenum material 430' protrudes from ILD layer 142. In the depicted embodiment, source/drain contacts 450 do not protrude from the top surface of ILD layer 142 after planarization, and the top surface of ILD layer 142 and the top surfaces of source/drain contacts 450 may form a substantially planar surface.

Figure 11E:
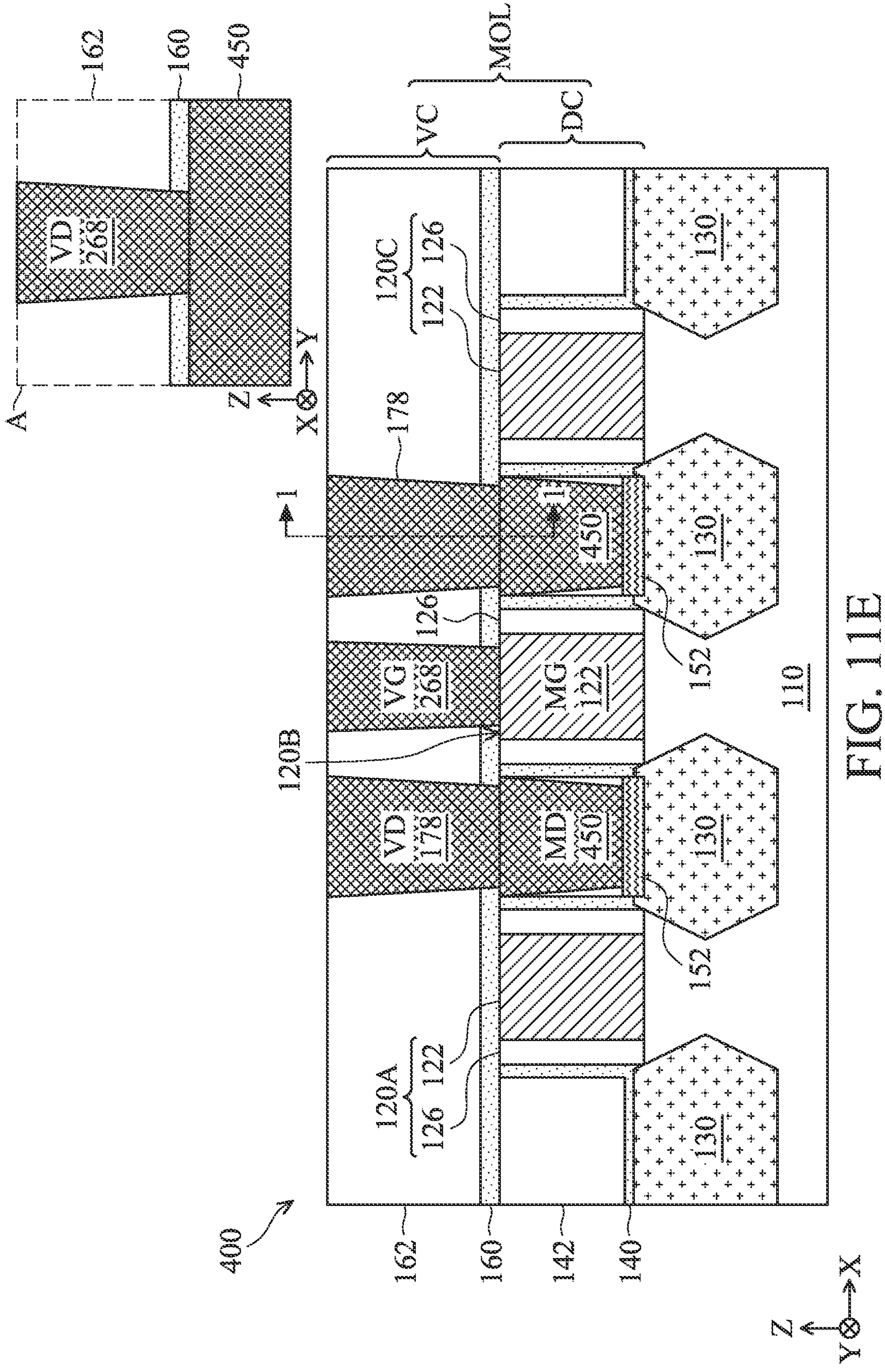
Figure 12:
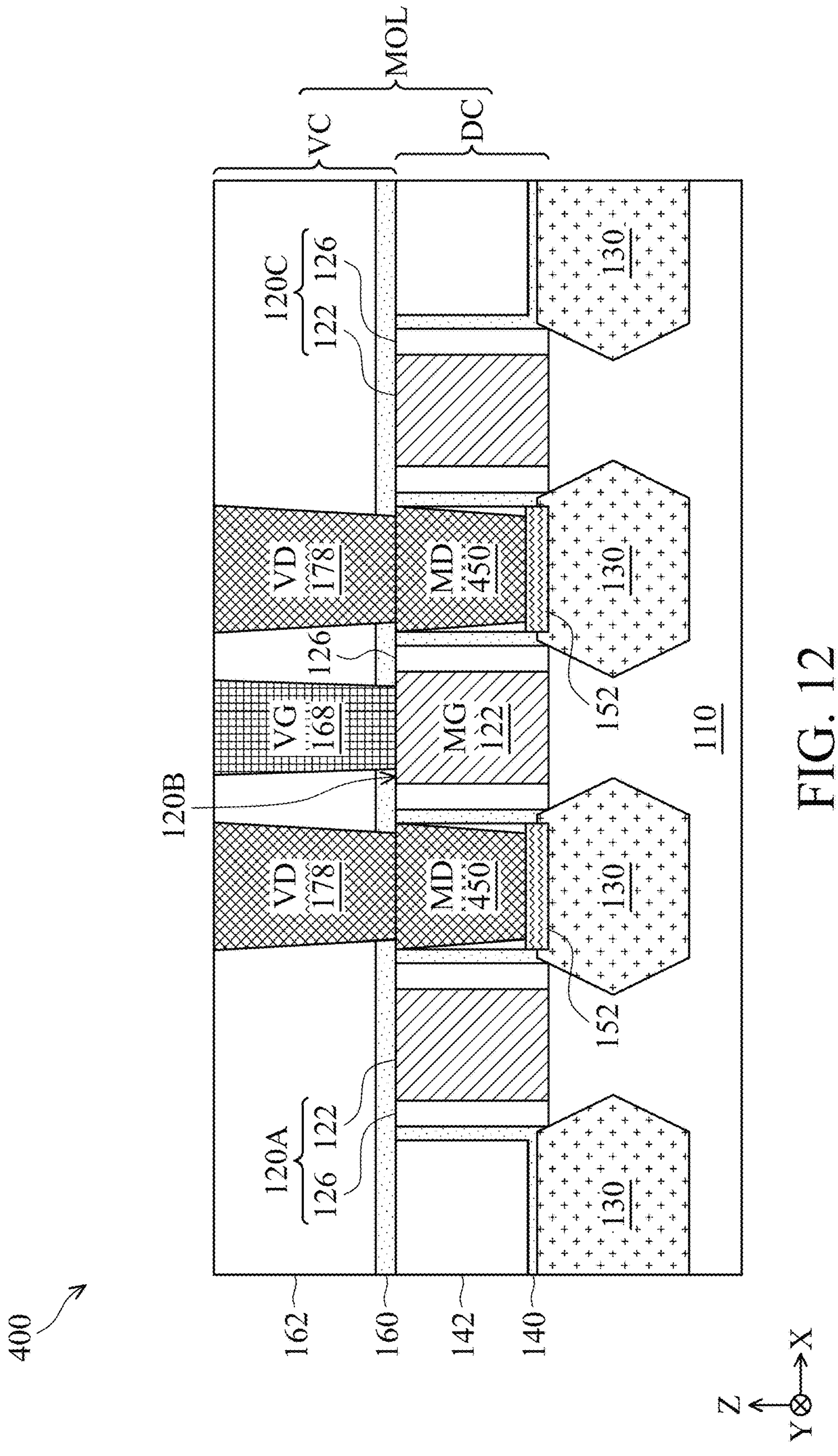
FIG. 12 is a cross-sectional view of an MOL interconnect structure, in portion or entirety, that may be fabricated by the methods in FIG. 1A, FIG. 1B, FIGS. 11A-11E, or a combination thereof according to various aspects of the present disclosure.

In FIG. 11E, MOL processing may form barrier-free, seam-free molybdenum-containing source/drain vias 178 and barrier-free, seam-free molybdenum-containing gate vias 268, such as described herein. Device 400 thus includes an MOL interconnect structure having a molybdenum VC layer (i.e., barrier-free molybdenum-containing source/drain vias 178 and barrier-free molybdenum-containing gate vias 268) and a molybdenum DC layer (i.e., barrier-free molybdenum-containing source/drain contacts 450). Source/drain vias 178, gate vias 268, and source/drain contacts 450 may be seamless. In the depicted embodiment, barrier-free molybdenum-containing source/drain vias 178 do not extend below top surface of ILD layer 142 and/or top surfaces of gate stacks 122. In some embodiments, the MOL interconnect structure of device 400 may have a molybdenum and tungsten VC layer, such as depicted in FIG. 12, where VC layer includes barrier-free molybdenum-containing source/drain vias 178 and barrier-free tungsten-containing gate vias 168. In some embodiments, barrier-free tungsten-containing gate vias 168 may have seams therein, such as described above. After forming the MOL structure of device 400, BEOL processing may form metallization layers of a multilayer interconnect MLI, such as MO level and so on, of device 200 over VC layer, such as described above with reference to FIG. 2L and FIG. 2M, and source/drain vias 178 and gate via 268 may each be connected to a respective electrically conductive line of M0 level.

Figure 13:
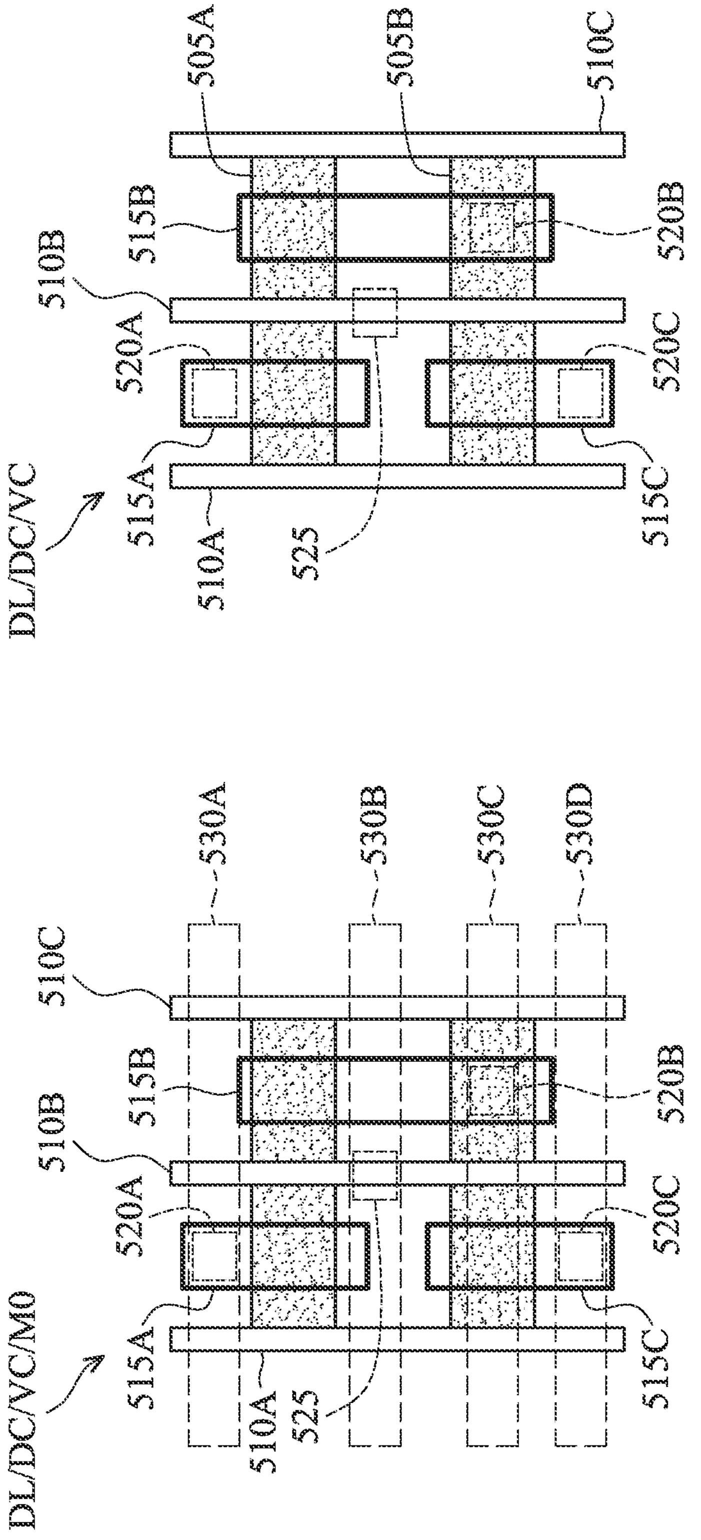
FIG. 13 is a top view of various layers of a device, in portion or entirety, including the MOL interconnect structures fabricated by the method in FIG. 1A and the method in FIG. 1B according to various aspects of the present disclosure.

FIG. 13 is a top view of various layers of a device, in portion or entirety, that may include the MOL interconnect structures fabricated by the method in FIG. 1A and the method in FIG. 1B according to various aspects of the present disclosure. In FIG. 13, the device has a DL layer, a DC layer disposed over the DL layer, a VC layer disposed over the DC layer, and an MO layer disposed over the VC layer. FIG. 13 has been simplified for the sake of clarity to better understand the inventive concepts of the present disclosure. Additional features can be added in the various layers of the device, and some of the features described below can be replaced, modified, or eliminated in other embodiments of the various layers of the device.

The DL layer includes an active region 505A, an active region 505B, and gate lines 510A-510C. Active region 505A and active region 505B are oriented substantially parallel to one another and extend lengthwise along a first direction, and gate lines 510A-510C are oriented substantially parallel to one another and extend lengthwise along a second direction that is different than the first direction. Active region 505A and active region 505B (also referred to as OD regions) each include a channel region (e.g., a semiconductor layer, which may be a semiconductor substrate, a semiconductor fin, or suspended semiconductor layers) disposed between source/drain regions (e.g., epitaxial source/drains 130). Gate lines 510A-510C (also referred to as gate structures) may each include a gate stack (e.g., gate stack 122) and gate spacers (e.g., gate spacers 126). In the depicted embodiment, gate line 510B is disposed over respective channel regions of active region 505A and active region 505B and is further disposed between respective source/drain regions of active region 505A and active region 505B (i.e., epitaxial source/drains 130). Gate line 510B may wrap and/or surround semiconductor layers of active region 505A and active region 505B forming their respective channel regions, and the semiconductor layers extend along the first direction between the source/drain regions (e.g., epitaxial source/drains 130). Gate line 510B may engage the semiconductor layers, such that current can flow between respective source/drain regions during operation. In some embodiments, a first transistor is formed from gate line 510B and active region 505A, and a second transistor is formed from gate line 510B and active region 505B. Isolation features may isolate active region 505A and active region 505B from one another.

The DC layer includes source/drain contacts 515A-515C, the VC layer includes source/drain vias 520A-520C and a gate via 525, and M0 level includes electrically conductive lines 530A-530C. Source/drain contacts 515A-515C may extend lengthwise along the second direction, and source/drain contacts 515A-515C are configured as source/drain contacts 150, source/drain contacts 350, or source/drain contacts 450. Source/drain contact 515A is connected to a respective source/drain region of active region 505A, source/drain contact 515B is connected to a respective source/drain region of active region 505A and a respective source/drain region of active region 505B, and source/drain contact 515A is connected to a respective source/drain region of active region 505B. Source/drain vias 520A-520C are configured as source/drain vias 178, and gate via 525 is configured as gate via 168 or gate via 268. Source/drain vias 520A-520C are connected to source/drain contacts 515A-515C, respectively, and gate via 525 is connected to gate line 510B. In some embodiments, source/drain via 520A-520C are formed by different lithography and etch processes and a same deposition process. For example, a first, second, and third lithography and etch may form a first, second, and third source/drain via opening for source/drain vias 520A-520C, respectively, and a bottom-up deposition process may form source/drain vias 520A-520C in the first, second, and third source/drain via openings. Electrically conductive lines 530A-530D may extend lengthwise along the first direction and are configured as electrically conductive lines 184. Electrically conductive line 530A is connected to source/drain via 520A, electrically conductive line 530B is connected to gate via 525, electrically conductive line 530C is connected to source/drain via 520B, and electrically conductive line 530C is connected to source/drain via 520C.

Figure 14:
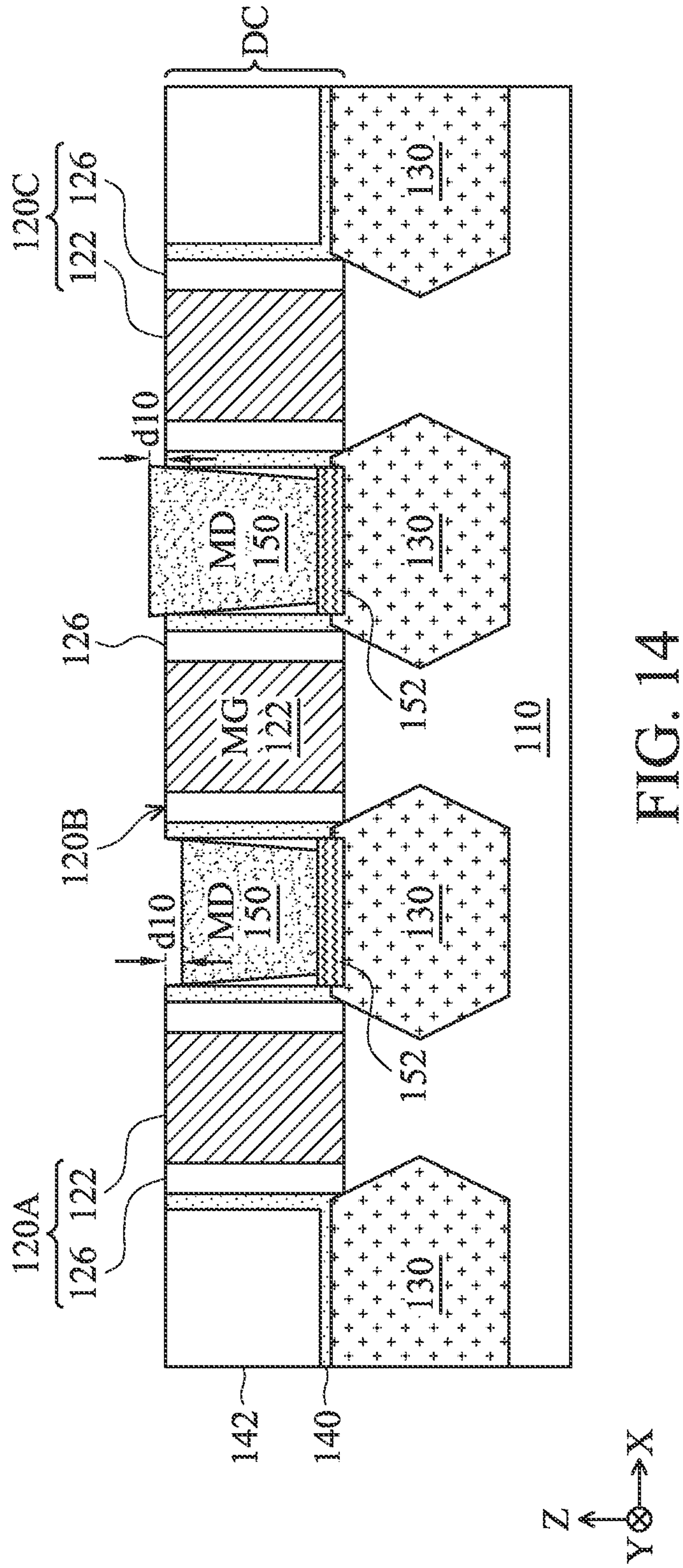
FIG. 14 is a cross-sectional view of a device contact layer of an MOL interconnect structure, in portion or entirety, fabricated by the method in FIG. 1A according to various aspects of the present disclosure.

FIG. 14 is a cross-sectional view of a DC layer of an MOL interconnect structure, in portion or entirety, fabricated by method 10 in FIG. 1A according to various aspects of the present disclosure. DC layer includes source/drain contacts 150, such as tungsten plugs. As described above, source/drain vias (e.g., molybdenum-containing source/drain vias 178) and gate vias (e.g., molybdenum-containing gate vias 268) are grown from/deposited on source/drain contacts 150 and gate stacks 122, respectively. Since growth/deposition rates of the source/drain vias and the gate vias may be different as a result of being grown from/deposited on different material surfaces, source/drain via openings may be completely filled without complete filling of gate via openings, or vice versa, and/or source/drain via openings may overfill when gate via openings are completely filled, or vice versa, such as when source/drain via bulk material and gate via bulk material are formed at the same time. To minimize growth/deposition variations and height variations of source/drain vias and gate vias, including variations in distances thereof above ILD layer 162, an offset (e.g., a distance d10) between a top of source/drain contacts 150 and a top of gate stacks 122 is less than about 5 nm. In other words, any offset of the top of source/drain contacts 150 from a top of gate stacks 122 is ±5 nm. FIG. 14 has been simplified for the sake of clarity to better understand the inventive concepts of the present disclosure. Additional features can be added in DC layer, and some of the features described below can be replaced, modified, or eliminated in other embodiments of DC layer.

The present disclosure provides for many different embodiments. MOL interconnects that facilitate reduced resistance and corresponding techniques for forming the MOL interconnects are disclosed herein. The MOL interconnect structures disclosed herein may be implemented in a variety of device types. For example, the MOL interconnect structures described herein are suitable for planar FETs, multigate transistors, such as FinFETs, GAA transistors (having, for example, suspended semiconductor channel regions, such as nanowires, nanosheets, etc.), fork-sheet transistors, vertical transistors, omega-gate (Ω-gate) devices, pi-gate (Π-gate) devices, or a combination thereof, as well as strained-semiconductor devices, silicon-on-insulator (SOI) devices, partially-depleted SOI devices, fully-depleted SOI devices, other devices, or a combination thereof. The MOL interconnect structures described herein are further suitable for stacked transistor structures, such as complementary FETs (CFETs).

An exemplary MOL interconnect structure includes a barrier-free source/drain contact, a barrier-free source/drain via, and a barrier-free gate via disposed in an insulator layer.

The barrier-free source/drain contact is disposed on an epitaxial source/drain, and the barrier-free source/drain contact includes tungsten, molybdenum, or a combination thereof. The barrier-free source/drain via is disposed on the barrier-free source/drain contact, and the barrier-free source/drain via includes molybdenum. The barrier-free gate via is disposed on a gate stack disposed adjacent to the epitaxial source/drain, and the barrier-free gate via includes tungsten, molybdenum, or a combination thereof.

In some embodiments, the barrier-free source/drain contact is a first tungsten plug, the barrier-free source/drain via is a molybdenum plug, and the barrier-free gate via is a second tungsten plug. In some embodiments, the barrier-free source/drain contact is a first molybdenum plug, the barrier-free source/drain via is a second molybdenum plug, and the barrier-free gate via is a tungsten plug. In some embodiments, the barrier-free source/drain contact is a tungsten plug, the barrier-free source/drain via is a first molybdenum plug, and the barrier-free gate via is a second molybdenum plug. In some embodiments, the barrier-free source/drain contact is a first molybdenum plug, the barrier-free source/drain via is a second molybdenum plug, and the barrier-free gate via is a third molybdenum plug. In some embodiments, the barrier-free source/drain contact includes a first molybdenum plug disposed over a first tungsten plug, the barrier-free source/drain via is a second molybdenum plug, and the barrier-free gate via is a second tungsten plug. In some embodiments, the barrier-free source/drain contact includes a first molybdenum plug disposed over a tungsten plug, the barrier-free source/drain via is a second molybdenum plug, and the barrier-free gate via is a third molybdenum plug.

In some embodiments, a width of the barrier-free source/drain via is less than about 16 nm. In some embodiments, the barrier-free source/drain via has a top width and a bottom width, and a difference between the top width and the bottom width is less than about 2 nm. In some embodiments, a distance between a top surface of the barrier-free source/drain via and a top surface of the gate stack is less than about 5 nm.

An exemplary method includes forming a barrier-free source/drain contact, a barrier-free source/drain via, and a barrier-free gate via in an insulator layer. The barrier-free source/drain contact is disposed on an epitaxial source/drain, and the barrier-free source/drain contact includes tungsten, molybdenum, or a combination thereof. The barrier-free source/drain via is disposed on the barrier-free source/drain contact, and the barrier-free source/drain via includes molybdenum. The barrier-free gate via is disposed on a gate stack disposed adjacent to the epitaxial source/drain, and the barrier-free gate via includes tungsten, molybdenum, or a combination thereof. Forming the barrier-free source/drain via includes forming a source/drain via opening in the insulator layer that exposes the barrier-free source/drain contact and performing a bottom-up deposition process to form a molybdenum plug that fills the source/drain via opening. In some embodiments, forming the barrier-free source/drain contact includes performing a planarization process, and a distance between a top surface of the barrier-free source/drain contact and a top surface of the gate stack is less than about 5 nm.

In some embodiments, the molybdenum plug is a first molybdenum plug, and forming the barrier-free gate via includes forming a gate via opening in the insulator layer that exposes the gate stack and performing the bottom-up deposition process to form a second molybdenum plug in the gate via opening and the first molybdenum plug in the source/drain via opening. In some embodiments, the bottom-up deposition process is a first bottom-up deposition process and forming the barrier-free gate via includes forming a gate via opening in the insulator layer that exposes the gate stack and performing a second bottom-up deposition process to form a via plug that fills the gate via opening. In some embodiments, the via plug is a tungsten plug. In some embodiment, the via plug is a molybdenum plug.

In some embodiments, performing the bottom-up deposition process to form the molybdenum plug includes forming a molybdenum nucleation layer and forming a molybdenum bulk material over the molybdenum nucleation layer. In some embodiments, the bottom-up deposition process implements first deposition parameters when forming the molybdenum nucleation layer and second deposition parameters when forming the molybdenum bulk material. The second deposition parameters may be different than the first deposition parameters.

In some embodiments, forming the barrier-free source/drain contact includes forming a source/drain contact opening in the insulator layer that exposes the epitaxial source/drain, performing a first deposition process to form a tungsten layer that partially fills the source/drain contact opening, and performing a second deposition process to form a molybdenum layer that fills a remainder of the source/drain contact opening.

Another exemplary interconnect structure includes a first interlayer dielectric (ILD) layer and a second ILD layer disposed over the first ILD layer. A source/drain contact plug is disposed in the first ILD layer, and a molybdenum source/drain via plug is disposed in the second ILD layer, and a molybdenum gate via plug is disposed in the second ILD layer. Sidewalls of the source/drain contact plug physically contact the first ILD layer, the source/drain contact plug is disposed on an epitaxial source/drain, and the source/drain contact plug includes tungsten, molybdenum, or a combination thereof. Sidewalls of the molybdenum source/drain via plug physically contact the second ILD layer, and the molybdenum source/drain via plug is disposed on the source/drain contact plug. Sidewalls of the molybdenum gate via physically contact the second ILD layer, and the molybdenum gate via plug is disposed on a gate stack disposed adjacent to the epitaxial source/drain. The source/drain contact plug includes a molybdenum plug, a tungsten plug, or a molybdenum plug disposed over a tungsten plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:

an insulator layer;

a barrier-free source/drain contact disposed in the insulator layer, wherein the barrier-free source/drain contact is disposed on an epitaxial source/drain and the barrier-free source/drain contact includes tungsten, molybdenum, or a combination thereof;

a barrier-free source/drain via disposed in the insulator layer, wherein the barrier-free source/drain via is disposed on the barrier-free source/drain contact and the barrier-free source/drain via includes molybdenum;

a barrier-free gate via disposed in the insulator layer, wherein the barrier-free gate via is disposed on a gate stack disposed adjacent to the epitaxial source/drain and the barrier-free gate via includes tungsten, molybdenum, or a combination thereof; and wherein a top surface of the barrier-free source/drain contact is offset a distance from a top surface of the gate stack, wherein the distance between the top surface of the barrier-free source/drain contact and the top surface of the gate stack is less than about 5 nm.

2. The interconnect structure of claim 1, wherein the barrier-free source/drain contact is a first tungsten plug, the barrier-free source/drain via is a molybdenum plug, and the barrier-free gate via is a second tungsten plug.

3. The interconnect structure of claim 1, wherein the barrier-free source/drain contact is a first molybdenum plug, the barrier-free source/drain via is a second molybdenum plug, and the barrier-free gate via is a tungsten plug.

4. The interconnect structure of claim 1, wherein the barrier-free source/drain contact is a tungsten plug, the barrier-free source/drain via is a first molybdenum plug, and the barrier-free gate via is a second molybdenum plug.

5. The interconnect structure of claim 1, wherein the barrier-free source/drain contact is a first molybdenum plug, the barrier-free source/drain via is a second molybdenum plug, and the barrier-free gate via is a third molybdenum plug.

6. The interconnect structure of claim 1, wherein the barrier-free source/drain contact includes a first molybdenum plug disposed over a first tungsten plug, the barrier-free source/drain via is a second molybdenum plug, and the barrier-free gate via is a second tungsten plug.

7. The interconnect structure of claim 1, wherein the barrier-free source/drain contact includes a first molybdenum plug disposed over a tungsten plug, the barrier-free source/drain via is a second molybdenum plug, and the barrier-free gate via is a third molybdenum plug.

8. The interconnect structure of claim 1, wherein a width of the barrier-free source/drain via is less than about 16 nm.

9. The interconnect structure of claim 1, wherein the barrier-free source/drain via has a top width and a bottom width, wherein a difference between the top width and the bottom width is less than about 2 nm.

10. The interconnect structure of claim 1, wherein the insulator layer abuts a portion of the top surface of the gate stack.

11. An interconnect structure comprising:

a first interlayer dielectric (ILD) layer;

a second ILD layer disposed over the first ILD layer;

a source/drain contact plug disposed in the first ILD layer, wherein sidewalls of the source/drain contact plug abut the first ILD layer, the source/drain contact plug is disposed on an epitaxial source/drain, and the source/drain contact plug includes tungsten, molybdenum, or a combination thereof;

a molybdenum source/drain via plug disposed in the second ILD layer, wherein tapered sidewalls of the molybdenum source/drain via plug abut the second ILD layer the molybdenum source/drain via plug is disposed on the source/drain contact plug, and a difference between a top width of the molybdenum source/drain via plug and a bottom width of the molybdenum source/drain via plug is less than about 2 nm; and a molybdenum gate via plug disposed in the second ILD layer, wherein the sidewalls of the molybdenum gate via abut the second ILD layer and the molybdenum gate via plug is disposed on a gate stack disposed adjacent to the epitaxial source/drain.

12. The interconnect structure of claim 11, wherein the source/drain contact plug includes a molybdenum plug.

13. The interconnect structure of claim 11, wherein the source/drain contact plug includes a tungsten plug.

14. The interconnect structure of claim 11, wherein a bottom of the molybdenum source/drain via plug is lower than a bottom of the second ILD layer.

15. The interconnect structure of claim 11, further comprising an etch stop layer disposed between the first ILD layer and the second ILD layer, wherein both the molybdenum source/drain via plug and molybdenum gate via plug abut the etch stop layer.

16. A device comprising:

a first level of a multilayer interconnect (MLI) that includes a tungsten interconnect, wherein the tungsten interconnect has sidewalls interfacing a dielectric structure; and a second level of the MLI that includes a first molybdenum interconnect and a second molybdenum interconnect, wherein the second level of the MLI is over the first level of the MLI, the first molybdenum interconnect has sidewalls interfacing the dielectric structure and a bottom interfacing the tungsten interconnect, the second molybdenum interconnect has sidewalls interfacing the dielectric structure, and the first molybdenum interconnect extends below the second level of the MLI into the first level of the MLI, wherein the first molybdenum interconnect has a first height, the second molybdenum interconnect has a second height, and the first height is greater than the second height.

17. The device of claim 16, wherein a bottom of the second molybdenum interconnect interfaces a gate electrode.

18. The device of claim 16, wherein a curved interface is between the bottom of the first molybdenum interconnect and the tungsten interconnect.

19. The device of claim 16, wherein a difference between a top width of the first molybdenum interconnect and a bottom width of the first molybdenum interconnect is less than about 2 nm.

20. The device of claim 16, wherein the second molybdenum interconnect does not extend below the second level of the MLI into the first level of the MLI.

* * * * *